United States Patent
Yoneda et al.

(10) Patent No.: US 11,943,554 B2
(45) Date of Patent: Mar. 26, 2024

(54) IMAGING DEVICE OPERATED BY SWITCHING BETWEEN PRODUCT-SUM OPERATION

(71) Applicant: SEMICONDUCTOR ENERGY LABORATORY CO., LTD., Atsugi (JP)

(72) Inventors: Seiichi Yoneda, Kanagawa (JP); Yusuke Negoro, Osaka (JP); Hidetomo Kobayashi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 21 days.

(21) Appl. No.: 17/605,817

(22) PCT Filed: Apr. 14, 2020

(86) PCT No.: PCT/IB2020/053483
§ 371 (c)(1),
(2) Date: Oct. 22, 2021

(87) PCT Pub. No.: WO2020/222059
PCT Pub. Date: Nov. 5, 2020

(65) Prior Publication Data
US 2022/0201234 A1    Jun. 23, 2022

(30) Foreign Application Priority Data

Apr. 29, 2019  (JP) .................................. 2019-087002
May 9, 2019   (JP) .................................. 2019-088854
(Continued)

(51) Int. Cl.
H04N 25/77    (2023.01)
H01L 27/146   (2006.01)
(Continued)

(52) U.S. Cl.
CPC ....... *H04N 25/77* (2023.01); *H01L 27/14616* (2013.01); *H04N 25/46* (2023.01); *H04N 25/79* (2023.01); *H01L 29/7869* (2013.01)

(58) Field of Classification Search
CPC ........ H04N 25/77; H04N 25/79; H04N 25/46; H04N 25/75; H01L 27/14616; H01L 29/7869
See application file for complete search history.

(56) References Cited

U.S. PATENT DOCUMENTS 8,378,391 B2    2/2013   Koyama et al.
8,916,869 B2   12/2014   Koyama et al.
(Continued)

FOREIGN PATENT DOCUMENTS

CN    110651468 A    1/2020
JP    2011-119711 A  6/2011
(Continued)

OTHER PUBLICATIONS

International Search Report (Application No. PCT/IB2020/053483), dated Jul. 21, 2020.
(Continued)

*Primary Examiner* — Marly S Camargo
(74) *Attorney, Agent, or Firm* — Fish & Richardson P.C.

(57) ABSTRACT

An imaging device capable of executing image processing is provided. Analog data (image data) acquired through an imaging operation is retained in a pixel, and data obtained by multiplying the analog data by a given weight coefficient in the pixel can be extracted. The data is taken into a neural network or the like, whereby processing such as image recognition can be performed. Since an enormous amount of image data can be retained in pixels in an analog data state, processing can be performed efficiently.

11 Claims, 41 Drawing Sheets

(30) Foreign Application Priority Data

| May 31, 2019 | (JP) | ................................. | 2019-102209 |
| Jun. 7, 2019 | (JP) | ................................. | 2019-107367 |
| Jul. 26, 2019 | (JP) | ................................. | 2019-137469 |
| Sep. 2, 2019 | (JP) | ................................. | 2019-159378 |

(51) Int. Cl.
*H01L 29/786* (2006.01)
*H04N 25/46* (2023.01)
*H04N 25/79* (2023.01)

(56) References Cited

U.S. PATENT DOCUMENTS

| 9,331,112 | B2 | 5/2016 | Koyama et al. | |
| 9,773,814 | B2 | 9/2017 | Koyama et al. | |
| 9,773,832 | B2 | 9/2017 | Kurokawa | |
| 10,074,687 | B2 | 9/2018 | Kurokawa | |
| 10,600,839 | B2 | 3/2020 | Kurokawa | |
| 10,964,743 | B2 | 3/2021 | Kurokawa | |
| 11,101,302 | B2 | 8/2021 | Ikeda et al. | |
| 2015/0319388 | A1* | 11/2015 | Ohshitanai | ............. H04N 25/63 348/301 |
| 2016/0172410 | A1 | 6/2016 | Kurokawa | |
| 2017/0155856 | A1* | 6/2017 | Ohshitanai | ............. H04N 25/60 |
| 2020/0176493 | A1* | 6/2020 | Ikeda | ................ H01L 27/14605 |
| 2021/0151486 | A1 | 5/2021 | Kobayashi et al. | |
| 2021/0233952 | A1 | 7/2021 | Kurokawa | |
| 2022/0264046 | A1* | 8/2022 | Inoue | ................ H01L 27/14621 |
| 2022/0321794 | A1* | 10/2022 | Yoneda | ................. H01L 27/146 |
| 2022/0359592 | A1* | 11/2022 | Yoneda | ................. H04N 25/70 |

FOREIGN PATENT DOCUMENTS

| JP | 2016-123087 A | 7/2016 |
| WO | WO-2018/215882 | 11/2018 |
| WO | WO-2019/012370 | 1/2019 |

OTHER PUBLICATIONS

Written Opinion (Application No. PCT/IB2020/053483), dated Jul. 21, 2020.

Dong.C et al., "Image Super-Resolution Using Deep Convolutional Networks", arXiv:1501.00092v3, Jul. 31, 2015, pp. 1-14, Cornell University.

* cited by examiner $a = x_1 w_1 + x_2 w_2 + b$

FIG. 26A1
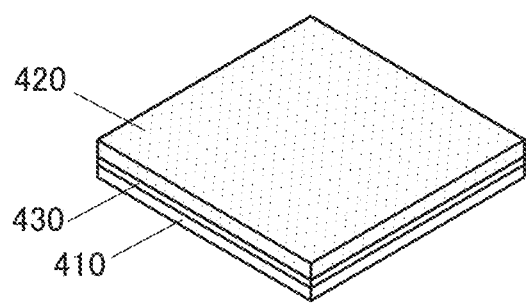
FIG. 26B1
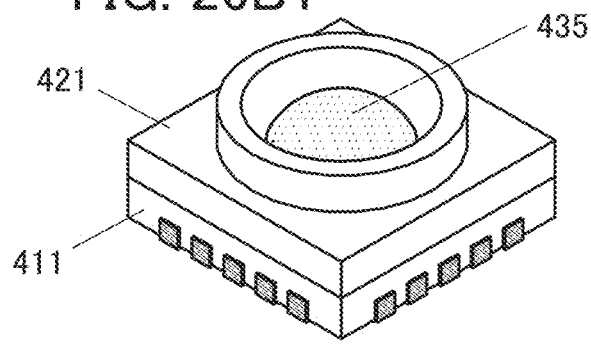
FIG. 26A2
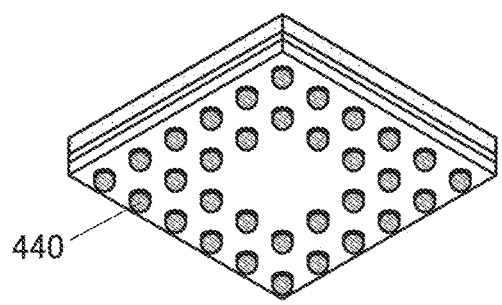
FIG. 26B2
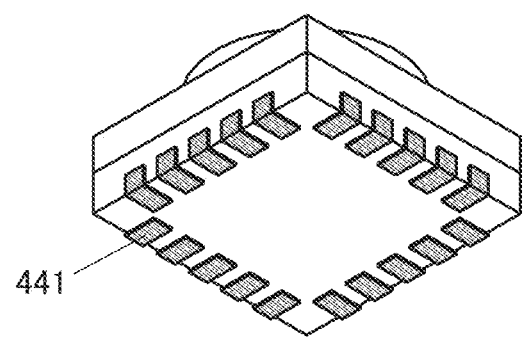
FIG. 26A3
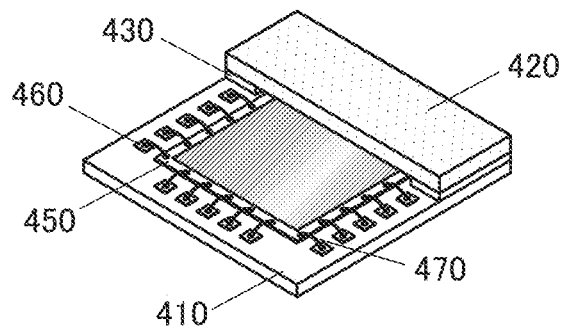
FIG. 26B3
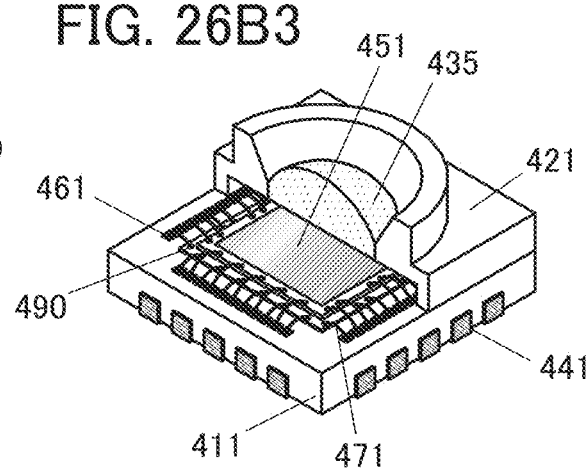

Horizontal stripe filter

Vertical stripe filter

US 11,943,554 B2

IMAGING DEVICE OPERATED BY SWITCHING BETWEEN PRODUCT-SUM OPERATION

CROSS REFERENCE TO RELATED APPLICATIONS

This application is a U.S. National Phase Application under 35 U.S.C. § 371 of International Application PCT/IB2020/053483, filed on Apr. 14, 2020, which is incorporated by reference and claims the benefit of foreign priority applications filed in Japan on Apr. 29, 2019, as Application No. 2019-087002, on May 9, 2019, as Application No. 2019-088854, on May 31, 2019, as Application No. 2019-102209, on Jun. 7, 2019, as Application No. 2019-107367, on Jul. 26, 2019, as Application No. 2019-137469, and on Sep. 2, 2019, as Application No. 2019-159378.

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Accordingly, more specific examples of the technical field of one embodiment of the present invention disclosed in this specification include a semiconductor device, a display device, a liquid crystal display device, a light-emitting device, a lighting device, a power storage device, a memory device, an imaging device, an operation method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique for forming a transistor by using an oxide semiconductor thin film formed over a substrate has attracted attention. For example, an imaging device with a structure in which a transistor including an oxide semiconductor and having an extremely low off-state current is used in a pixel circuit is disclosed in Patent Document 1.

A technique which adds an arithmetic function to an imaging device is disclosed in Patent Document 2.

REFERENCE

Patent Document

[Patent Document 1] Japanese Published Patent Application No. 2011-119711
[Patent Document 2] Japanese Published Patent Application No. 2016-123087

SUMMARY OF THE INVENTION

Problems to be Solved by the Invention

With the technological development, a high-quality image can be easily captured by an imaging device provided with a solid-state imaging element such as a CMOS image sensor. In the next generation, an imaging device is required to be equipped with more intelligent functions.

In the present image data compression, image recognition, or the like, image data (analog data) is converted into digital data with an imaging device, taken out of the imaging device, and then subjected to processing. If the processing can be carried out in the imaging device, higher-speed communication with an external device is achieved, improving user's convenience. Furthermore, load and power consumption of a peripheral device or the like can be reduced. Moreover, if complicated data processing is performed in an analog data state, time required for data conversion can be shortened.

Thus, an object of one embodiment of the present invention is to provide an imaging device capable of image processing. Another object is to provide an imaging apparatus with low power consumption. Another object is to provide an imaging device with high reliability. Another object is to provide a novel imaging device or the like. Another object is to provide a method for operating the above imaging device. Another object is to provide a novel semiconductor device or the like.

Note that the description of these objects does not preclude the existence of other objects. One embodiment of the present invention does not have to achieve all these objects. Other objects are apparent from the description of the specification, the drawings, the claims, and the like, and other objects can be derived from the description of the specification, the drawings, the claims, and the like.

Means for Solving the Problems

One embodiment of the present invention relates to an imaging device which can retain data in a pixel and perform arithmetic processing on the data.

One embodiment of the present invention is an imaging device including a pixel block, a first circuit, and a second circuit. The pixel block includes a plurality of pixels arranged in a matrix. The plurality of pixels are electrically connected to the second circuit. The first circuit has a function of selecting the plurality of pixels arranged in one row. The first circuit has a function of selecting the plurality of pixels arranged in a plurality of consecutive rows. The pixel has a function of generating first data. The pixel has a function of generating second data by adding a predetermined potential to the first data. The second circuit has a function of generating third data corresponding to the sum of the first data generated by the plurality of pixels. The second circuit generates fourth data by adding, to the third data, a potential corresponding to the sum of the second data generated by the plurality of pixels.

The pixel can include a photoelectric conversion device, a first transistor, a second transistor, a third transistor, a fourth transistor, a fifth transistor, and a first capacitor. One electrode of the photoelectric conversion device can be electrically connected to one of a source and a drain of the first transistor. The other of the source and the drain of the first transistor can be electrically connected to one of a source and a drain of the second transistor. The one of the source and the drain of the second transistor can be electrically connected to a gate of the third transistor. The gate of the third transistor can be electrically connected to one electrode of the first capacitor. The other electrode of the first capacitor can be electrically connected to one of a source and a drain of the fourth transistor. One of a source and a drain of the third transistor can be electrically connected to one of a source and a drain of the fifth transistor. The other of the source and the drain of the fifth transistor can be electrically connected to the second circuit. A gate of the fifth transistor can be electrically connected to the first circuit.

The second circuit can include a sixth transistor, a seventh transistor, an eighth transistor, a ninth transistor, a second capacitor, and a resistor. One electrode of the second capacitor can be electrically connected to the plurality of pixels. The one electrode of the second capacitor can be electrically connected to the resistor. The other electrode of the second capacitor can be electrically connected to one of a source and a drain of the sixth transistor. The one of the source and the drain of the sixth transistor can be electrically connected to a gate of the seventh transistor. One of a source and a drain of the seventh transistor can be electrically connected to one of a source and a drain of the eighth transistor. The one of the source and the drain of the eighth transistor can be electrically connected to one of a source and a drain of the ninth transistor.

The imaging device may further include a third circuit. The pixel may further include a tenth transistor and an eleventh transistor. The third circuit may have a structure and a function equivalent to those of the second circuit. A gate of the tenth transistor may be electrically connected to the gate of the third transistor. One of a source and a drain of the tenth transistor may be electrically connected to one of a source and a drain of the eleventh transistor. The other of the source and the drain of the eleventh transistor may be electrically connected to the third circuit. A gate of the eleventh transistor may be electrically connected to the first circuit.

The first circuit can be a shift register circuit including a first logic circuit, a second logic circuit, a twelfth transistor, a thirteenth transistor, a fourteenth transistor, and a fifteenth transistor. An output terminal of the first logic circuit can be electrically connected to one of a source and a drain of the twelfth transistor. An output terminal of the second logic circuit can be electrically connected to one of a source and a drain of the thirteenth transistor. The other of the source and the drain of the twelfth transistor can be electrically connected to one of a source and a drain of the fourteenth transistor. The other of the source and the drain of the fourteenth transistor can be electrically connected to the other of the source and the drain of the thirteenth transistor. The other of the source and the drain of the twelfth transistor can be electrically connected to one of a source and a drain of the fifteenth transistor. The other of the source and the drain of the fifteenth transistor can be electrically connected to a power supply line.

The transistors included in the pixel block and the first circuit can each include a metal oxide in a channel formation region, and the metal oxide can contain In, Zn, and M (M is one or more of Al, Ti, Ga, Ge, Sn, Y, Zr, La, Ce, Nd, and Hf).

Alternatively, the transistors included in the pixel block, the first circuit, and the second circuit may each include silicon in a channel formation region.

The photoelectric conversion device can be provided in a first layer. The transistors included in the pixel block and the first circuit can be provided in a second layer. The transistors included in the second circuit can be provided in a third layer. The second layer can be provided between the first layer and the third layer. The first layer to the third layer can include an overlap region. At least the first layer and the second layer, or the second layer and the third layer can be attached to each other in a bonding step.

A fourth layer may be further included. The fourth layer may include a transistor that is a component of a circuit included in the third layer. The fourth layer may be provided between the second layer and the third layer. The first layer to the fourth layer may include an overlap region. The second layer and the fourth layer may be attached to each other in a bonding step.

The transistor included in the fourth layer can include a metal oxide in a channel formation region, and the metal oxide can contain In, Zn, and M (M is one or more of Al, Ti, Ga, Ge, Sn, Y, Zr, La, Ce, Nd, and Hf).

Another embodiment of the present invention is an operation method of an imaging device, comprising the first step of initializing a potential corresponding to first imaging data to a first potential; the second step of generating a third potential that is a difference between the first potential and a potential obtained by adding a second potential to the first imaging data; the third step of initializing a potential corresponding to second imaging data to a fourth potential; the fourth step of generating a sixth potential that is a difference between the fourth potential and a potential obtained by adding a fifth potential to the second imaging data; the fifth step of obtaining a seventh potential that is a difference between the third potential and the sixth potential; and the sixth step of outputting the seventh potential to a neural network.

The first imaging data can be obtained by an operation in which a potential of a charge accumulation portion in a pixel is changed from a reset potential, and the second imaging data can be obtained by an operation in which the potential of the charge accumulation portion in the pixel is not changed from the reset potential.

The first potential and the fourth potential can be potentials having the same value. Alternatively, the first potential and the fourth potential may be potentials having different values.

The second potential and the fifth potential can be potentials having the same value. Alternatively, the second potential and the fifth potential may be potentials having different values.

Effect of the Invention

With one embodiment of the present invention, an imaging device capable of image processing can be provided. Alternatively, an imaging apparatus with low power consumption can be provided. Alternatively, an imaging device with high reliability can be provided. Alternatively, a novel imaging device or the like can be provided. Alternatively, a method for driving the above imaging device can be provided. Alternatively, a novel semiconductor device or the like can be provided.

BRIEF DESCRIPTION OF THE DRAWINGS

FIG. 26A1 to FIG. 26B3 are perspective views of a package and a module in each of which an imaging device is placed.

MODE FOR CARRYING OUT THE INVENTION

Figure 1:
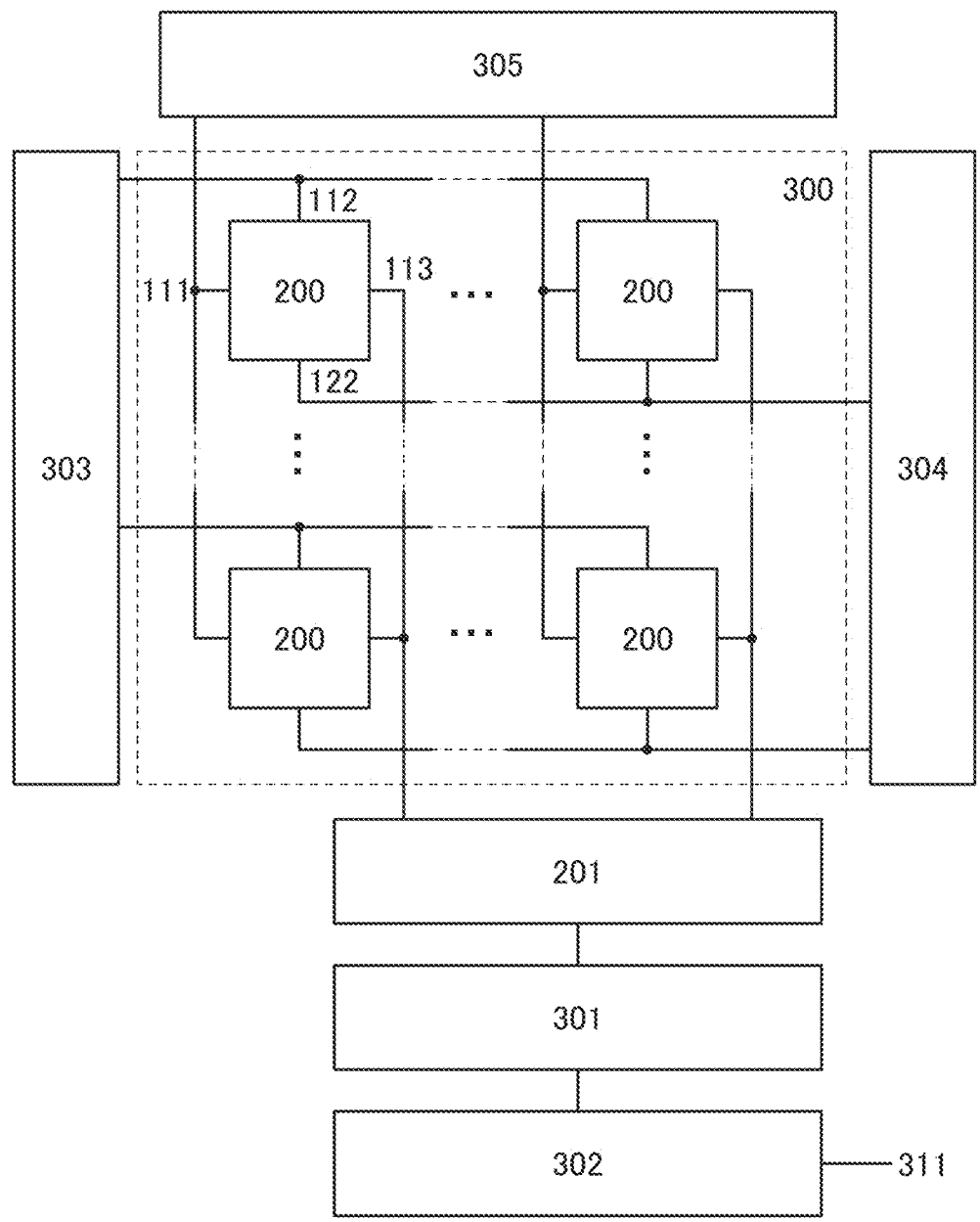
FIG. 1 is a block diagram illustrating an imaging device.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the descriptions of embodiments below. Note that in structures of the invention described below, the same portions or portions having similar functions are denoted by the same reference numerals in different drawings, and the description thereof is not repeated in some cases. Note that the hatching of the same component that constitutes a drawing is omitted or changed as appropriate in different drawings in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where components are illustrated in a circuit diagram as if they were directly connected to each other, the components may actually be connected to each other through one conductor or a plurality of conductors. In this specification, even such a structure is included in direct connection.

Embodiment 1

In this embodiment, an imaging device of one embodiment of the present invention is described with reference to drawings.

One embodiment of the present invention is an imaging device having an additional function such as image recognition. The imaging device can retain analog data (image data) obtained by an imaging operation in a pixel and extract data obtained by multiplying the analog data by a predetermined weight coefficient.

In addition, when the data taken out from the pixel is taken in a neural network or the like, processing such as image recognition can be performed. Since, in one embodiment of the present invention, an enormous amount of image data can be retained in pixels in an analog data state and an arithmetic operation can be performed in the pixels, processing can be performed efficiently.

FIG. 1 is a block diagram illustrating an imaging device of one embodiment of the present invention. The imaging device includes a pixel array 300, a circuit 201, a circuit 301, a circuit 302, a circuit 303, a circuit 304, and a circuit 305. Note that the structures of the circuit 201 and the circuit 301 to the circuit 305 are not limited to single circuits and may each consist of a plurality of circuits. Alternatively, any of two or more of the above circuits may be combined. The pixel array 300 has an imaging function and an arithmetic function. The circuits 201 and 301 each have an arithmetic function. The circuit 302 has an arithmetic function or a data conversion function. The circuits 303 and 304 each have a selection function. The circuit 305 has a function of supplying a potential to a pixel.

Figure 2:
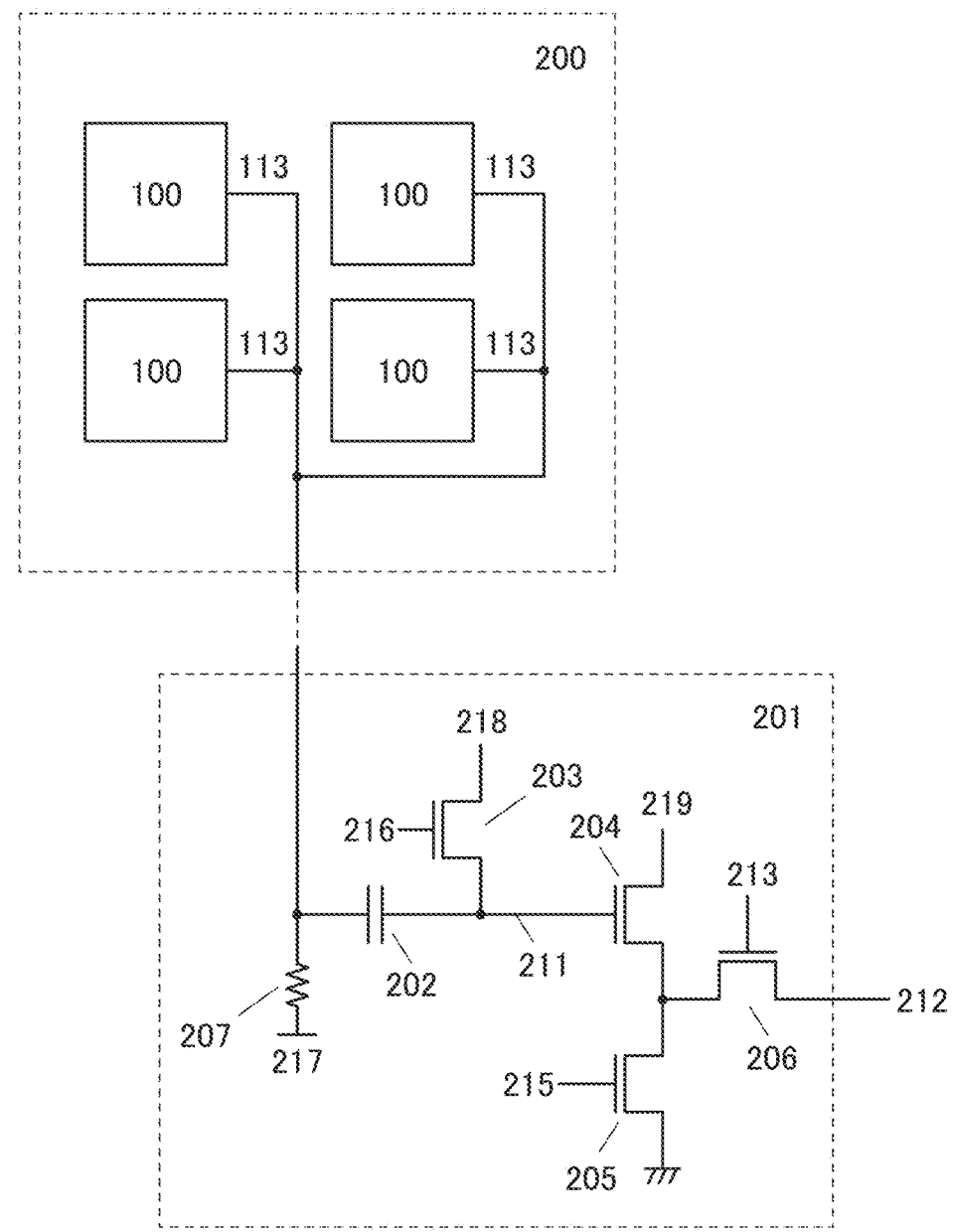
FIG. 2 is a diagram illustrating a pixel block 200 and a circuit 201.

The pixel array 300 includes a plurality of pixel blocks 200. As illustrated in FIG. 2, the pixel block 200 includes a plurality of pixels 100 arranged in a matrix, and each of the pixels 100 is electrically connected to the circuit 201. Note that the circuit 201 can also be provided in the pixel block 200.

The pixel 100 can obtain image data. Note that the number of pixels is 2×2 in an example illustrated in FIG. 2 but is not limited to this. For example, the number of pixels can be 3×3, 4×4, or the like. Alternatively, the number of pixels in the horizontal direction and the number of pixels in the vertical direction may differ from each other. Furthermore, some pixels may be shared by adjacent pixel blocks.

The pixel block 200 and the circuit 201 operate as a product-sum operation circuit. The circuit 201 also has a function of a correlated double sampling circuit (CDS circuit).

Figure 3A:
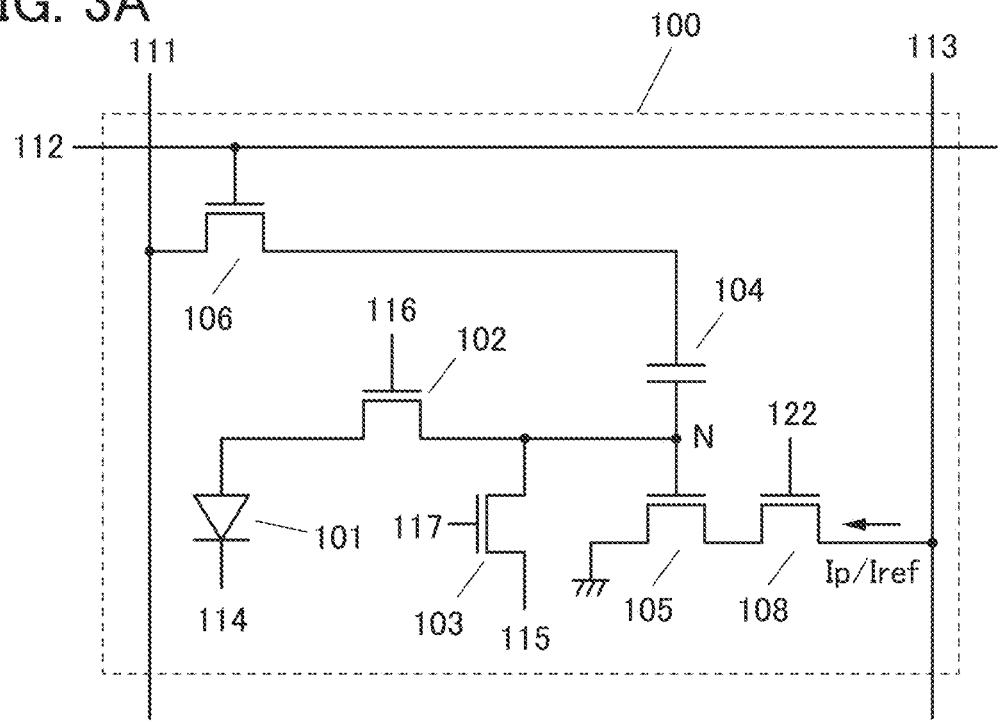
FIG. 3A and FIG. 3B are diagrams each illustrating a pixel 100.

As illustrated in FIG. 3A, the pixel 100 can include a photoelectric conversion device 101, a transistor 102, a transistor 103, a capacitor 104, a transistor 105, a transistor 106, and a transistor 108. Note that the photoelectric conversion device can also be referred to as a photoelectric conversion element. The capacitor can also be referred to as a capacitor or a capacitor element.

One electrode of the photoelectric conversion device 101 is electrically connected to one of a source and a drain of the transistor 102. The other of the source and the drain of the transistor 102 is electrically connected to one of a source and a drain of the transistor 103. The one of the source and the drain of the transistor 103 is electrically connected to one electrode of the capacitor 104. The one electrode of the capacitor 104 is electrically connected to a gate of the transistor 105. One of a source and a drain of the transistor 105 is electrically connected to one of a source and a drain of the transistor 108. The other electrode of the capacitor 104 is electrically connected to one of a source and a drain of the transistor 106.

The other electrode of the photoelectric conversion device 101 is electrically connected to a wiring 114. A gate of the transistor 102 is electrically connected to a wiring 116. The other of the source and the drain of the transistor 103 is electrically connected to a wiring 115. A gate of the transistor 103 is electrically connected to a wiring 117. The other of the source and the drain of the transistor 105 is electrically connected to a GND wiring or the like. The other of the source and the drain of the transistor 108 is electrically connected to a wiring 113. The other of the source and the drain of the transistor 106 is electrically connected to a wiring 111. A gate of the transistor 106 is electrically connected to a wiring 112. A gate of the transistor 108 is electrically connected to a wiring 122.

Here, a portion where the other of the source and the drain of the transistor 102, the one of the source and the drain of the transistor 103, the one electrode of the capacitor 104, and the gate of the transistor 105 are electrically connected is referred to as a node N.

The wirings 114 and 115 can each have a function of a power supply line. For example, the wiring 114 can function as a high potential power supply line, and the wiring 115 can function as a low potential power supply line. The wirings 112, 116, 117, and 122 can function as signal lines for controlling the electrical conduction of the respective transistors. The wiring 111 can function as a wiring for supplying a potential corresponding to a weight coefficient to the pixel 100. The wiring 113 can function as a wiring for electrically connecting the pixel 100 and the circuit 201.

Note that an amplifier circuit or a gain control circuit may be electrically connected to the wiring 113.

As the photoelectric conversion device 101, a photodiode can be used. In order to increase the light detection sensitivity under low illuminance conditions, an avalanche photodiode is preferably used.

The transistor 102 can have a function of controlling the potential of the node N. The transistor 103 can have a function of initializing the potential of the node N. The transistor 105 can have a function of controlling a current fed by the circuit 201 depending on the potential of the node N. The transistor 108 can have a function of selecting a pixel. The transistor 106 can have a function of supplying the potential corresponding to a weight coefficient to the node N.

Figure 3B:
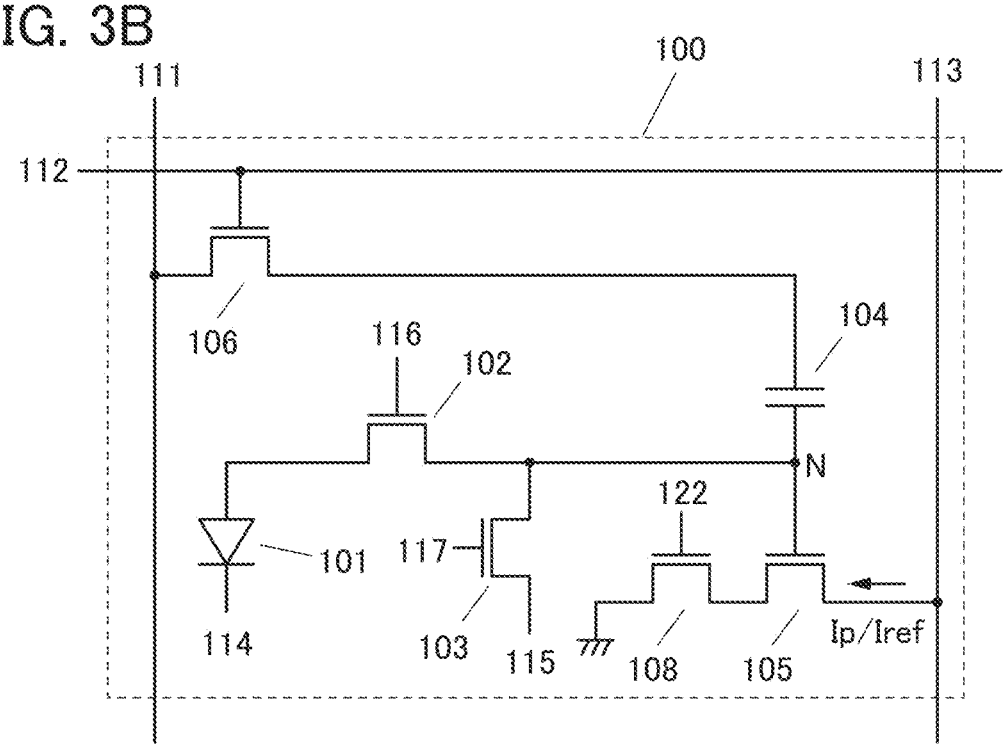

Note that as illustrated in FIG. 3B, the transistor 105 and the transistor 108 may be arranged such that the one of the source and the drain of the transistor 105 is electrically connected to the one of the source and the drain of the transistor 108, the other of the source and the drain of the transistor 105 is connected to the wiring 113, and the other of the source and the drain of the transistor 108 is electrically connected to a GND wiring or the like.

In the case where an avalanche photodiode is used as the photoelectric conversion device 101, a high voltage is sometimes applied and thus a transistor with a high withstand voltage is preferably used as a transistor connected to the photoelectric conversion device 101. As the transistor with a high withstand voltage, a transistor using a metal oxide in its channel formation region (hereinafter, an OS transistor) or the like can be used, for example. Specifically, an OS transistor is preferably used as the transistor 102.

The OS transistor also has a feature of an extremely low off-state current. When OS transistors are used as the transistors 102, 103, and 106, the charge retention period of the node N can be lengthened greatly. Therefore, a global shutter mode in which charge accumulation operation is performed in all the pixels at the same time can be used without complicating the circuit structure and operation method. Furthermore, while image data is retained at the node N, an arithmetic operation using the image data can be performed a plurality of times.

Meanwhile, it is desired that the transistor 105 has excellent amplifying characteristics. The transistors 106 and 108 are preferably transistors having a high mobility capable of high-speed operation because the transistors 106 and 108 are repeatedly turned on and off at frequent intervals. Accordingly, transistors using silicon in their channel formation regions (hereinafter, Si transistors) may be used as the transistors 105, 106, and 108.

Note that without limitation to the above, an OS transistor and a Si transistor may be freely used in combination. Alternatively, all the transistors may be OS transistors. Alternatively, all the transistors may be Si transistors.

Examples of the Si transistor include a transistor including amorphous silicon and a transistor including crystalline silicon (microcrystalline silicon, low-temperature polysilicon, or single crystal silicon).

The potential of the node N in the pixel 100 is determined by capacitive coupling between a potential obtained by adding a reset potential supplied from the wiring 115 and a potential (image data) generated by photoelectric conversion by the photoelectric conversion device 101 and the potential corresponding to a weight coefficient supplied from the wiring 111. That is, a current corresponding to data in which a predetermined weight coefficient is added to the image data flows through the transistor 105.

As illustrated in FIG. 2, the pixels 100 are electrically connected to each other through the wiring 113. The circuit 201 can perform an arithmetic operation using the sum of the currents flowing through the transistors 105 of the pixels 100.

The circuit 201 includes a capacitor 202, a transistor 203, a transistor 204, a transistor 205, a transistor 206, and a resistor 207.

One electrode of the capacitor 202 is electrically connected to one of a source and a drain of the transistor 203. The one of the source and the drain of the transistor 203 is electrically connected to a gate of the transistor 204. One of a source and a drain of the transistor 204 is electrically connected to one of a source and a drain of the transistor 205. The one of the source and the drain of the transistor 205 is electrically connected to one of a source and a drain of the transistor 206. One electrode of the resistor 207 is electrically connected to the other electrode of the capacitor 202.

The other electrode of the capacitor 202 is electrically connected to the wiring 113. The other of the source and the drain of the transistor 203 is electrically connected to a wiring 218. The other of the source and the drain of the transistor 204 is electrically connected to a wiring 219. The other of the source and the drain of the transistor 205 is electrically connected to a reference power supply line such as a GND wiring. The other of the source and the drain of the transistor 206 is electrically connected to a wiring 212. The other electrode of the resistor 207 is electrically connected to a wiring 217.

The wirings 217, 218, and 219 can each have a function of a power supply line. For example, the wiring 218 can have a function of a wiring for supplying a reset potential for reading operation. The wirings 217 and 219 can function as high potential power supply lines. The wirings 213, 215, and 216 can function as signal lines for controlling the electrical conduction of the respective transistors. The wiring 212 is an output line and can be electrically connected to the circuit 302 illustrated in FIG. 1, for example.

The transistor 203 can have a function of resetting the potential of the wiring 211 to the potential of the wiring 218. The transistors 204 and 205 can function as source follower circuits. The transistor 206 can have a function of controlling reading operation. Note that the circuit 201 may have another structure as long as the circuit 201 has a function of operating as a CDS circuit.

In one embodiment of the present invention, offset components other than the product of image data (potential X) and a weight coefficient (potential W) are eliminated and an objective WX is extracted. WX can be calculated using data obtained when imaging is performed, data obtained when imaging is not performed, and data obtained by supplying weights to the respective data.

The total amount of the currents (Ip) flowing through the pixels 100 when imaging is performed is $k\Sigma(X-V_{th})^2$, and the total amount of the currents (Ip) flowing through the pixels 100 when weights are supplied is $k\Sigma(W+X-V_{th})^2$. The total amount of the currents (Iref) flowing through the pixels 100 when imaging is not performed is $k\Sigma(0-V_{th})^2$, and the total amount of currents (Iref) flowing through the pixels 100 when weights are supplied is $k\Sigma(W-V_{th})^2$. Here, k is a constant and $V_{th}$ is the threshold voltage of the transistor 105.

First, a difference (data A) between data obtained when imaging is performed and data obtained by supplying weights to the data is calculated. The difference is $k\Sigma((X-V_{th})^2-(W+X-V_{th})^2)=k\Sigma(-W^2-2\ W\cdot X+2\ W\cdot V_{th})$.

Next, a difference (data B) between data obtained when imaging is not performed and data obtained by supplying weights to the data is calculated. The difference is $k\Sigma((0-V_{th})^2-(W-V_{th})^2)=k\Sigma(-W^2+2\ W\cdot V_{th})$.

Then, a difference between the data A and the data B is calculated. The difference is $k\Sigma(-W^2-2\ W\cdot X+2\ W\cdot V_{th})-(-W^2+2\ W\cdot V_{th}))=k\Sigma(-2\ W\cdot X)$. That is, offset components other than the product of the image data (X) and the weight coefficient (W) can be removed.

The circuit 201 can read out the data A and the data B. Note that the circuit 301 can perform calculation of difference between the data A and the data B.

Figure 4A:
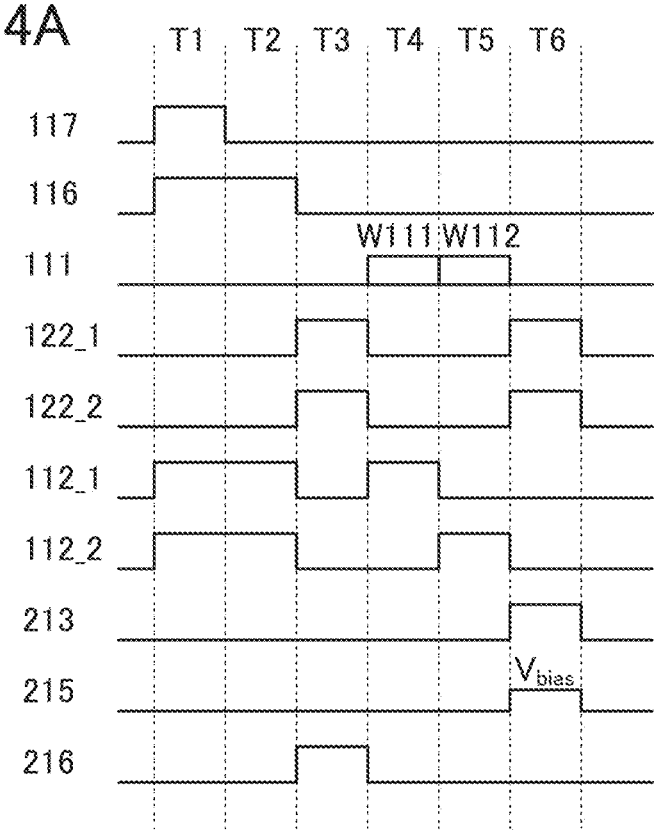
FIG. 4A and FIG. 4B are timing charts each illustrating operations of the pixel block 200 and the circuit 201.

FIG. 4A is a timing chart illustrating an operation of calculating the difference (data A) between the data obtained when imaging is performed and the data obtained by supplying the weight to the data in the pixel blocks 200 and the circuit 201. For convenience, the timings of changing signals are matched in the chart; however, in reality, the timings are preferably shifted in consideration of the delay inside the circuit.

First, in a period T1, the potential of the wiring 117 is set to "H" and the potential of the wiring 116 is set to "H", so that the nodes N in the pixels 100 have reset potentials. Furthermore, the potential of the wiring 111 is set to "L" and wirings 112_1 and 112_2 (the wirings 112 in the first and second rows) are set to "H", so that weight coefficients 0 are written.

In a period T2, the potential of the wiring 116 is kept at "H" and the potential of the wiring 117 is set to "L", so that the potential X (image data) is written to the nodes N by photoelectric conversion in the photoelectric conversion devices 101.

In a period T3, the potentials of wirings 122_1 and 122_2 are set to "H", so that all of the pixels 100 in the pixel block are selected. At this time, a current corresponding to the potential X flows to the transistor 105 in each of the pixels 100. The wiring 216 is set to "H", so that a potential Vr of the wiring 218 is written to the wiring 211. The operation in the periods T1 to T3 corresponds to obtainment of the data obtained when imaging is performed, and the data is initialized to the potential Vr of the wiring 211.

In a period T4, the potential of the wiring 111 is set to a potential corresponding to a weight coefficient W111 (a weight added to the pixels in the first row), and the potential of the wiring 112_1 is set to "H", so that the weight coefficient W111 is added to the nodes N of the pixels 100 in the first row by capacitive coupling of the capacitors 104.

In a period T5, the potential of the wiring 111 is set to a potential corresponding to a weight coefficient W112 (a weight added to the pixels in the second row), and the potential of the wiring 112_2 is set to "H", so that the weight coefficient W112 is added to the nodes N of the pixels 100 in the second row by capacitive coupling of the capacitors 104. The operation in the periods T4 and T5 corresponds to generation of data in which weights are supplied to the data obtained when imaging is performed.

In a period T6, the potentials of the wirings 122_1 and 122_2 are set to "H", so that all of the pixels 100 in the pixel block are selected. At this time, a current corresponding to the potential W111+X flows to the transistors 105 in the pixels 100 in the first row. A current corresponding to the potential W112+X flows to the transistors 105 in the pixels 100 in the second row. Here, the potential of the other electrode of the capacitor 202 changes in accordance with the current flowing through the wiring 113, and an amount Y of change is added to the potential Vr of the wiring 211 by capacitive coupling. Accordingly, the potential of the wiring 211 is "Vr+Y". Here, given that Vr=0, Y is the difference itself, which means that the data A is calculated.

The potential of the wiring 213 is set to "H" and the potential of the wiring 215 is set to an appropriate analog potential such as "$V_{bias}$", so that the circuit 201 can output a signal potential in accordance with the data A of the pixel blocks 200 in the first row by a source follower operation.

Figure 4B:
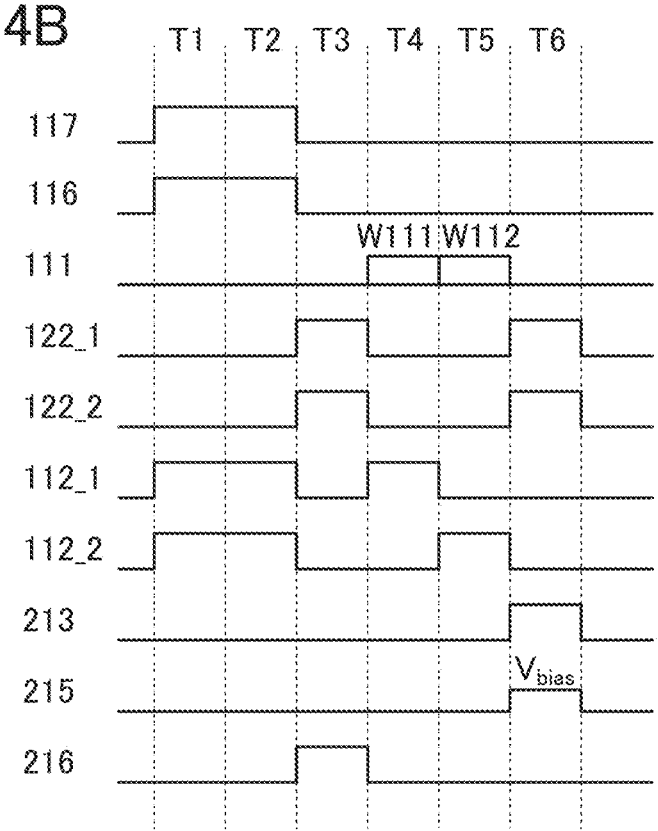

FIG. 4B is a timing chart illustrating an operation of calculating the difference (data B) between the data obtained when imaging is not performed and the data obtained by adding the weight to the data in the pixel blocks 200 and the circuit 201. Although an operation of consecutively obtaining the data B from the pixel blocks 200 is described here, the obtainment of the data B and the obtainment of the data A shown in FIG. 4 may be alternately performed. Alternatively, the data A may be obtained after the data B is obtained.

First, in the periods T1 and T2, the potential of the wiring 117 is set to "H" and the potential of the wiring 116 is set to "H", so that the nodes N in the pixels 100 have reset potentials (0). At the end of the period T2, the potential of the wiring 117 is set to "L" and the potential of the wiring 116 is set to "L". That is, in the periods, the potentials of the nodes N are the reset potentials regardless of the operation of the photoelectric conversion devices 101.

In addition, in the period T1, the potential of the wiring 111 is set to "L" and the wirings 112_1 and 112_2 are brought to "H", so that weight coefficients 0 are written. This operation is performed during a period in which the potentials of the nodes N are the reset potentials.

In the period T3, the potentials of the wirings 122_1 and 122_2 are set to "H", so that all of the pixels 100 in the pixel block are selected. At this time, a current corresponding to the reset potential flows to the transistor 105 in each of the pixels 100. The wiring 216 is set to "H", so that the potential Vr of the wiring 218 is written to the wiring 211. The operation in the periods T1 to T3 corresponds to obtainment of the data obtained when imaging is not performed, and the data is initialized to the potential Vr of the wiring 211.

In the period T4, the potential of the wiring 111 is set to a potential corresponding to the weight coefficient W111 (a weight added to the pixels in the first row), and the potential of the wiring 112_1 is set to "H", so that the weight coefficient W111 is added to the nodes N of the pixels 100 in the first row by capacitive coupling of the capacitors 104.

In the period T5, the potential of the wiring 111 is set to a potential corresponding to the weight coefficient W112 (a weight added to the pixels in the second row), and the potential of the wiring 112_2 is set to "H", so that the weight coefficient W112 is added to the nodes N of the pixels 100 in the second row by capacitive coupling of the capacitors 104. The operation in the periods T4 and T5 corresponds to generation of data in which weights are supplied to the data obtained when imaging is not performed.

In the period T6, the potentials of the wirings 122_1 and 122_2 are set to "H", so that all of the pixels 100 in the pixel block are selected. At this time, a current corresponding to the potential W111+0 flows to the transistors 105 in the pixels 100 in the first row. A current corresponding to the potential W112+0 flows to the transistors 105 in the pixels 100 in the first row. Here, the potential of the other electrode of the capacitor 202 changes in accordance with the current flowing through the wiring 113, and the amount Y of change is added to the potential Vr of the wiring 211. Accordingly, the potential of the wiring 211 is "Vr+Z". Here, given that Vr=0, Z is the difference itself, which means that the data B is calculated.

The potential of the wiring 213 is set to "H" and the potential of the wiring 215 is set to an appropriate analog potential such as "$V_{bias}$", so that the circuit 201 can output a signal potential in accordance with the data B of the pixel blocks 200 in the first raw by a source follower operation.

The data A and the data B output from the circuit 201 in the above operations are input to the circuit 301. Calculation of the difference between the data A and the data B is performed in the circuit 301, so that unnecessary offset components other than the product of the image data (potential X) and the weight coefficient (potential W) can be eliminated. The circuit 301 may have a structure in which the difference is calculated by utilizing a memory circuit and software processing, other than the structure including an arithmetic circuit such as the circuit 201.

Note that in the above operations, the potential of the wiring 211 of the circuit 201 is initialized to the potential "Vr" both in the operation of obtaining the data A and the operation of obtaining the data B. Then, "(Vr+Y)−(Vr+Z)"="Y−Z" in the following difference calculation, so that the component of the potential "Vr" is eliminated. As described above, the other unnecessary offset components are also eliminated, so that the product of the image data (potential X) and the weight coefficient (potential W) can be extracted.

This operation corresponds to the initial operation of a neural network performing inference or the like. Thus, at least one arithmetic operation can be performed in the imaging device before an enormous amount of image data is taken out to the outside, so that a load reduction, higher-speed processing, and reduction in power consumption in an arithmetic operation in the outside, input and output of data, or the like are achieved.

Alternatively, as an operation other than the operation described above, the potential of the wiring 211 of the circuit 201 may be initialized to different potentials in the operation of obtaining the data A and in the operation of obtaining the data B. For example, the potential of the wiring 211 is initialized to a potential "Vr1" in the operation of obtaining the data A and to a potential "Vr2" in the operation of obtaining the data B. In this case, "(Vr1+Y)−(Vr2+Z)"="(Vr1−Vr2)+(Y−Z)" in the following difference calculation. "Y−Z" is extracted as the product of the image data (potential X) and the weight coefficient (potential W) as in the above operation, and "Vr1−Vr2" is added. Here, "Vr1−Vr2" corresponds to a bias used for threshold value adjustment in the arithmetic operation in a middle layer of the neural network.

Furthermore, the weight has a function of a filter of a convolutional neural network (CNN), for example, and may additionally have a function of amplifying or attenuating data. For example, when the weight coefficient (W) in the operation of obtaining the data A is set to the product of data obtained by the filter processing and an amplified amount, the product of the image data and the weight coefficient in the filter processing can be amplified and data corrected to a brighter image can be extracted. The data B is data obtained when imaging is not performed and thus can also be referred to as black level data. Thus, the operation of calculating the difference between the data A and the data B can be an operation of promoting visualization of an image taken in a dark place. That is, luminance correction using a neural network can be performed.

As described above, a bias can be generated by the operation in the imaging device in one embodiment of the present invention. Furthermore, a functional weight can be added in the imaging device. Thus, a load in an arithmetic operation performed in the outside or the like can be reduced and the imaging device can be employed for a variety of usages. For example, part of processing in inference of a subject, correction of the resolution of image data, correction of luminance, generation of a color image from a monochrome image, generation of a three-dimensional image from a two-dimensional image, restoration of defected information, generation of a moving image from a still image, correction of an out-of-focus image, or the like can be performed in the imaging device.

Figure 5A:
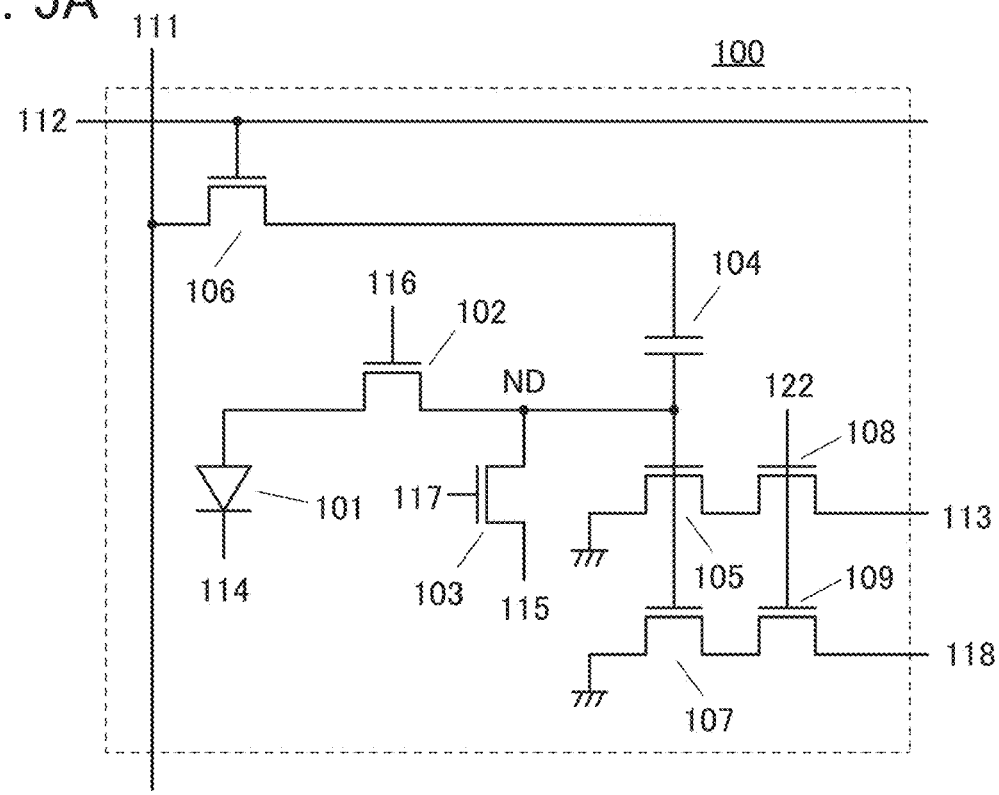
FIG. 5A is a diagram illustrating the pixel 100.

Note that the adjacent pixel blocks 200 may share the pixel 100. For example, a transistor 107 capable of producing output in a manner similar to that of the transistor 105 is provided in the pixel 100 as illustrated in FIG. 5A. A gate of the transistor 107 is electrically connected to the gate of the transistor 105, and one of a source and a drain of the transistor 107 is electrically connected to a wiring 118 through a transistor 109. A gate of the transistor 109 can be electrically connected to the wiring 122.

Figure 5B:
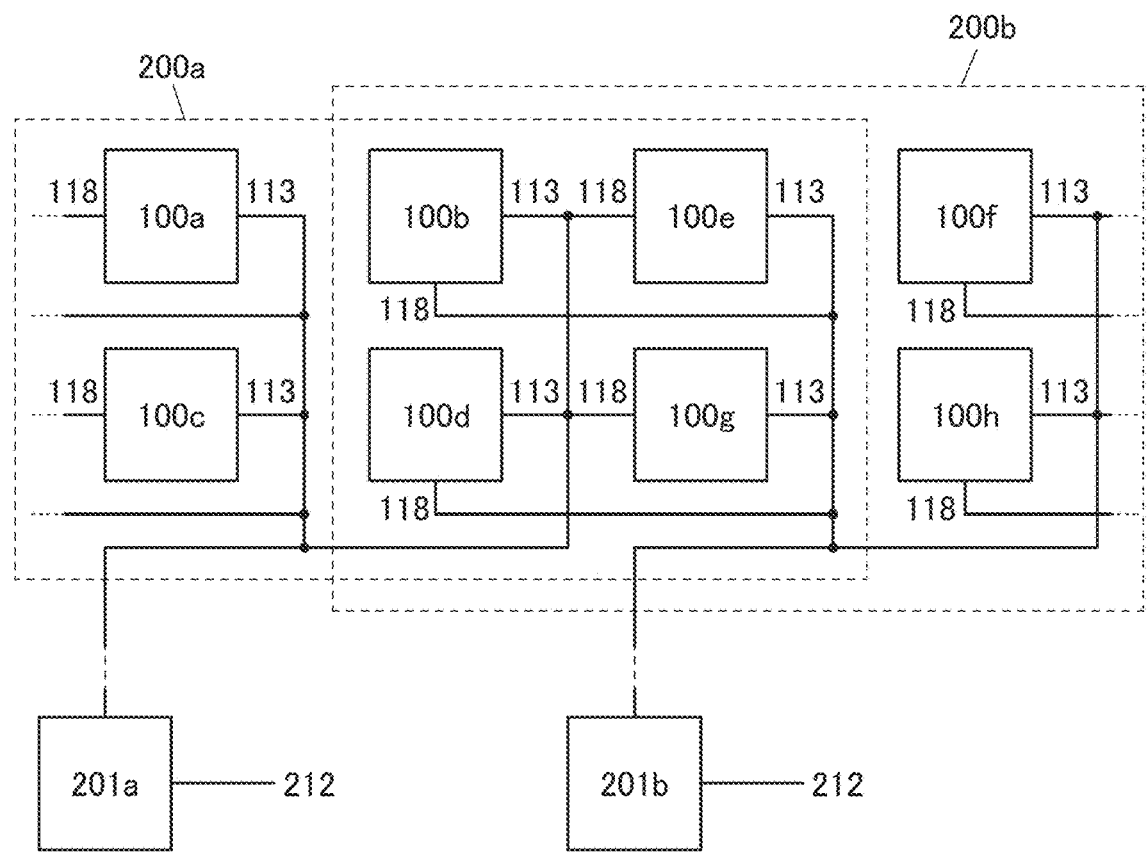
FIG. 5B is a diagram illustrating pixel blocks 200a and 200b.

The wiring 118 is utilized for electrical connection to the circuit 201 connected to the adjacent pixel blocks. FIG. 5B illustrates a form of connection between the pixels 100 (pixels 100a, 100b, 100c, 100d, 100e, 100f, 100g, and 100h) in the adjacent pixel blocks 200 (pixel blocks 200a and 200b) and the circuits 201 (circuits 201a and 201b) connected to the pixel blocks 200.

In the pixel block 200a, the pixels 100a, 100b, 100c, and 100d are electrically connected to the circuit 201a through the wiring 113. Furthermore, the pixels 100e and 100g are electrically connected to the circuit 201a through the wiring 118.

In the pixel block 200b, the pixels 100e, 100f, 100g, and 100h are electrically connected to the circuit 201b through the wiring 113. Furthermore, the pixels 100b and 100d are electrically connected to the circuit 201b through the wiring 118.

That is, it can be said that the pixel block 200a and the pixel block 200b share the pixels 100b, 100d, 100e, and 100g. With this form, a network between the pixel blocks 200 can be dense, improving the accuracy of image analysis and the like.

The weight coefficient can be output from the circuit 305 illustrated in FIG. 1 to the wiring 111, and it is preferable to rewrite the weight coefficient more than once in a frame period. As the circuit 305, a decoder can be used. The circuit 305 may include a D/A converter or an SRAM.

A signal potential can be output from the circuit 303 to the wiring 112 for selecting the pixel 100 to which the weight coefficient is input. As the circuit 303, a decoder or a shift register can be used.

A signal potential can be output from the circuit 304 to the wiring 122 connected to the gate of the transistor 108 of the pixel 100, for example. As the circuit 304, a decoder or a shift register can be used.

Although the processing of data of the captured image is described above, image data without processing can be extracted in the imaging device of one embodiment of the present invention.

In the product-sum operation, pixels in a plurality of rows are preferably selected at a time. Meanwhile, in the case where only imaging data is extracted, data is desirably extracted from pixels in one row. In one embodiment of the present invention, the circuit 304 for selecting the pixels 100 has a function of changing the number of rows to be selected.

Figure 6:
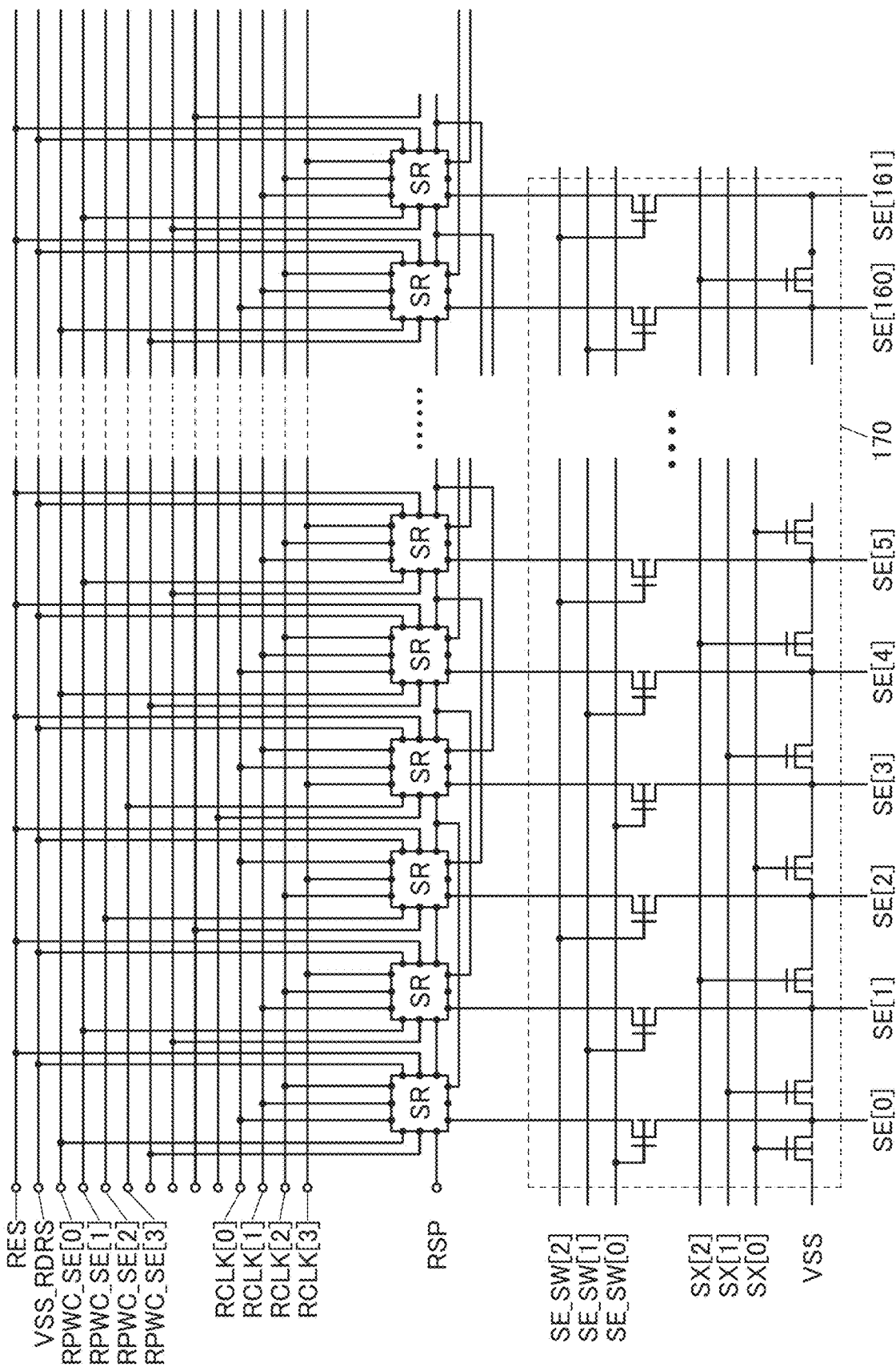
FIG. 6 is a diagram illustrating a circuit 304.

FIG. 6 illustrates an example of a circuit that can be used as the circuit 304. The circuit is a shift register circuit, in which a plurality of logic circuits (SR) are electrically connected. To the logic circuits (SR), signal lines such as a wiring RES, a wiring VSS_RDRS, wirings RPWC_SE[0:3], wirings RCLK[0:3], and a wiring RSP are connected and appropriate signal potentials are input to the respective signal lines, so that selection signal potentials can be sequentially output from the logic circuits (SR).

A circuit 170 is electrically connected to the logic circuits (SR). A plurality of transistors are provided in the circuit 170 and are connected to signal lines such as wirings SE_SW [0:2] and wirings SX[0:2]. When appropriate signal potentials are input to the respective signal lines, electrical conduction of the transistors is controlled. By the control by the circuit 170, the number of rows of pixels to be selected can be changed.

One of a source and a drain of one transistor is electrically connected to an output terminal of one logic circuit (SR), and the other of the source and the drain of the transistor is connected to the wiring SE. The wiring SE is electrically connected to the wiring 122 for selecting the pixel 100.

A signal potential supplied from the wiring SE_SW[0] can be input to a gate of the transistor connected to the wiring SE[0]. A signal potential supplied from the wiring SE_SW[1] can be input to a gate of the transistor connected to the wiring SE[1]. A signal potential supplied from the wiring SE_SW[2] can be input to a gate of the transistor connected to the wiring SE[2]. Signal potentials supplied from the wirings SE_SW[0:2] can be input to gates of the transistors connected to the wirings SE after the wirings SE[3] in the same order.

Moreover, adjacent wirings SE are electrically connected to each other through one transistor, and the wiring SE[0] is electrically connected to a power supply line (VSS) through one transistor.

A signal potential supplied from the wiring SX[0] can be input to a gate of the transistor that electrically connects the power supply line (VSS) and the wiring SE[0]. A signal potential supplied from the wiring SX[1] can be input to a gate of the transistor that electrically connects the wiring SE[0] and the wiring SE[1]. A signal potential supplied from the wiring SX[2] can be input to a gate of the transistor that electrically connects the wiring SE[1] and the wiring SE[2]. Signal potentials supplied from the wirings SX[0:2] can be input to gates of the transistors that electrically connect the subsequent adjacent wirings SE in the same order.

Figure 7:
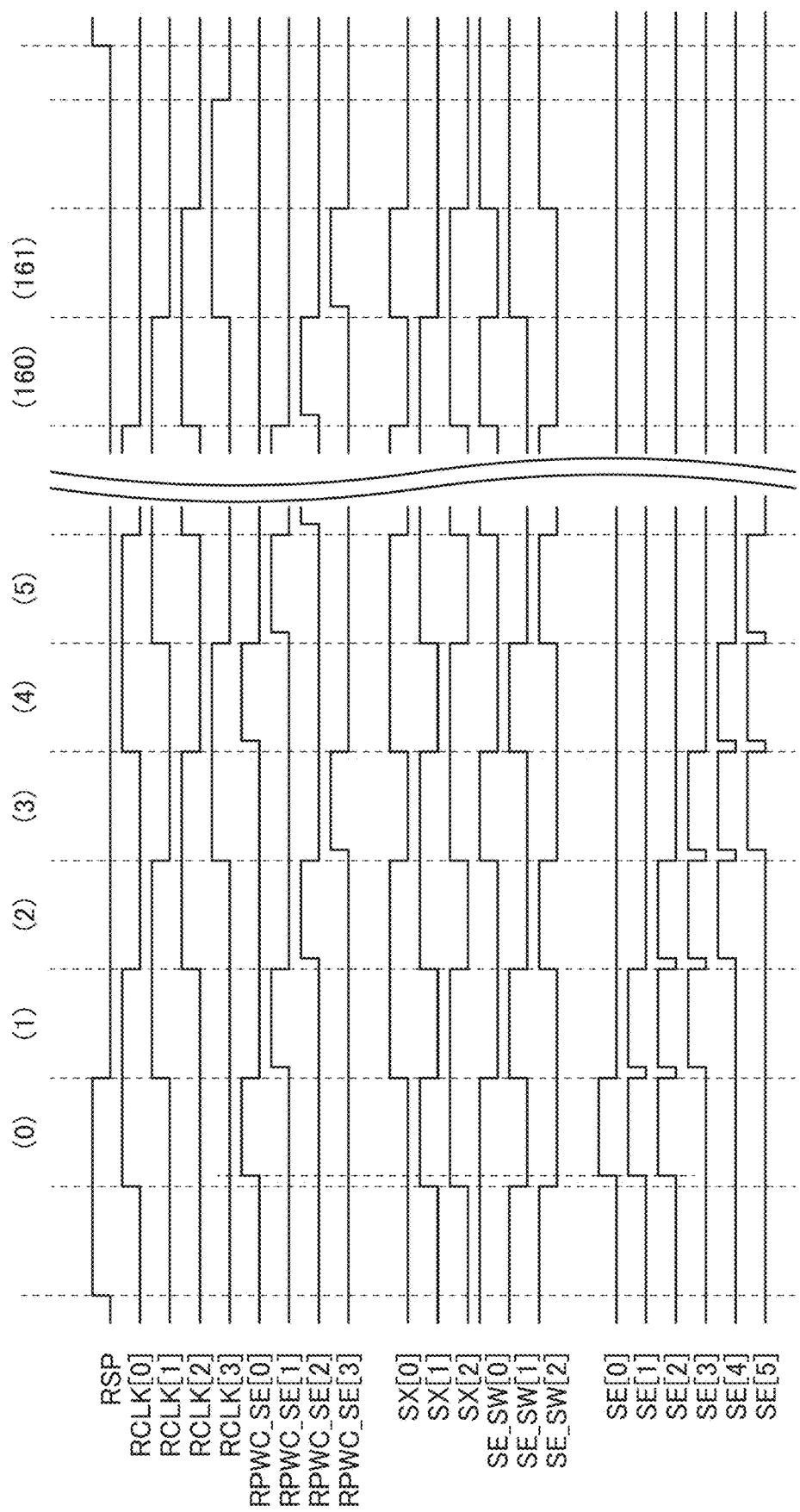
FIG. 7 is a timing chart illustrating an operation of the circuit 304.

FIG. 7 is a timing chart illustrating an operation in which a plurality of rows (three rows) are selected at a time by the circuit illustrated in FIG. 6. Note that (0) to (161) correspond to timings at which the logic circuits (SR) output signal potentials to the wirings SE.

When the potential of the wiring SX[0] is "L", the potential of the wiring SX[1] is "H", the potential of the wiring SX[2] is "H", the potential of the wiring SE_SW[0] is "H", the potential of the wiring SE_SW[1] is "L", and the potential of the wiring SE_SW[2] is "L" at the timing (0), electrical conduction of the respective transistors is controlled and "H", "H", and "H" are output to the wiring SE[0], the wiring SE[1], and the wiring SE[2], respectively. To the other wirings SE, "L" is output.

Thus, three rows can be selected at a time, and a product-sum operation of pixels of three rows and three columns can be performed, for example.

When the potential of the wiring SX[0] is "H", the potential of the wiring SX[1] is "L", the potential of the wiring SX[2] is "H", the potential of the wiring SE_SW[0] is "L", the potential of the wiring SE_SW[1] is "H", and the potential of the wiring SE_SW[2] is "L" at the timing (1), electrical conduction of the respective transistors is controlled and "L", "H", "H", and "H" are output to the wiring SE[0], the wiring SE[1], the wiring SE[2], and the wiring SE[3], respectively. To the other wirings SE, "L" is output.

That is, at the timing (1), a product-sum operation with a stride of 1, in which one-row shift from the timing (0) is made, can be performed.

Figure 8:
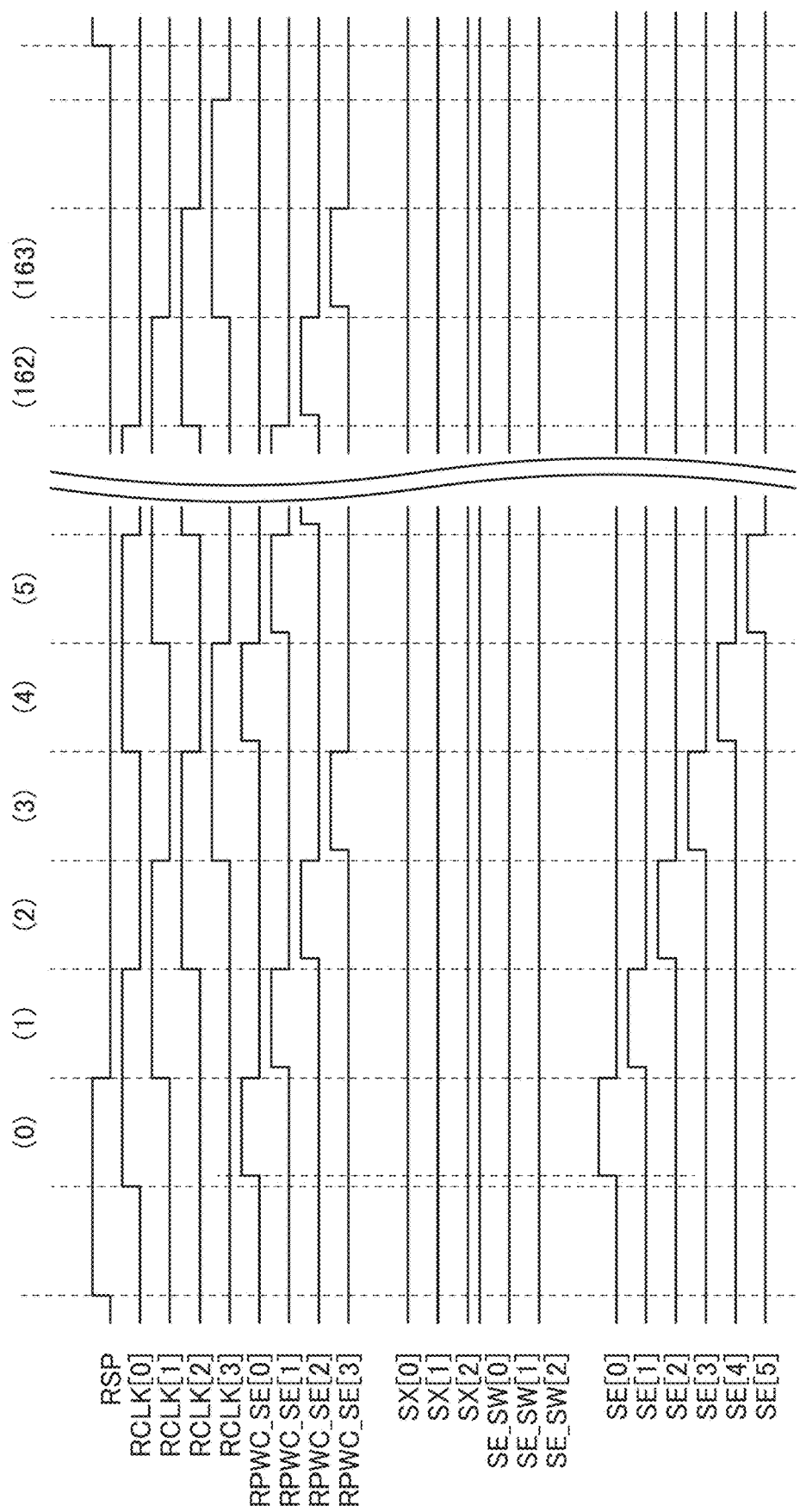
FIG. 8 is a timing chart illustrating an operation of the circuit 304.

FIG. 8 is a timing chart illustrating an operation in which one row is selected by the circuit illustrated in FIG. 6.

In the operation in accordance with the timing chart, the potentials of the wirings SE_SW[0:2] always remain at "H", and the potentials of the wirings SX[0:2] always remain at "L". Thus, outputs of the logic circuits (SR) are input to the respective wirings SE without any changes, which enables selection of one row at a time.

Note that in the structure illustrated in FIG. 2, the circuit 201 reads out the pixel blocks 200 performing an arithmetic operation of a weight (filter processing) or the like one by one, and accordingly a lot of time to read out is required in the product-sun operation with a stride of 1 or the like. In other words, in the structure illustrated in FIG. 2, the filter processing cannot be performed on the pixel blocks 200 in the column direction in parallel.

Figure 9:
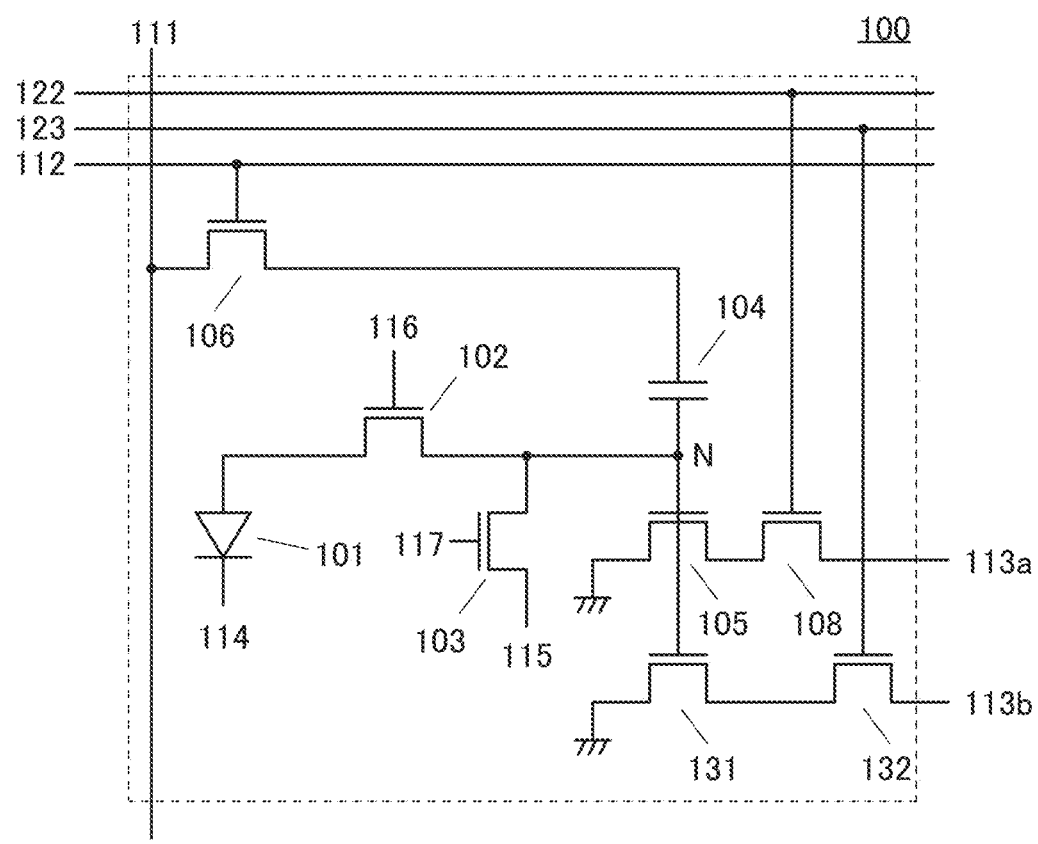
FIG. 9 is a diagram illustrating the pixel 100.

In view of the above, as illustrated in FIG. 9, a structure may be employed in which a transistor 131 and a transistor 132 are provided in the pixel 100 so that parallel reading can be performed.

A gate of the transistor 131 is electrically connected to the gate of the transistor 105. A gate of the transistor 132 is electrically connected to a wiring 123. One of a source and a drain of the transistor 131 is electrically connected to one of a source and a drain of the transistor 132, and the other of the source and the drain of the transistor 131 is electrically connected to a reference potential line such as a GND wiring.

Furthermore, the other of the source and the drain of the transistor 108 is electrically connected to a wiring 113a. The other of the source and the drain of the transistor 132 is electrically connected to a wiring 113b.

Figure 10:
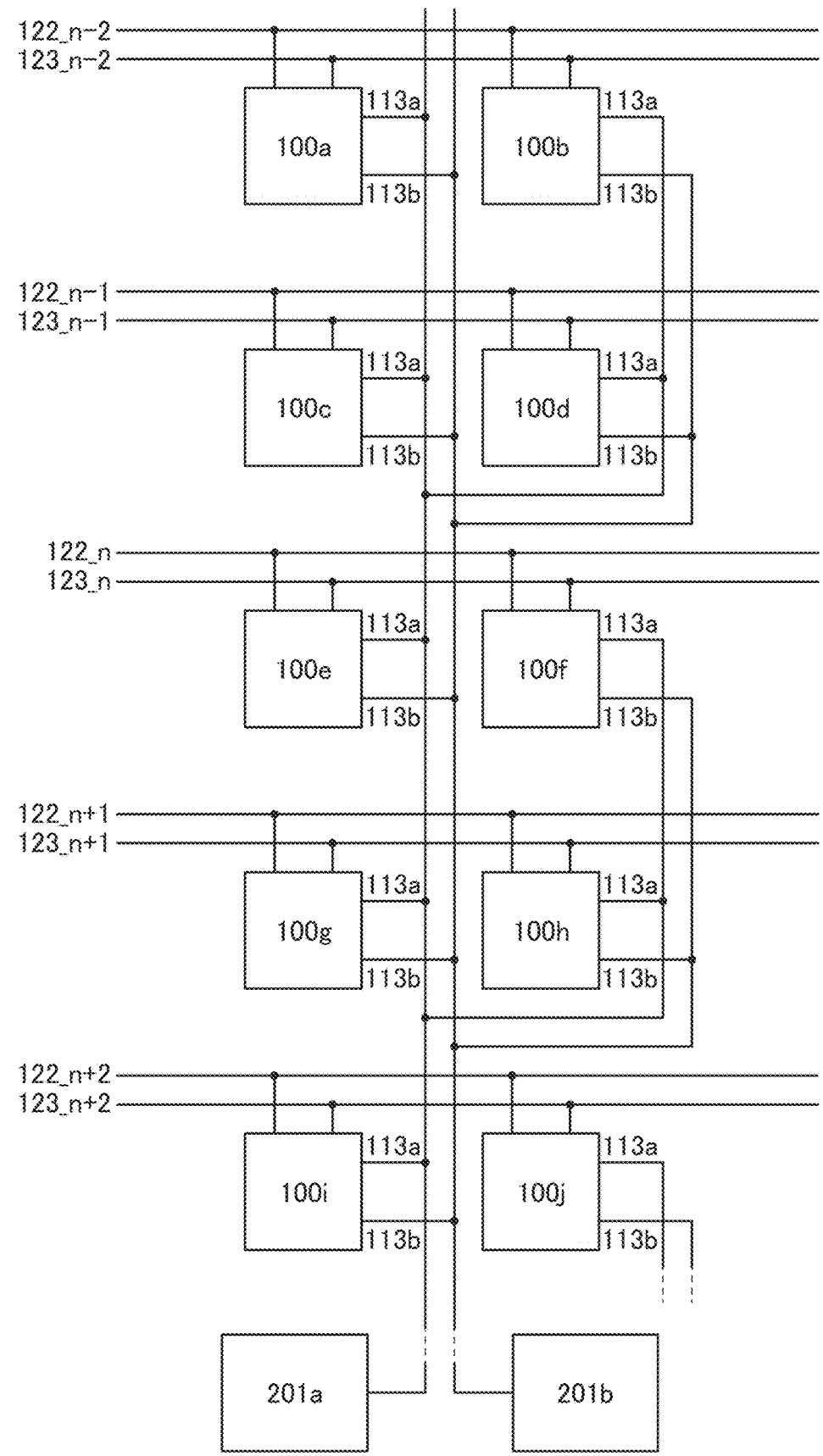
FIG. 10 is a diagram illustrating connection relations between the pixel 100 and the circuit 201.

FIG. 10 illustrates connection relations among the plurality of pixels 100 (the pixel 100a to a pixel 100j) connected in the vertical direction in five consecutive rows, the wirings 122 (a wiring 122_n-2 to a wiring 122_n+2, n is a natural number) electrically connected to the pixels, the wirings 123 (a wiring 123_n-2 to a wiring 123_n+2, n is a natural number) electrically connected to the pixels, and the circuits 201 (the circuit 201a and the circuit 201b) electrically connected to the pixels.

In the structure illustrated in FIG. 10, two circuits 201 are included. The wiring 113a is electrically connected to the circuit 201a and the wiring 113b is electrically connected to the circuit 201b.

Figure 11A:
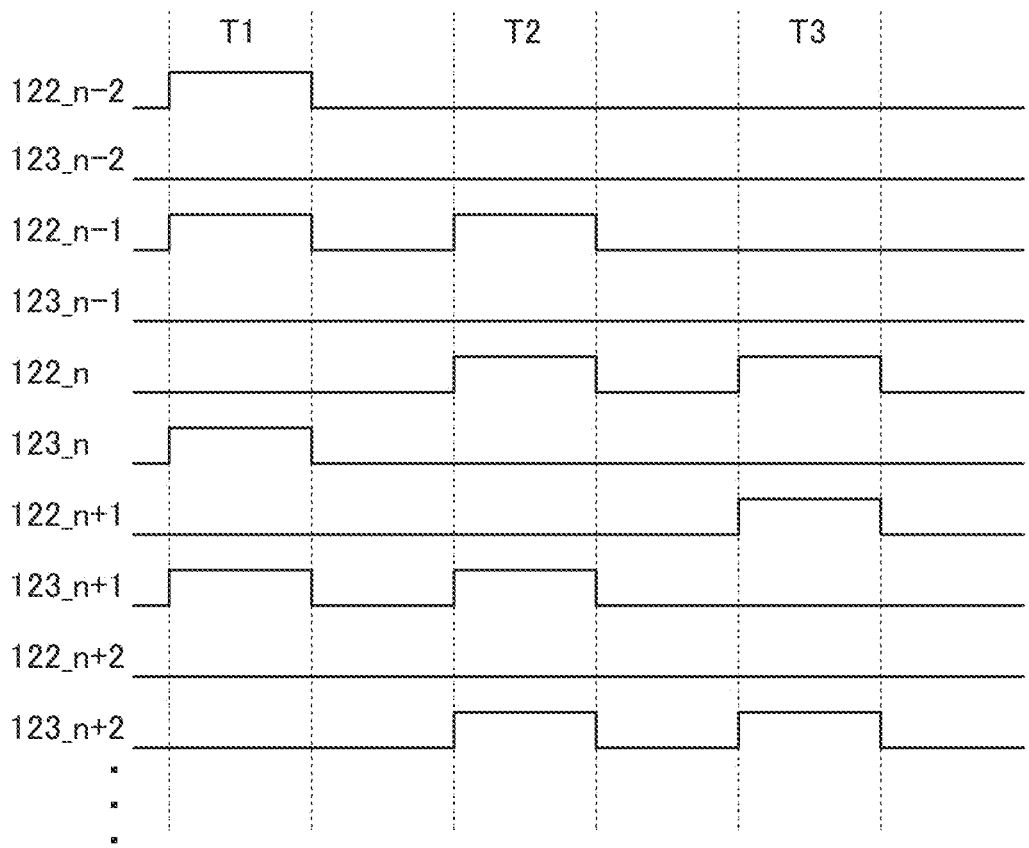
FIG. 11A is a timing chart illustrating a selection operation of the pixel 100.
Figure 11B:
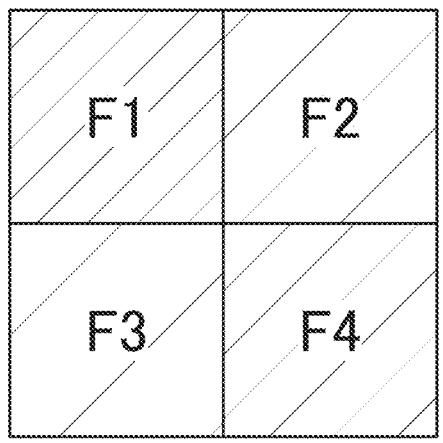
FIG. 11B and FIG. 11C are diagrams each illustrating a convolution filter applied to the pixel block.
Figure 11C:
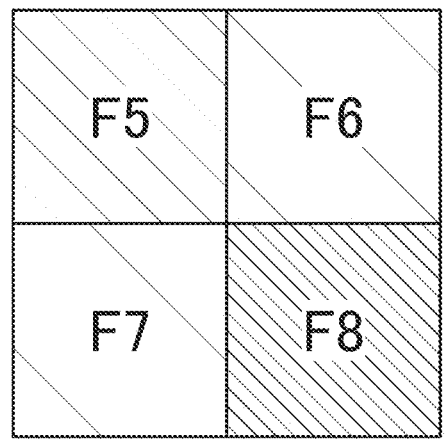

An operation in which parallel reading is performed in the structure illustrated in FIG. 10 is described with reference to a timing chart illustrated in FIG. 11A, FIG. 12, and FIG. 13. Note that an operation is described here in which convolution filters applied to a pixel block of four pixels, which are illustrated in FIG. 11B and FIG. 11C, are used, and the pixel blocks to which the filters are applied are sequentially read with a stride of 1. F1 to F4 and F5 to F8 correspond to the weights added to the respective pixels 100.

Note that only an operation of selecting the pixel 100 regarding the parallel reading operation is described here. The description made with reference to FIG. 4A and FIG. 4B can be referred to for a detailed operation of the pixels 100 and the circuit 201.

Figure 12:
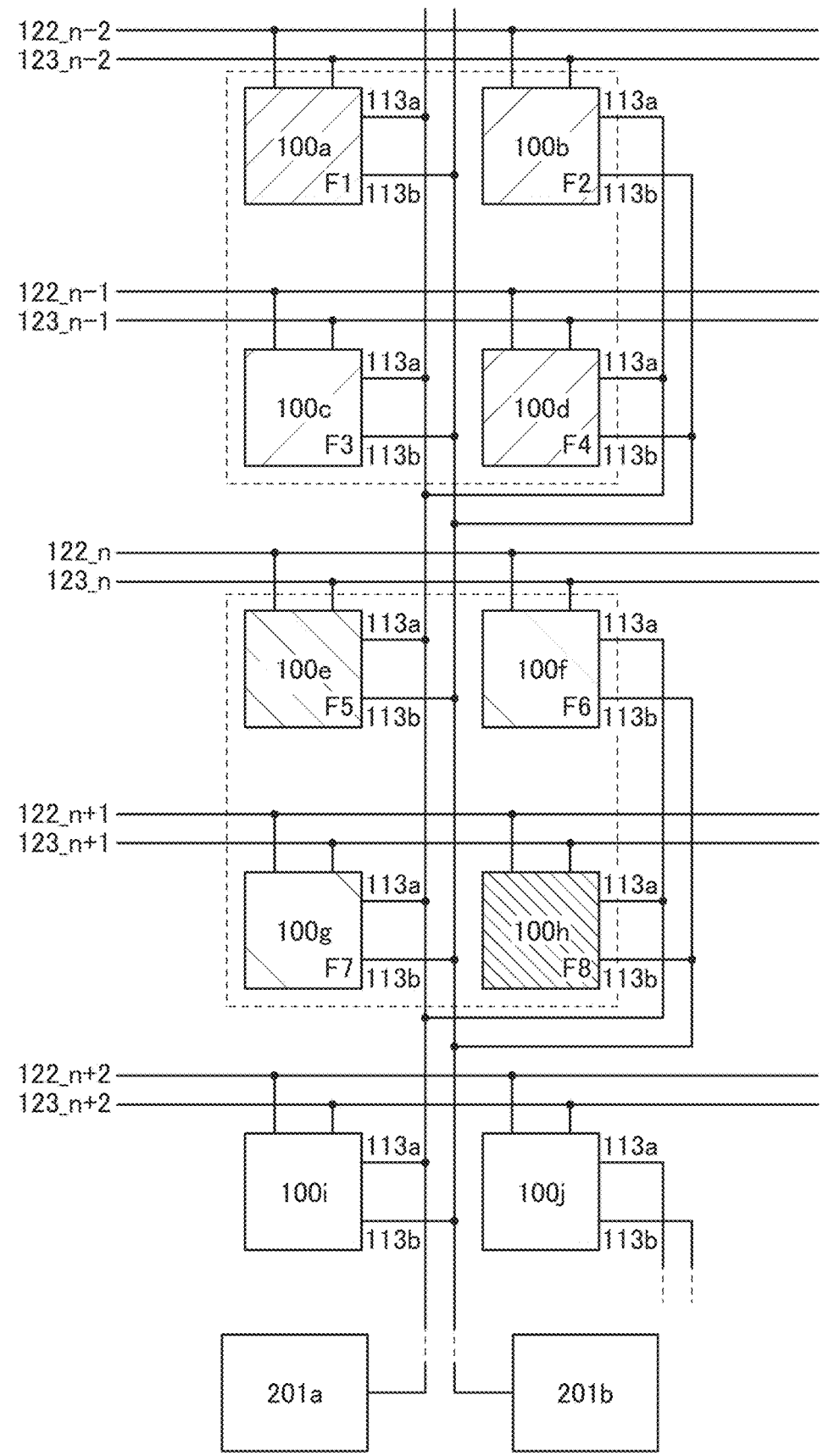
FIG. 12 is a diagram illustrating a selection operation of the pixel 100.

In the period T1, a pixel block consisting of the pixel 100a to the pixel 100d and a pixel block consisting of the pixel 100e to the pixel 100h are concurrently subjected to reading operation in parallel, which are illustrated in FIG. 12. The filter illustrated in FIG. 11B is used for the former pixel block. The filter illustrated in FIG. 11C is used for the latter pixel block.

When the wiring 122_n-2, the wiring 122_n-1, the wiring 123_n, and the wiring 123_n+1 are brought to "H" in the period T1, the transistors 108 in the pixel 100a to the pixel 100d are brought to a conduction state, and a product-sum operation result of the pixel 100a to the pixel 100d is output from the circuit 201a. The transistors 109 in the pixel 100e to the pixel 110h are brought to a conduction state, and a product-sum operation result of the pixel 100e to the pixel 100h is output from the circuit 201b.

Figure 13:
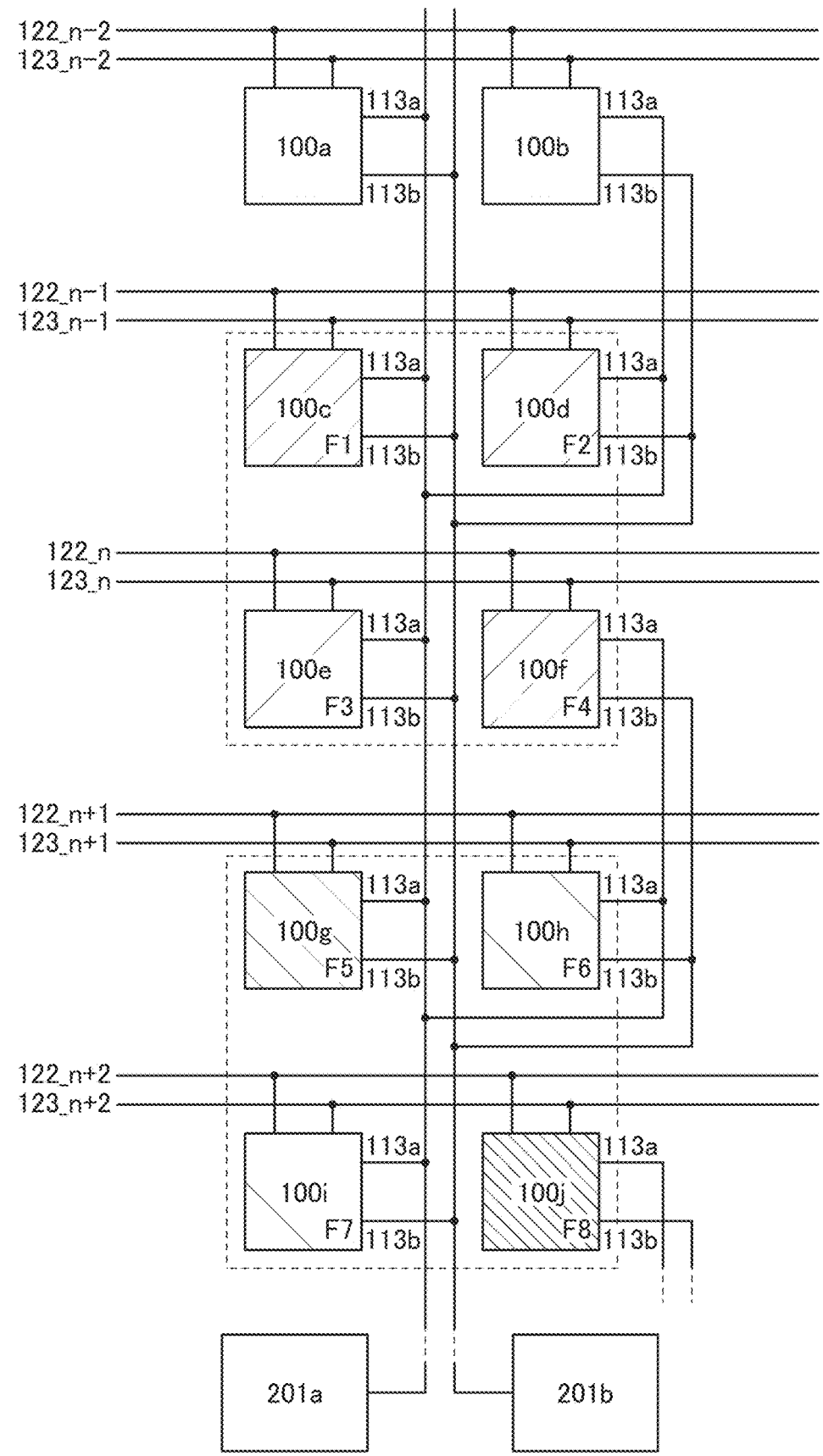
FIG. 13 is a diagram illustrating a selection operation of the pixel 100.

In the period T2, a pixel block consisting of the pixel 100c to the pixel 100f and a pixel block consisting of the pixel 100g to the pixel 100j are concurrently subjected to reading operation in parallel, which are illustrated in FIG. 13. The filter illustrated in FIG. 11B is used for the former pixel block. The filter illustrated in FIG. 11C is used for the latter pixel block.

When the wiring 122_n-1, the wiring 122_n, the wiring 123_n+1, and the wiring 123_n+2 are brought to "H" in the period T2, the transistors 108 in the pixel 100c to the pixel 100f are brought to a conduction state, and a product-sum operation result of the pixel 100c to the pixel 100f is output from the circuit 201a. The transistors 109 in the pixel 100g to the pixel 110j are brought to a conduction state, and a product-sum operation result of the pixel 100g to the pixel 100j is output from the circuit 201b.

In the period T3, a pixel block consisting of the pixel 100e to the pixel 100h illustrated in FIG. 13 and a pixel block consisting of the pixel 100i and the pixel 100h illustrated in FIG. 13 and two pixels not illustrated in FIG. 13 are concurrently subjected to reading operation in parallel.

Through the above operation, the product-sum operation results can be read out in parallel, and the filter processing can be performed at higher speed. Although the unit of a pixel block is 2×2 here, parallel reading can be performed in a similar manner when the unit of a pixel block is 3×3 or more. Moreover, when the number of wirings to which each pixel can selectively output is increased and the wirings are connected to the circuit 201, product-sum operation results of three or more pixel blocks can be read out in parallel.

Note that the above operation is an example in which selection of pixels is performed every two rows; this can be achieved in such a manner that two shift register circuits which can activate a plurality of selection wirings at the same time, such as the shift register circuit illustrated in FIG. 6, are provided. Alternatively, one shift register may be provided when a logic circuit is used which can activate the wiring 122_n-2, the wiring 122_n-1, the wiring 123_n, and the wiring 123_n+1 at the same time in the period T1 and can active the wiring 122_*n*−1, the wiring 122_*n*, the wiring 123_*n*+1, and the wiring 123_*n*+2 at the same time in the period T2.

Figure 14A:
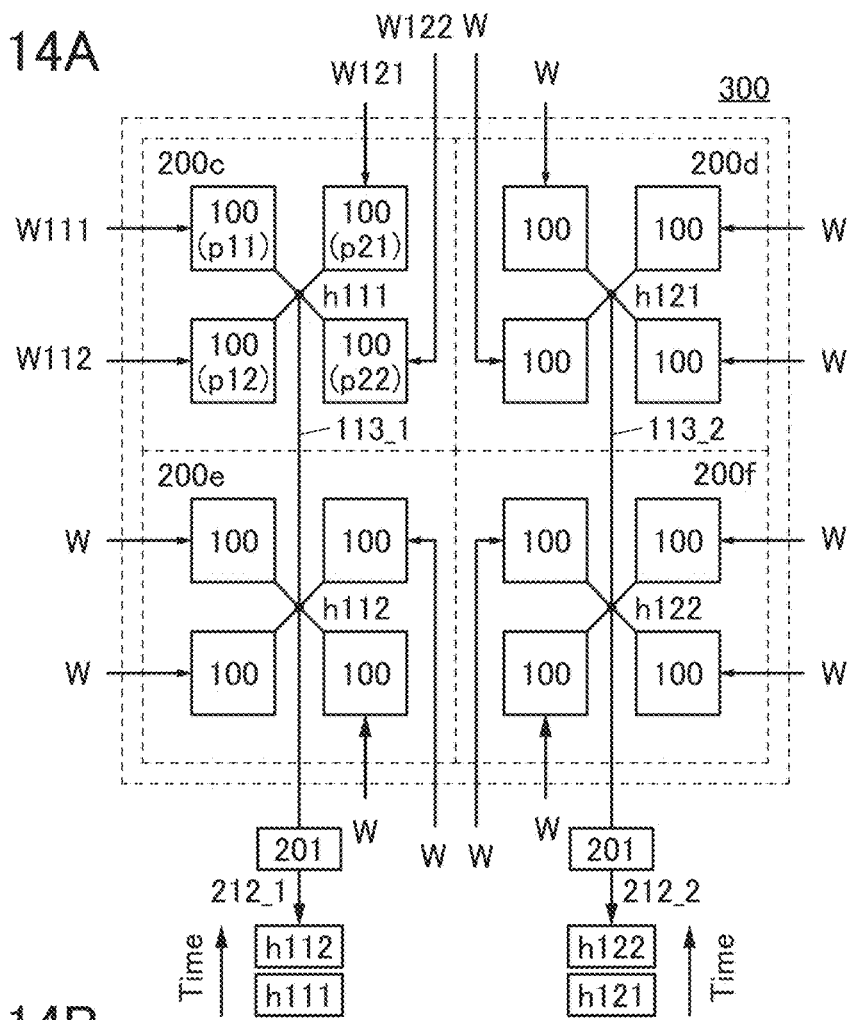
FIG. 14A is a diagram illustrating signals output from the pixel block 200 and the circuit 201.

FIG. 14A is a diagram explaining signal potentials output from the pixel blocks 200. For simple description, FIG. 14A illustrates an example where the pixel array 300 consists of four pixel blocks 200 (a pixel block 200*c*, a pixel block 200*d*, a pixel block 200*e*, and a pixel block 200*f*) and each of the pixel blocks 200 includes four pixels 100.

Generation of signal potentials will be described taking the pixel block 200*c* as an example, and the pixel blocks 200*d*, 200*e*, and 200*f* can output signal potentials through similar operations.

In the pixel block 200*c*, the pixels 100 retain their respective image data p11, p12, p21, and p22 in the nodes N. Weight coefficients (W111, W112, W121, and W122) are input to the pixels 100, and a product-sum operation result h111 is output through a wiring 113_1 (the wiring 113 in the first column), the circuit 201, and a wiring 212_1 (the wiring 212 in the first column). Here, h111=p11×W111+p12×W112+p21×W121+p22×W122. Note that the weight coefficients are not limited to being all different from each other, and the same value might be input to some of the pixels 100.

Concurrently through a process similar to the above, a product-sum operation result h121 is output from the pixel block 200*d* through a wiring 113_2 (the wiring 113 in the second column), the circuit 201, and a wiring 212_2 (the wiring 212 in the second column); thus, the output from the pixel blocks 200 in the first row is completed. Note that arrows in the diagram indicate time axes (Time).

Subsequently, in the pixel blocks 200 in the second row, through a process similar to the above, a product-sum operation result h112 is output from the pixel block 200*e* through the wiring 113_1 and the circuit 201. Concurrently, a product-sum operation result h122 is output from the pixel block 200*f* through the wiring 113_2 and the circuit 201; thus, the output from the pixel blocks 200 in the second row is completed.

Moreover, weight coefficients are changed in the pixel blocks 200 in the first row and a process similar to the above is performed, so that h211 and h221 can be output. Furthermore, weight coefficients are changed in the pixel blocks 200 in the second row and a process similar to the above is performed, so that h212 and h222 can be output. The above operation is repeated as necessary.

Figure 14B:
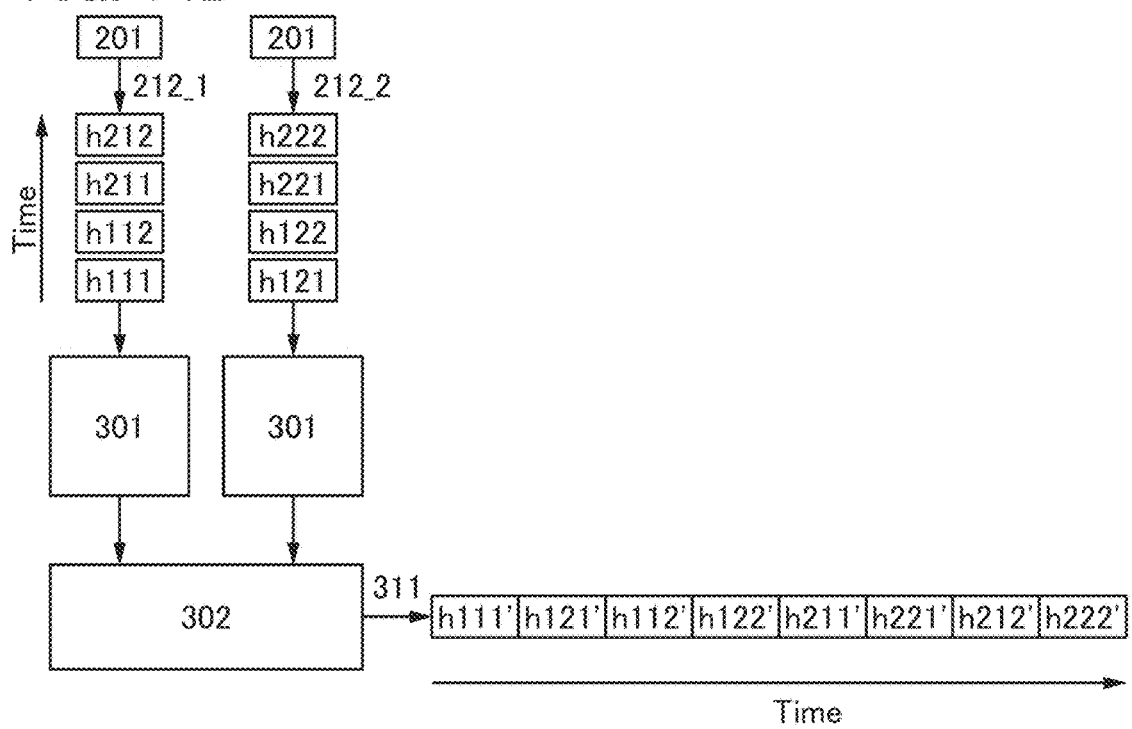
FIG. 14B is a diagram illustrating signals output from a circuit 302.

Product-sum operation result data output from the circuits 201 are sequentially input to the circuits 301 as illustrated in FIG. 14B. The circuits 301 may each have a variety of arithmetic functions in addition to the above-described function of calculating a difference between the data A and the data B.

For example, the circuits 301 may each include a circuit that performs arithmetic operation of an activation function. A comparator circuit can be used as the circuit, for example. A comparator circuit outputs a result of comparing input data and a set threshold as binary data. In other words, the pixel blocks 200 and the circuits 301 can operate as part of elements in a neural network.

Furthermore, in the case where the data output from the pixel blocks 200, which corresponds to image data of a plurality of bits, can be binarized by the circuits 301, the binarization can be rephrased as compression of image data.

The data output from the circuits 301 (h111', h121', h112', h122', h211', h221', h212', and h222') are sequentially input to the circuit 302.

The circuit 302 can have a structure including a latch circuit, a shift register, and the like, for example. With this structure, parallel serial conversion is possible, and data input in parallel may be output to a wiring 311 as serial data, as illustrated in FIG. 14B. The connection destination of the wiring 311 is not limited. For example, it can be connected to a neural network, a memory device, a communication device, or the like.

Figure 15:
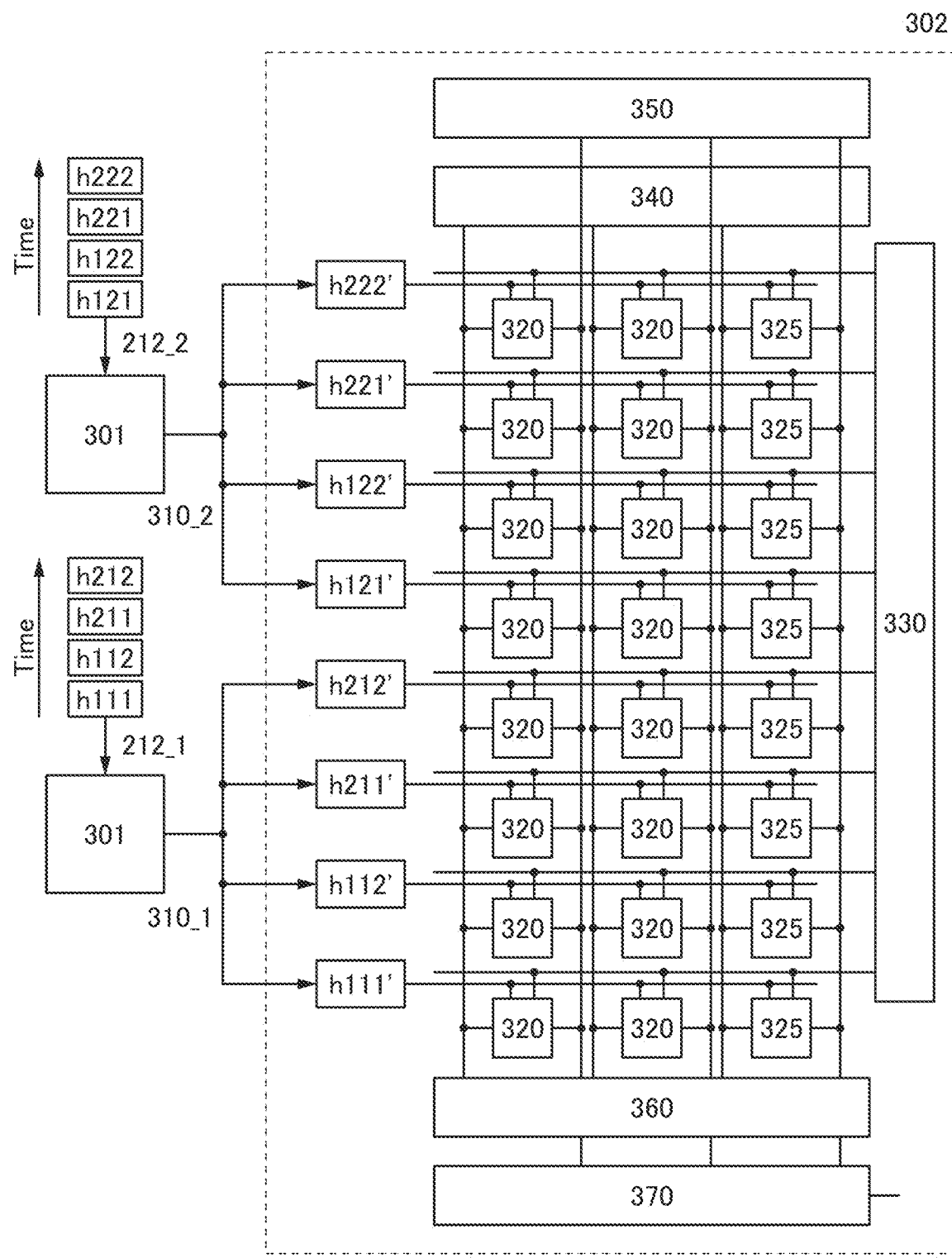
FIG. 15 is a diagram illustrating the circuit 302 (neural network).

Moreover, as illustrated in FIG. 15, the circuit 302 may include a neural network. The neural network includes memory cells arranged in a matrix, and each memory cell retains a weight coefficient. Data output from the circuit 301 are input to the cells in the row direction, and the product-sum operation in the column direction can be performed. Note that the number of memory cells illustrated in FIG. 15 is an example, and the number is not limited.

The neural network illustrated in FIG. 15 includes memory cells 320 and reference memory cells 325 which are arranged in a matrix, a circuit 340, a circuit 350, a circuit 360, and a circuit 370.

Figure 16:
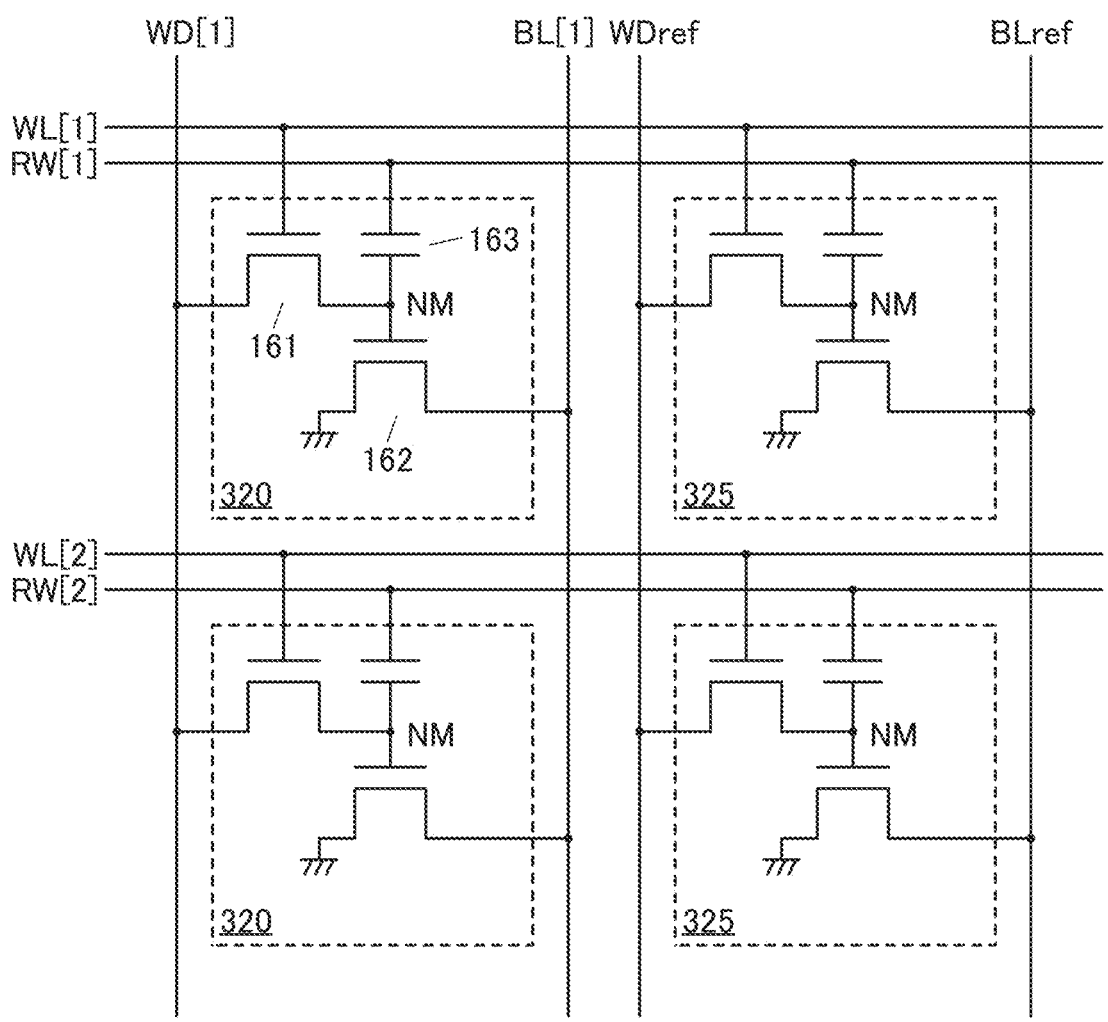
FIG. 16 is a diagram illustrating pixels included in the circuit 302.

FIG. 16 illustrates an example of the memory cells 320 and the reference memory cells 325. The reference memory cells 325 are provided in any one column. The memory cells 320 and the reference memory cells 325 have similar structures and each include a transistor 161, a transistor 162, and a capacitor 163.

One of a source and a drain of the transistor 161 is electrically connected to a gate of the transistor 162. The gate of the transistor 162 is electrically connected to one electrode of the capacitor 163. Here, a point at which the one of the source and the drain of the transistor 161, the gate of the transistor 162, and the one electrode of the capacitor 163 are connected is referred to as a node NM.

A gate of the transistor 161 is electrically connected to a wiring WL. The other electrode of the capacitor 163 is electrically connected to a wiring RW. One of a source and a drain of the transistor 162 is electrically connected to a reference potential wiring such as a GND wiring.

In the memory cell 320, the other of the source and the drain of the transistor 161 is electrically connected to a wiring WD. The other of the source and the drain of the transistor 162 is electrically connected to a wiring BL.

In the reference memory cell 325, the other of the source and the drain of the transistor 161 is electrically connected to a wiring WDref. The other of the source and the drain of the transistor 162 is electrically connected to a wiring BLref.

The wiring WL is electrically connected to a circuit 330. As the circuit 330, a decoder, a shift register, or the like can be used.

The wiring RW is electrically connected to the circuit 301. Binary data output from the circuit 301 to a wiring 311_1 or a wiring 311_2 is written to each memory cell.

The wiring WD and the wiring WDref are electrically connected to the circuit 340. As the circuit 340, a decoder, a shift register, or the like can be used. Furthermore, the circuit 340 may include a D/A converter or an SRAM. The circuit 340 can output a weight coefficient to be written to the node NM.

The wiring BL and the wiring BLref are electrically connected to the circuit 350 and the circuit 360. The circuit 350 is a current source circuit, and the circuit 360 can have a structure equivalent to that of the circuit 201. By the circuit 350 and the circuit 360, a signal potential of a product-sum operation result from which offset components are eliminated can be obtained.

The circuit 360 is electrically connected to the circuit 370. The circuit 370 can also be referred to as an activation function circuit. The activation function circuit has a function of performing calculation for converting the signal potential input from the circuit 360 in accordance with a predefined activation function. As the activation function, for example, a sigmoid function, a tanh function, a softmax function, a ReLU function, a threshold function, or the like can be used. The signal potential converted by the activation function circuit is output to the outside as output data.

Figure 17A:
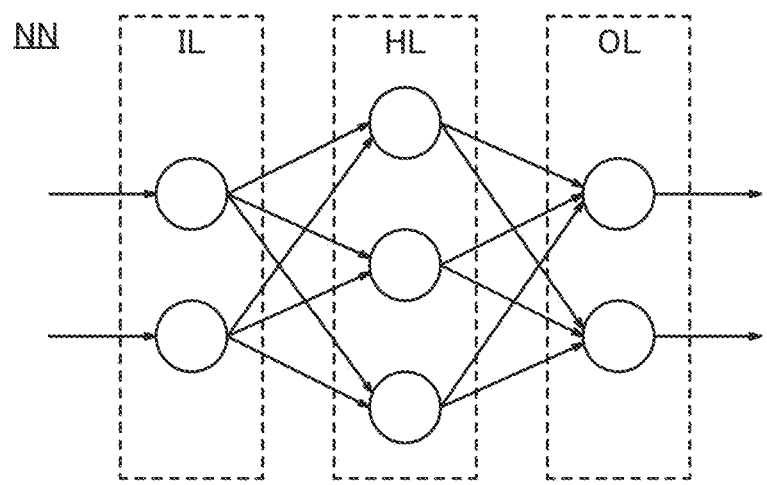
FIG. 17A and FIG. 17B are diagrams illustrating structure examples of neural networks.

As illustrated in FIG. 17A, a neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as a DNN (deep neural network). Learning using a deep neural network can also be referred to as deep learning.

Input data is input to each neuron in the input layer IL. An output signal of a neuron in the previous layer or the subsequent layer is input to each neuron in the middle layer HL. To each neuron in the output layer OL, output signals of the neurons in the previous layer are input. Note that each neuron may be connected to all the neurons in the previous and subsequent layers (full connection), or may be connected to some of the neurons.

Figure 17B:
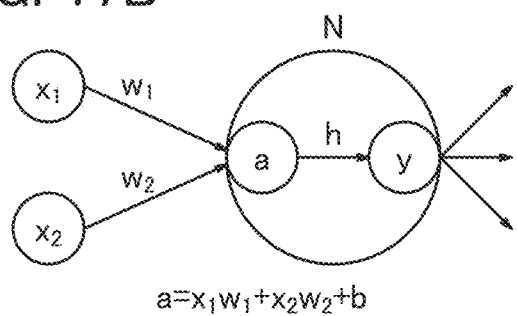

FIG. 17B shows an example of an operation with the neurons. Here, a neuron N and two neurons in the previous layer which output signals to the neuron N are illustrated. An output $x_1$ of a neuron in the previous layer and an output $x_2$ of a neuron in the previous layer are input to the neuron N. Then, in the neuron N, a total sum $x_1w_1+x_2w_2$ of a multiplication result ($x_1w_1$) of the output $x_1$ and a weight $w_1$ and a multiplication result ($x_2w_2$) of the output $x_2$ and a weight $w_2$ is calculated, and then a bias b is added as necessary, so that the value $a=x_1w_1+x_2w_2+b$ is obtained. Then, the value a is converted with an activation function h, and an output signal y=ah is output from the neuron N.

In this manner, the arithmetic operation with the neurons includes the arithmetic operation that sums the products of the outputs and the weights of the neurons in the previous layer, that is, the product-sum operation ($x_1w_1+x_2w_2$ described above). This product-sum operation may be performed using a program on software or may be performed using hardware.

In one embodiment of the present invention, an analog circuit is used as hardware to perform a product-sum operation. In the case where an analog circuit is used as the product-sum operation circuit, the circuit scale of the product-sum operation circuit can be reduced, or higher processing speed and lower power consumption can be achieved by reduced frequency of access to a memory.

The product-sum operation circuit preferably has a structure including an OS transistor. An OS transistor is suitably used as a transistor included in an analog memory of the product-sum operation circuit because of its extremely low off-state current. Note that the product-sum operation circuit may be formed using both a Si transistor and an OS transistor.

This embodiment can be combined with any of the other embodiments and examples as appropriate.

Embodiment 2

In this embodiment, structure examples and the like of the imaging device of one embodiment of the present invention are described.

Figure 18A:
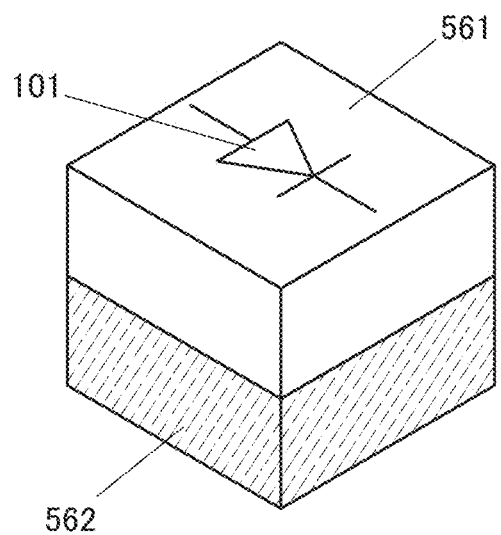
FIG. 18A and FIG. 18B are diagrams each illustrating a pixel structure of an imaging device.
Figure 18B:
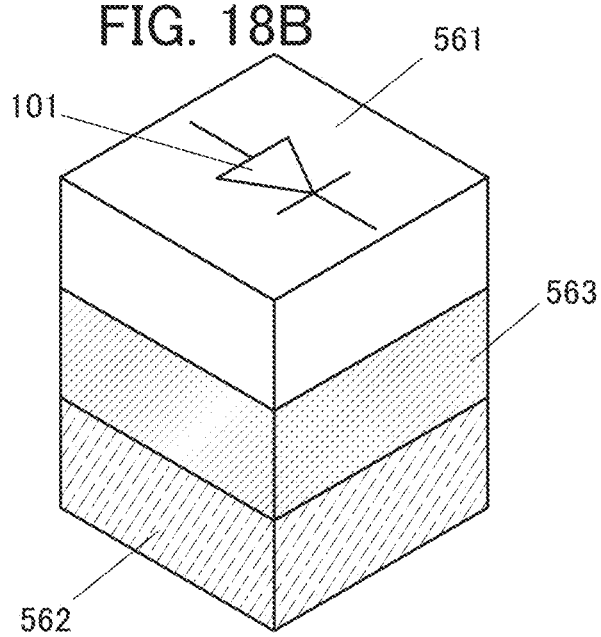

FIG. 18A and FIG. 18B illustrate examples of a structure of a pixel included in the imaging device. The pixel illustrated in FIG. 18A has a stacked-layer structure of a layer 561 and a layer 562, for example.

The layer 561 includes the photoelectric conversion device 101. The photoelectric conversion device 101 can have a stacked-layer structure of a layer 565a, a layer 565b, and a layer 565c as illustrated in FIG. 18C.

Figure 18C:
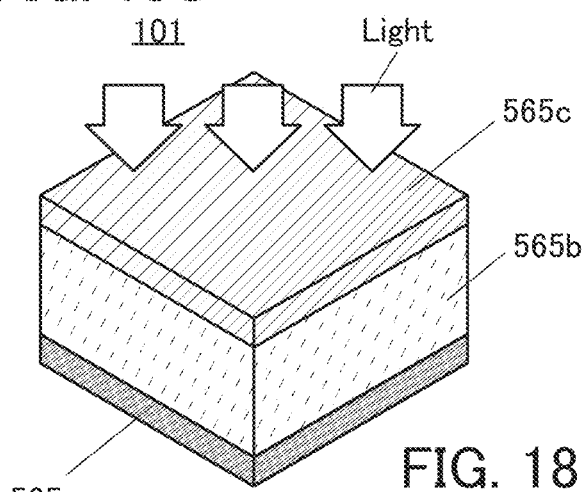
FIG. 18C to FIG. 18E are diagrams each illustrating a photoelectric conversion device.

The photoelectric conversion device 101 illustrated in FIG. 18C is a pn-junction photodiode; for example, a $p^+$-type semiconductor can be used for the layer 565a, an n-type semiconductor can be used for the layer 565b, and an $n^+$-type semiconductor can be used for the layer 565c. Alternatively, an $n^+$-type semiconductor may be used for the layer 565a, a p-type semiconductor may be used for the layer 565b, and a $p^+$-type semiconductor may be used for the layer 565c. Alternatively, a pin-junction photodiode in which the layer 565b is an i-type semiconductor may be used.

The pn-junction photodiode or the pin-junction photodiode can be formed using single crystal silicon. The pin-junction photodiode can also be formed using a thin film of amorphous silicon, microcrystalline silicon, polycrystalline silicon, or the like.

Figure 18D:
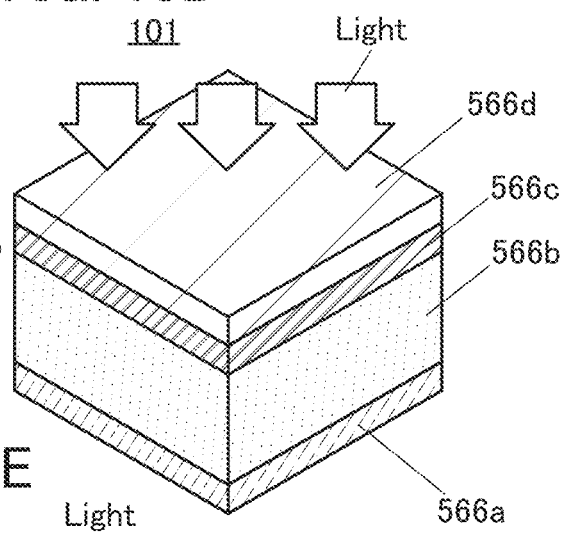

The photoelectric conversion device 101 included in the layer 561 may have a stacked-layer structure of a layer 566a, a layer 566b, a layer 566c, and a layer 566d as illustrated in FIG. 18D. The photoelectric conversion device 101 illustrated in FIG. 18D is an example of an avalanche photodiode, and the layer 566a and the layer 566d correspond to electrodes and the layers 566b and 566c correspond to a photoelectric conversion portion.

The layer 566a is preferably a low-resistance metal layer or the like. For example, aluminum, titanium, tungsten, tantalum, silver, or a stacked layer thereof can be used.

A conductive layer having a high light-transmitting property with respect to visible light is preferably used as the layer 566d. For example, indium oxide, tin oxide, zinc oxide, indium tin oxide, gallium zinc oxide, indium gallium zinc oxide, graphene, or the like can be used. Note that a structure in which the layer 566d is omitted can also be employed.

A structure of a pn-junction photodiode containing a selenium-based material in a photoelectric conversion layer can be used for the layers 566b and 566c of the photoelectric conversion portion, for example. A selenium-based material, which is a p-type semiconductor, is preferably used for the layer 566b, and gallium oxide or the like, which is an n-type semiconductor, is preferably used for the layer 566c.

A photoelectric conversion device containing a selenium-based material has characteristics of high external quantum efficiency with respect to visible light. In the photoelectric conversion device, electrons are greatly amplified with respect to the amount of incident light (Light) by utilizing the avalanche multiplication. A selenium-based material has a high light-absorption coefficient and thus has advantages in production; for example, a photoelectric conversion layer can be formed using a thin film. A thin film of a selenium-based material can be formed by a vacuum evaporation method, a sputtering method, or the like.

As a selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor is preferably formed using a material with a wide band gap and a light-transmitting property with respect to visible light. For example, zinc oxide, gallium oxide, indium oxide, tin oxide, or mixed oxide thereof can be used. In addition, these materials have a function of a hole-injection blocking layer, so that a dark current can be decreased.

Figure 18E:
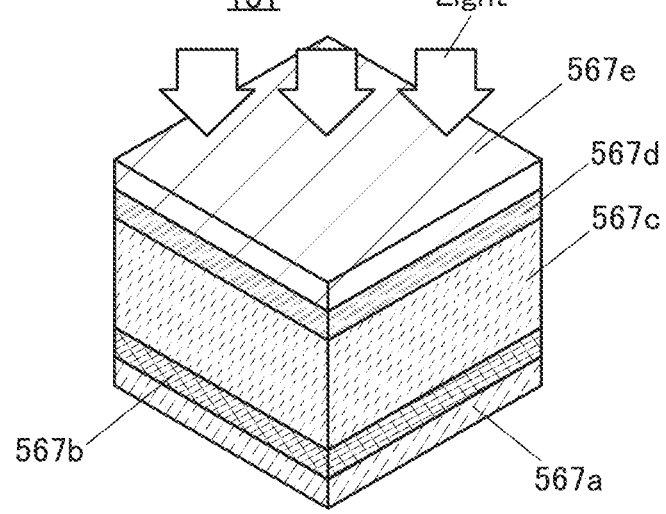

The photoelectric conversion device 101 included in the layer 561 may have a stacked-layer structure of a layer 567a, a layer 567b, a layer 567c, a layer 567d, and a layer 567e as illustrated in FIG. 18E. The photoelectric conversion device 101 illustrated in FIG. 18E is an example of an organic optical conductive film, and the layer 567a and the layer 567e correspond to electrodes and the layers 567b, 567c, and 567d correspond to a photoelectric conversion portion.

One of the layers 567b and 567d in the photoelectric conversion portion can be a hole-transport layer and the other can be an electron-transport layer. The layer 567c can be a photoelectric conversion layer.

For the hole-transport layer, molybdenum oxide can be used, for example. For the electron-transport layer, fullerene such as C60 or C70, or a derivative thereof can be used, for example.

As the photoelectric conversion layer, a mixed layer of an n-type organic semiconductor and a p-type organic semiconductor (bulk heterojunction structure) can be used.

For the layer 562 illustrated in FIG. 18A, a silicon substrate can be used, for example. The silicon substrate includes a Si transistor or the like. With the use of the Si transistor, as well as a pixel circuit, a circuit for driving the pixel circuit, a circuit for reading out an image signal, an image processing circuit, a memory circuit, or the like can be provided. Specifically, some or all of the transistors included in the pixel circuits and the peripheral circuits (the pixels 100, the circuits 201, 301, 302, 303, 304, and 305, and the like) described in Embodiment 1 can be provided in the layer 562.

Furthermore, the pixel may have a stacked-layer structure of the layer 561, a layer 563, and the layer 562 as illustrated in FIG. 18B.

The layer 563 can include an OS transistor. In that case, the layer 562 may include a Si transistor. Furthermore, some of the transistors included in the peripheral circuits described in Embodiment 1 may be provided in the layer 563.

With such a structure, components of the pixel circuit and the peripheral circuits can be distributed in a plurality of layers and the components can be provided to overlap with each other or any of the components and any of the peripheral circuits can be provided to overlap with each other, whereby the area of the imaging device can be reduced. Note that in the structure of FIG. 18B, the layer 562 may be a support substrate, and the pixels 100 and the peripheral circuits may be provided in the layer 561 and the layer 563.

As a semiconductor material used for an OS transistor, a metal oxide whose energy gap is greater than or equal to 2 eV, preferably greater than or equal to 2.5 eV, further preferably greater than or equal to 3 eV can be used. A typical example thereof is an oxide semiconductor containing indium, and a CAAC-OS (C-Axis Aligned Crystalline Oxide Semiconductor), a CAC (Cloud-Aligned Composite)-OS, each of which will be described later, or the like can be used, for example. A CAAC-OS has a crystal structure including stable atoms and is suitable for a transistor that is required to have high reliability, and the like. A CAC-OS has high mobility and is suitable for a transistor that operates at high speed, and the like.

In an OS transistor, a semiconductor layer has a large energy gap, and thus the OS transistor has an extremely low off-state current of several yoctoamperes per micrometer (current per micrometer of a channel width). An OS transistor has features such that impact ionization, an avalanche breakdown, a short-channel effect, or the like does not occur, which are different from those of a Si transistor. Thus, the use of an OS transistor enables formation of a circuit having high withstand voltage and high reliability. Moreover, variations in electrical characteristics due to crystallinity unevenness, which are caused in the Si transistor, are less likely to occur in OS transistors.

A semiconductor layer in an OS transistor can be, for example, a film represented by an In-M-Zn-based oxide that contains indium, zinc, and M (one or more metals selected from aluminum, titanium, gallium, germanium, yttrium, zirconium, lanthanum, cerium, tin, neodymium, and hafnium). The In-M-Zn-based oxide can be typically formed by a sputtering method. Alternatively, the In-M-Zn-based oxide may be formed by an ALD (Atomic layer deposition) method.

It is preferable that the atomic ratio of metal elements of a sputtering target used for forming the In-M-Zn-based oxide by a sputtering method satisfy In ≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer may vary from the above atomic ratio of metal elements in the sputtering target in a range of ±40%.

An oxide semiconductor with low carrier density is used for the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has a low density of defect states and can thus be referred to as an oxide semiconductor having stable characteristics.

Note that the composition is not limited to those described above, and a material having the appropriate composition may be used depending on required semiconductor characteristics and electrical characteristics of the transistor (e.g., field-effect mobility and threshold voltage). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (the concentration obtained by secondary ion mass spectrometry) in the semiconductor layer is set to lower than or equal to $2\times10^{18}$ atoms/cm³, preferably lower than or equal to $2\times10^{17}$ atoms/cm³.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (the concentration obtained by secondary ion mass spectrometry) is set to lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the nitrogen concentration (the concentration obtained by secondary ion mass spectrometry) in the semiconductor layer is preferably set to lower than or equal to $5\times10^{18}$ atoms/cm$^3$.

When hydrogen is contained in the oxide semiconductor contained in the semiconductor layer, hydrogen reacts with oxygen bonded to a metal atom to be water, and thus sometimes forms oxygen vacancies in the oxide semiconductor. When the channel formation region in the oxide semiconductor includes oxygen vacancies, the transistor sometimes has normally-on characteristics. In some cases, a defect in which hydrogen enters oxygen vacancies functions as a donor and generates electrons serving as carriers. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen enters oxygen vacancies can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is obtained by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with sufficiently reduced impurities such as hydrogen is used for a channel formation region of a transistor, stable electrical characteristics can be given.

The semiconductor layer may have a non-single-crystal structure, for example. Examples of the non-single-crystal structure include CAAC-OS (C-Axis Aligned Crystalline Oxide Semiconductor) including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide semiconductor film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

A CAC-OS refers to one composition of a material in which elements constituting an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. It is particularly preferable that indium and zinc be contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite oxide semiconductor having a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by InGaO$_3$(ZnO)$_{m1}$ (m1 is a natural number) or In$_{(1+x0)}$Ga$_{(1-x0)}$O$_3$(ZnO)$_{m0}$ (−1≤x0≤1; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

On the other hand, the CAC-OS relates to the material composition of an oxide semiconductor. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction measurement that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, in the CAC-OS, the region including $GaO_{X3}$ or the like as a main component and the region including $In_{X2}Zn_{Y2}O_{Z2}$ or $InO_{X1}$ as a main component are separated to form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{X2}$ or $InO_{X1}$ as a main component are distributed in an oxide semiconductor like a cloud, high field-effect mobility (μ) can be achieved.

By contrast, a region including $GaO_{X3}$ or the like as a main component is a region whose insulating property is higher than that of a region including $In_{X2}Zn_{Y2}O_{Z2}$ or $InO_{X1}$ as a main component. In other words, when the regions including $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{X2}$ or $InO_{X1}$ complement each other, whereby a high on-state current (Ion) and high field-effect mobility (μ) can be achieved.

A semiconductor element using the CAC-OS has high reliability. Thus, the CAC-OS is suitably used as a constituent material of a variety of semiconductor devices.

Note that the layer 563 may include a Si transistor. For example, a component included in the pixel circuit can be provided in the layer 563. Furthermore, a circuit for driving the pixel circuit, a circuit for reading out an image signal, an image processing circuit, a memory circuit, or the like can be provided in the layer 562.

In this case, the layer 562 and the layer 563 form a stack structure of layers including Si transistors. In addition, when a pn-junction photodiode with silicon for a photoelectric conversion layer is used for the layer 561, all of the layers can be formed using Si devices.

Figure 19A:
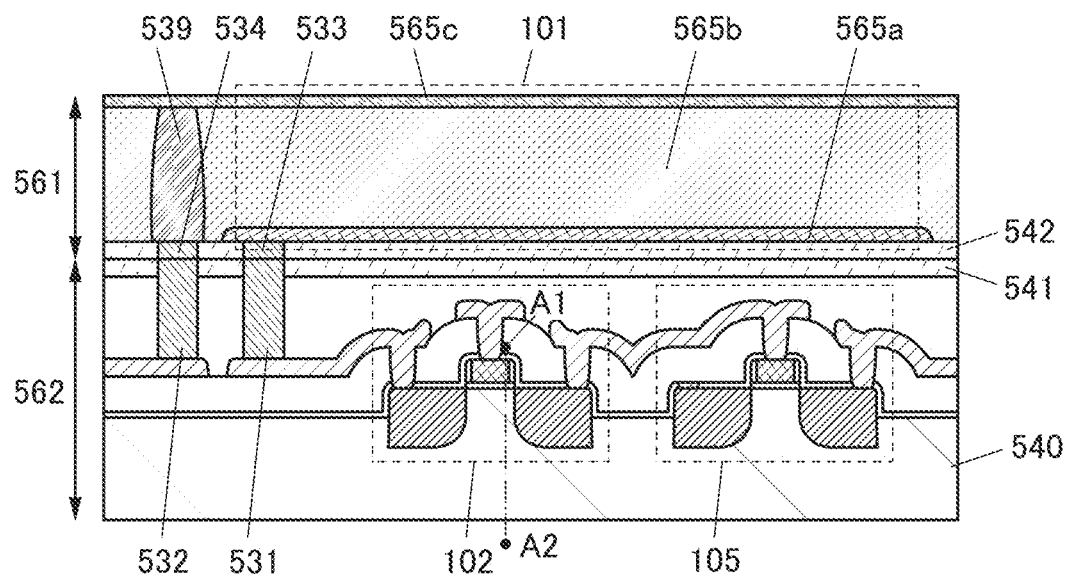
FIG. 19A and FIG. 19B are diagrams each illustrating a pixel structure of an imaging device.

FIG. 19A is a diagram illustrating an example of a cross section of the pixel illustrated in FIG. 18A. The layer 561 includes a pn-junction photodiode with silicon for a photoelectric conversion layer, as the photoelectric conversion device 101. The layer 562 includes Si transistors, and the transistors 102 and 105 included in the pixel circuit are shown as examples in FIG. 19A.

In the photoelectric conversion device 101, the layer 565a can be a p$^+$-type region, the layer 565b can be an n-type region, and the layer 565c can be an n$^+$-type region. The layer 565b is provided with a region 539 for connecting a power supply line to the layer 565c. For example, the region 539 can be a p$^+$-type region.

Figure 20A:
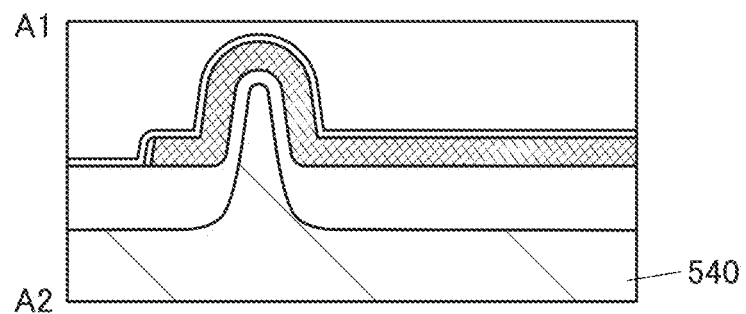
FIG. 20A to FIG. 20C are diagrams each illustrating a transistor.
Figure 20B:
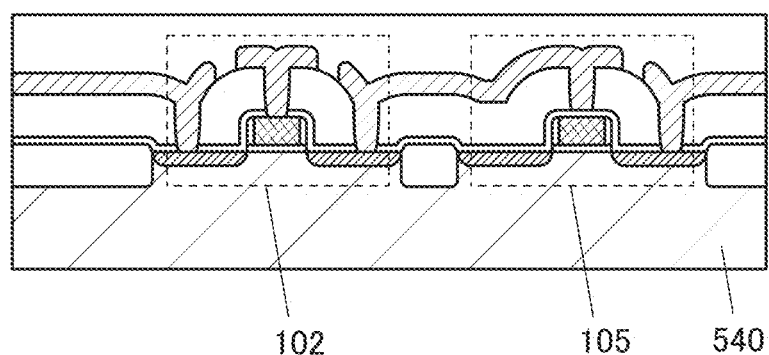

The Si transistors illustrated in FIG. 19A each have a fin-type structure including a channel formation region in a silicon substrate 540, and FIG. 20A shows a cross section (an A1-A2 cross section in FIG. 19A) in the channel width direction. The Si transistors may each have a planar-type structure as illustrated in FIG. 20B.

Figure 20C:
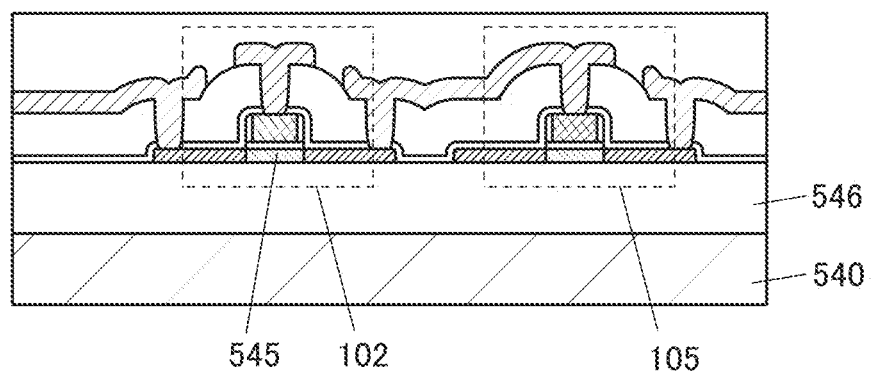

Alternatively, as illustrated in FIG. 20C, transistors each including a semiconductor layer 545 of a silicon thin film may be used. The semiconductor layer 545 can be single crystal silicon (SOI (Silicon on Insulator)) formed on an insulating layer 546 on the silicon substrate 540, for example.

FIG. 19A illustrates an example of a structure in which electrical connection between components included in the layer 561 and components included in the layer 562 is obtained by a bonding technique.

An insulating layer 542, a conductive layer 533, and a conductive layer 534 are provided in the layer 561. The conductive layer 533 and the conductive layer 534 each include a region embedded in the insulating layer 542. The conductive layer 533 is electrically connected to the layer 565a. The conductive layer 534 is electrically connected to the region 539. Furthermore, the surfaces of the insulating layer 542, the conductive layer 533, and the conductive layer 534 are planarized to have the same level.

An insulating layer 541, a conductive layer 531, and a conductive layer 532 are provided in the layer 562. The conductive layer 531 and the conductive layer 532 each include a region embedded in the insulating layer 541. The conductive layer 531 is electrically connected to a power supply line. The conductive layer 531 is electrically connected to the source or the drain of the transistor 102. Furthermore, the surfaces of the insulating layer 541, the conductive layer 531, and the conductive layer 532 are planarized to have the same level.

Here, main components of the conductive layer 531 and the conductive layer 533 are preferably the same metal element. Main components of the conductive layer 532 and the conductive layer 534 are preferably the same metal element. Furthermore, it is preferable that the insulating layer 541 and the insulating layer 542 be formed of the same component.

For example, for the conductive layers 531, 532, 533, and 534, Cu, Al, Sn, Zn, W, Ag, Pt, Au, or the like can be used. Preferably, Cu, Al, W, or Au is used for easy bonding. In addition, for the insulating layers 541 and 542, silicon oxide, silicon oxynitride, silicon nitride oxide, silicon nitride, titanium nitride, or the like can be used.

That is, the same metal material selected from the above is preferably used for the combination of the conductive layer 531 and the conductive layer 533, and the same metal material selected from the above is preferably used for the combination of the conductive layer 532 and the conductive layer 534. Furthermore, the same insulating material selected from the above is preferably used for the insulating layer 541 and the insulating layer 542. With this structure, bonding where a boundary between the layer 561 and the layer 562 is a bonding position can be performed.

This bonding enables electrical connection between the combination of the conductive layer 531 and the conductive layer 533 and between the combination of the conductive layer 532 and the conductive layer 534. In addition, connection between the insulating layer 541 and the insulating layer 542 with mechanical strength can be obtained.

For bonding the metal layers to each other, a surface activated bonding method in which an oxide film, a layer adsorbing impurities, and the like on the surface are removed by sputtering or the like and the cleaned and activated surfaces are brought into contact to be bonded to each other can be used. Alternatively, a diffusion bonding method in which the surfaces are bonded to each other by using temperature and pressure together can be used, for example. Both methods cause bonding at an atomic level, and therefore not only electrically but also mechanically excellent bonding can be obtained.

Furthermore, for bonding the insulating layers to each other, a hydrophilic bonding method or the like can be used; in the method, after high planarity is obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained.

When the layer 561 and the layer 562 are bonded to each other, the insulating layers and the metal layers coexist on their bonding surfaces; therefore, the surface activated bonding method and the hydrophilic bonding method are performed in combination, for example.

For example, a method can be used in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

Figure 19B:
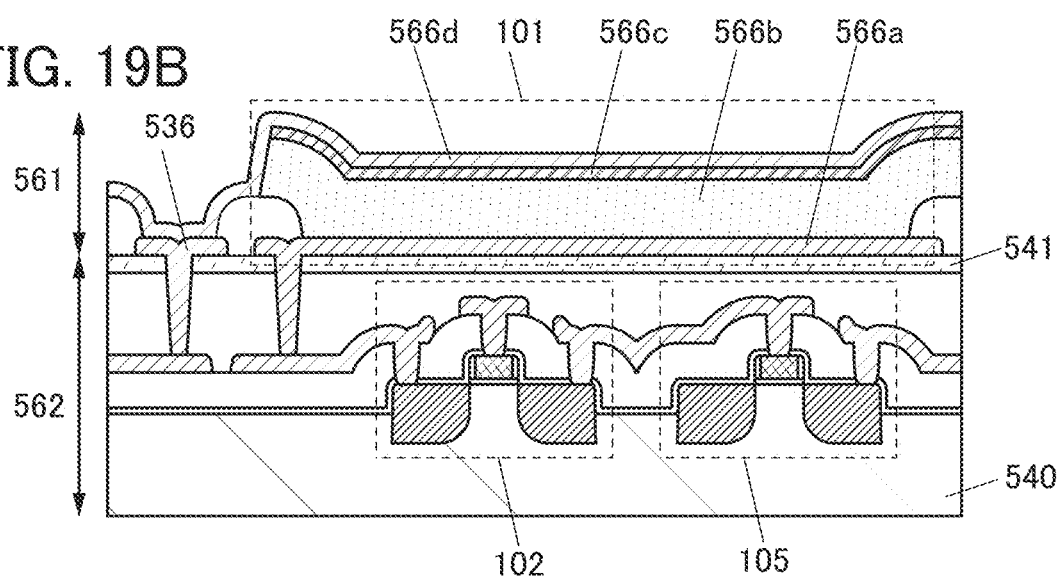

FIG. 19B is a cross-sectional view in the case where a pn-junction photodiode in which a selenium-based material is used for a photoelectric conversion layer is used for the layer 561 of the pixel illustrated in FIG. 18A. The layer 566a is included as one electrode, the layers 566b and 566c are included as a photoelectric conversion layer, and the layer 566d is included as the other electrode.

In this case, the layer 561 can be directly formed on the layer 562. The layer 566a is electrically connected to the source or the drain of the transistor 102. The layer 566d is electrically connected to the power supply line through the conductive layer 536. Note that in the case where an organic optical conductive film is used for the layer 561, the connection mode with the transistor is the same as the above.

Figure 21A:
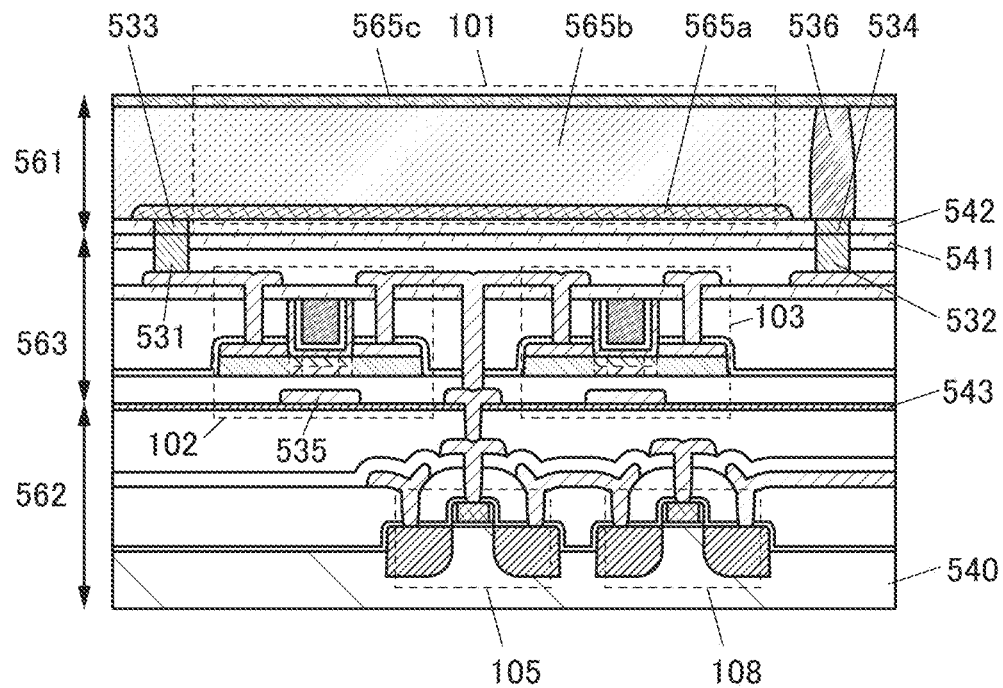
FIG. 21A and FIG. 21B are diagrams each illustrating a pixel structure of an imaging device.

FIG. 21A is a diagram illustrating an example of a cross section of the pixel illustrated in FIG. 18B. The layer 561 includes a pn-junction photodiode with silicon for a photoelectric conversion layer, as the photoelectric conversion device 101. The layer 562 includes Si transistors, and the transistors 105 and 108 included in the pixel circuit are shown as examples in FIG. 21A. The layer 563 includes OS transistors, and the transistors 102 and 103 included in the pixel circuit are illustrated as examples. A structure example is illustrated in which electrical connection between the layer 561 and the layer 563 is obtained by bonding.

Figure 22A:
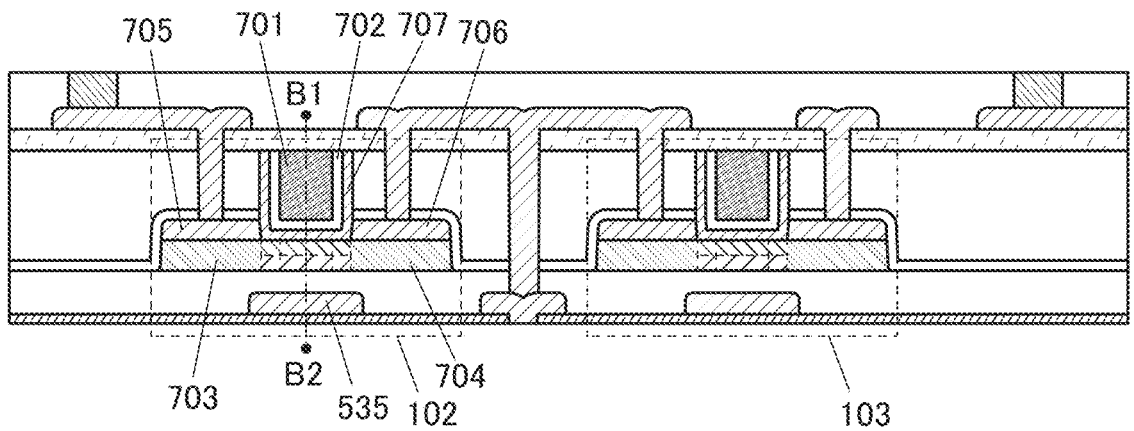
FIG. 22A to FIG. 22D are diagrams each illustrating a transistor.

The details of an OS transistor are illustrated in FIG. 22A. The OS transistor illustrated in FIG. 22A has a self-aligned structure in which a source electrode 705 and a drain electrode 706 are formed through provision of an insulating layer over a stacked layer of an oxide semiconductor layer and a conductive layer and provision of opening portions reaching the semiconductor layer.

The OS transistor can include a gate electrode 701 and a gate insulating film 702 in addition to a channel formation region, a source region 703, and a drain region 704, which are formed in the oxide semiconductor layer. At least the gate insulating film 702 and the gate electrode 701 are provided in the opening portion. The opening portion may further be provided with an oxide semiconductor layer 707.

Figure 22B:
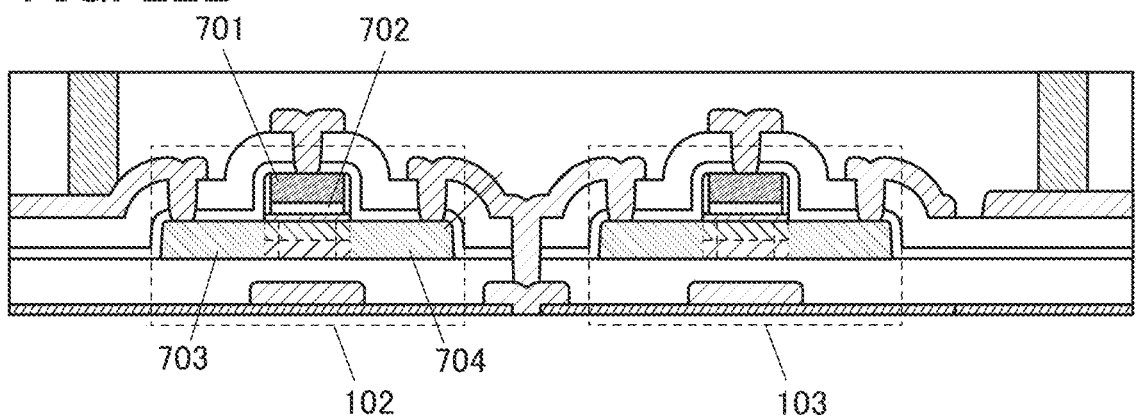

As illustrated in FIG. 22B, the OS transistor may have a self-aligned structure in which the source region and the drain region are formed in the semiconductor layer with the gate electrode 701 as a mask.

Figure 22C:
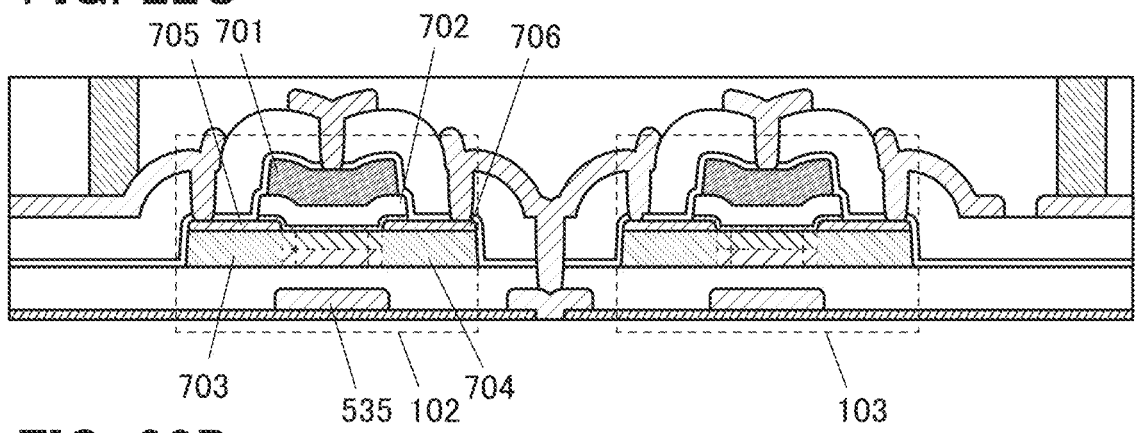

As illustrated in FIG. 22C, the OS transistor may be a non-self-aligned top-gate transistor including a region where the source electrode 705 or the drain electrode 706 overlaps with the gate electrode 701.

Figure 22D:
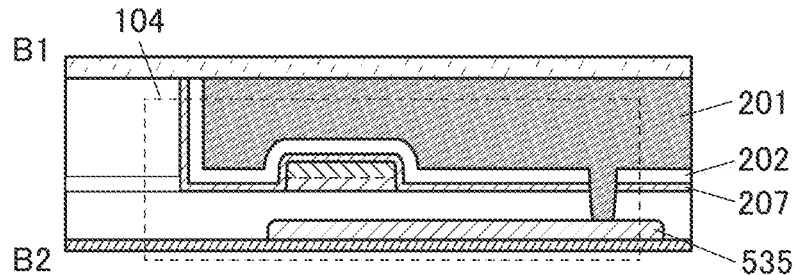

Although the transistors 102 and 103 each have a structure with a back gate 535, they may have a structure without a back gate. As illustrated in a cross-sectional view of the transistor in the channel width direction in FIG. 22D, the back gate 535 may be electrically connected to a front gate of the transistor, which is provided to face the back gate. Note that FIG. 22D illustrates an example of a B1-B2 cross section of the transistor in FIG. 22A, and the same applies to a transistor having any of the other structures. Different fixed potentials may be supplied to the back gate 535 and the front gate.

An insulating layer 543 that has a function of inhibiting diffusion of hydrogen is provided between a region where OS transistors are formed and a region where Si transistors are formed. Hydrogen in the insulating layer provided in the vicinity of the channel formation region of each of the transistors 105 and 108 terminates a dangling bond of silicon. Meanwhile, hydrogen in the insulating layer provided in the vicinity of the channel formation region of each of the transistors 102 and 103 is a factor of generating a carrier in the oxide semiconductor layer.

Hydrogen is confined in one layer using the insulating layer 543, whereby the reliability of the transistors 105 and 108 can be improved. Furthermore, diffusion of hydrogen from the one layer to the other layer is inhibited, so that the reliability of the transistors 102 and 103 can also be improved.

For the insulating layer 543, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like can be used, for example.

Figure 21B:
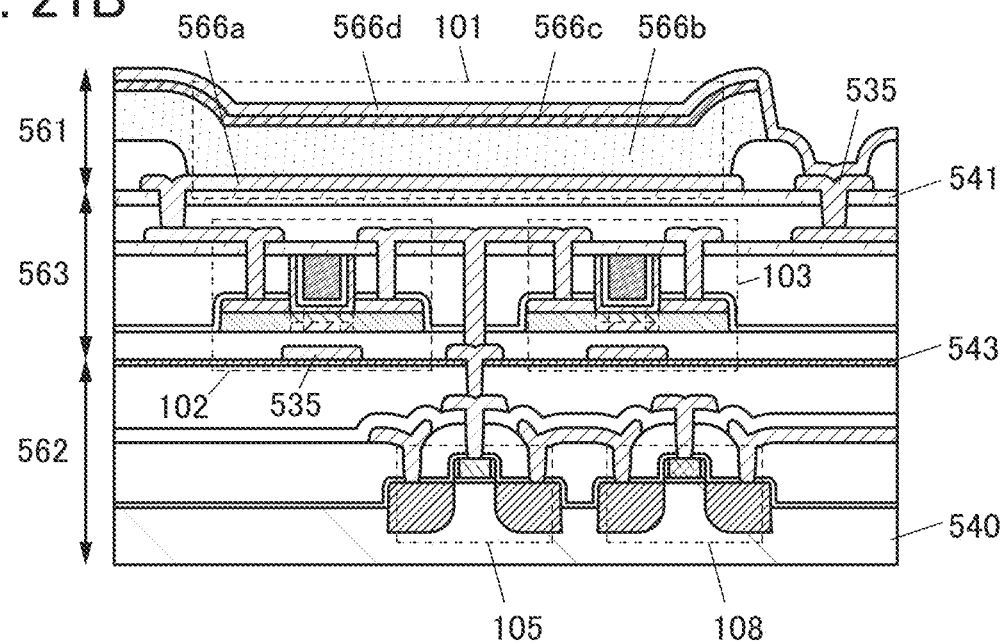

FIG. 21B is a cross-sectional view in the case where a pn-junction photodiode in which a selenium-based material is used for a photoelectric conversion layer is used for the layer 561 of the pixel illustrated in FIG. 18B. The layer 561 can be directly formed on the layer 563. The above description can be referred to for the details of the layers 561, 562, and 563. Note that in the case where an organic optical conductive film is used for the layer 561, the connection mode with the transistor is the same as the above.

Figure 23:
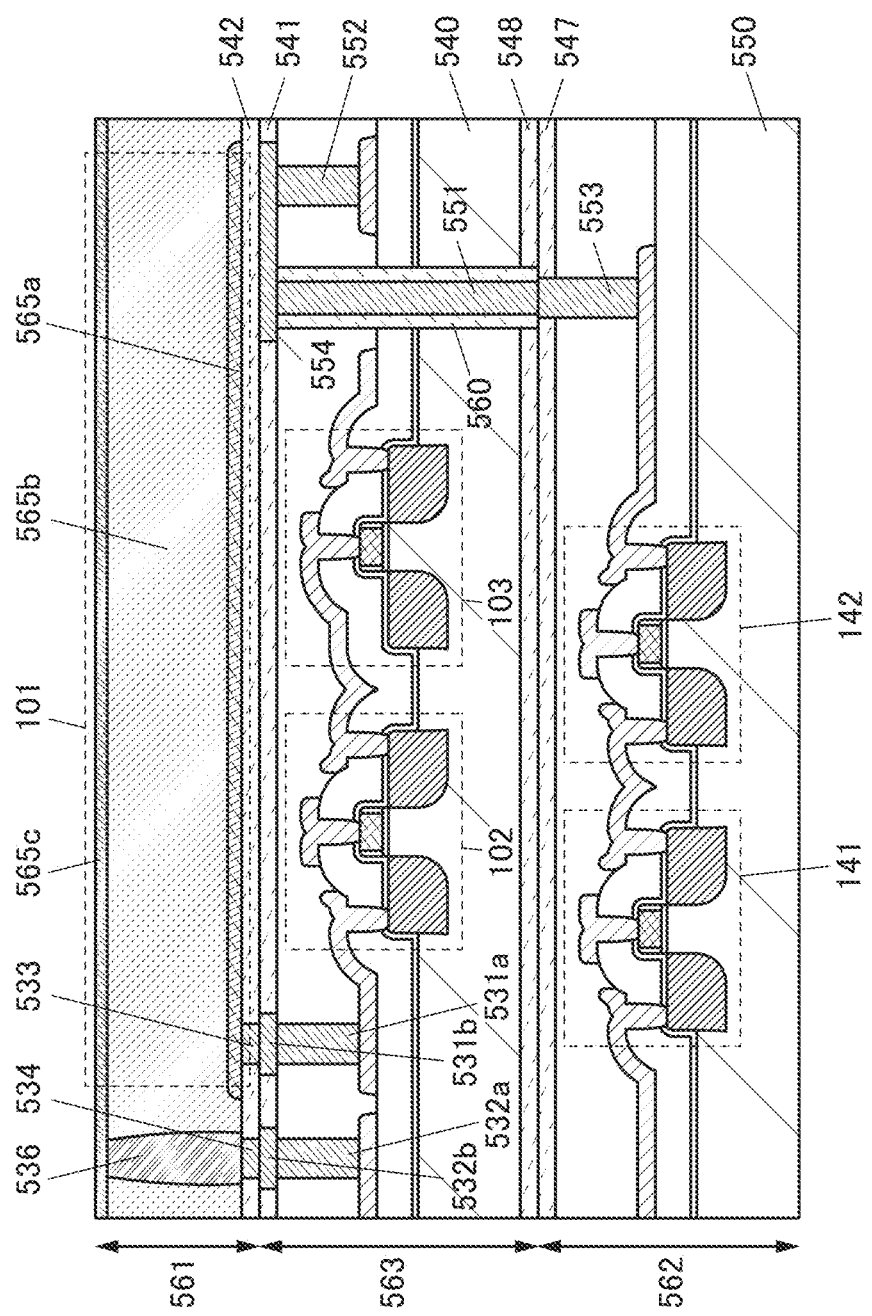
FIG. 23 is a diagram illustrating a pixel structure of an imaging device.

FIG. 23 is a diagram illustrating an example of the pixel illustrated in FIG. 18B, which is different from FIG. 21A. In a structure illustrated in FIG. 23, Si devices are provided in all of the layer 561, the layer 563, and the layer 562, and the layers are attached to each other by bonding.

The layer 561 includes a pn-junction photodiode with silicon for a photoelectric conversion layer, as the photoelectric conversion device 101.

The layer 563 includes Si transistors provided on the silicon substrate 540. The transistors 102 and 103 illustrated as examples in FIG. 23 are some components of the pixel circuit.

The layer 562 includes Si transistors provided on a silicon substrate 550. Transistors 141 and 142 illustrated as examples in FIG. 23 are some components of a circuit electrically connected to the pixel circuit.

A conductive layer 531b, a conductive layer 532b, and a conductive layer 554 are embedded in the insulating layer 541 provided in the layer 563. The conductive layer 531b, the conductive layer 532b, and the conductive layer 554 are planarized to be level with the insulating layer 541.

The conductive layer 531b is electrically connected to the conductive layer 531a. The conductive layer 531a and the conductive layer 531b each have a function equivalent to that of the conductive layer 531 in the structure of FIG. 19A. The conductive layer 531a and the conductive layer 531b can be formed using the same material as that of the conductive layer 531. The conductive layer 531b is electrically connected to the conductive layer 533 included in the layer 561 by bonding.

The conductive layer 532b is electrically connected to the conductive layer 532a. The conductive layer 532a and the conductive layer 532b each have a function equivalent to that of the conductive layer 532 in the structure of FIG. 19A.

The conductive layer 532a and the conductive layer 532b can be formed using the same material as that of the conductive layer 532. The conductive layer 532b is electrically connected to the conductive layer 534 included in the layer 561 by bonding.

The conductive layer 554 is electrically connected to a conductive layer 551 and a conductive layer 552. The conductive layer 552 is electrically connected to a wiring connected to the pixel circuit included in the layer 563. The conductive layer 551 is electrically connected to the circuit included in the layer 562. The conductive layer 554, the conductive layer 551, and the conductive layer 552 can be formed using the same material as that of the conductive layer 531.

The conductive layer 551 includes a region embedded in the silicon substrate 540 and an insulating layer 548, and is planarized to be level with the insulating layer 548. Furthermore, the conductive layer 551 includes a region covered with an insulating layer 560 to be insulated from the silicon substrate 540.

A conductive layer 553 includes a region embedded in an insulating layer 547 provided in the layer 562, and is planarized to be level with the insulating layer 547. The conductive layer 553 is electrically connected to the circuit included in the layer 562. The conductive layer 553 can be formed using the same material as that of the conductive layer 531.

By bonding the insulating layer 548 included in the layer 563 and the insulating layer 547 included in the layer 562, the layer 563 and the layer 562 are attached to each other to have mechanical strength. Moreover, by bonding the conductive layer 551 included in the layer 563 and the conductive layer 553 included in the layer 562, the layer 563 and the layer 562 are electrically connected to each other.

Note that FIG. 23 illustrates the structure in which the conductive layer 554 and the conductive layer 553 are connected to each other through the conductive layer 551 passing through the silicon substrate 540; however, the structure is not limited thereto. For example, a structure may be employed in which the conductive layer 551 passing through the silicon substrate 540 is not provided and the conductive layer 554 and the conductive layer 553 are connected to each other in the outside of the silicon substrate 540.

In addition to the driver circuit of the pixel circuit, a memory circuit such as a DRAM (Dynamic Random Access Memory), a neural network, a communication circuit, or the like may be provided in the layer 562, for example. When any of the circuits is provided to overlap with the pixel circuit, delay can be reduced and imaging, image recognition, and the like can be performed at high speed.

Figure 24A:
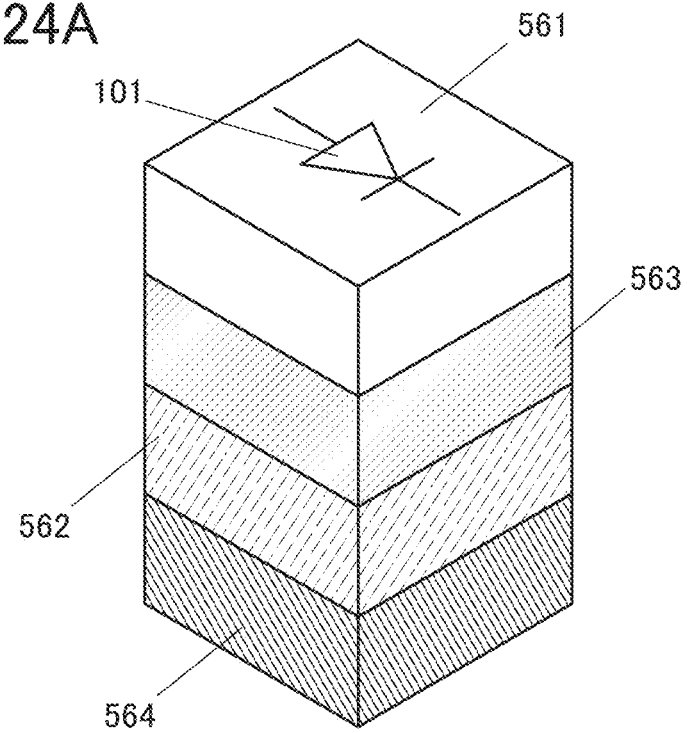
FIG. 24A and FIG. 24B are diagrams illustrating a pixel structure of an imaging device.
Figure 24B:
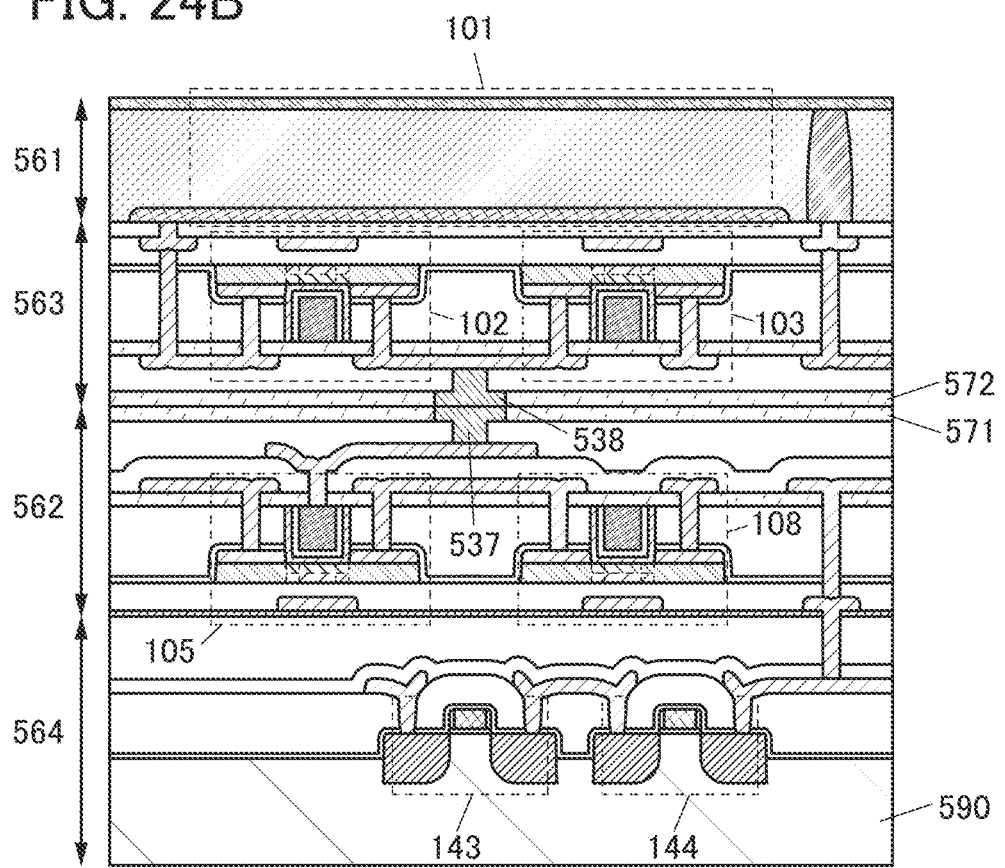

As illustrated in FIG. 24A, the pixel of one embodiment of the present invention may have a stacked-layer structure of the layer 561, the layer 563, the layer 562, and a layer 564. FIG. 24B is a cross-sectional view of an example of the stacked-layer structure.

The layer 561 includes a pn-junction photodiode with silicon for a photoelectric conversion layer, as the photoelectric conversion device 101. The layer 563 and the layer 562 include OS transistors. The layer 564 includes Si transistors 143 and 144 provided on a silicon substrate 590.

The OS transistors included in the layer 563 can be formed over the layer 561. A conductive layer 538 connected to the transistor 102 and the transistor 103 is embedded in an insulating layer 572 provide in the layer 563. The conductive layer 538 is planarized to be level with the insulating layer 572.

The OS transistors included in the layer 562 can be formed over the layer 564. A conductive layer 537 connected to the transistor 105 and the transistor 108 is embedded in an insulating layer 571 provided in the layer 562. The conductive layer 537 is planarized to be level with the insulating layer 571.

The conductive layer 537 and the conductive layer 538 can be formed using the same material as that of the conductive layer 531. The insulating layer 571 and the insulating layer 572 can be formed using the same material as that of the insulating layer 541.

By bonding the insulating layer 572 included in the layer 563 and the insulating layer 571 included in the layer 562, the layer 563 and the layer 562 are attached to each other to have mechanical strength. Moreover, by bonding the conductive layer 538 included in the layer 563 and the conductive layer 537 included in the layer 562, the layer 563 and the layer 562 are electrically connected to each other.

The structure illustrated in FIG. 24A and FIG. 24B is a four-layer structure (a layer including a Si photodiode \ a layer including OS transistors \ a layer including OS transistors \ a layer including Si transistors), which can be formed through one bonding step. An OS transistor can be formed to be stacked over a silicon substrate on which a device is formed, and thus a bonding step can be skipped.

Although an example in which both the layer 562 and the layer 563 include the transistors included in the pixel circuit is illustrated in FIG. 24B, the structure is not limited thereto and one of the layers may include a pixel circuit and the other may include a memory circuit, for example. Furthermore, in addition to the driver circuit of the pixel circuit, a memory circuit such as a DRAM (Dynamic Random Access Memory), a neural network, a communication circuit, a CPU, or the like may be provided in the layer 564, for example.

Furthermore, part of the circuit included in the layer 564 may be formed using OS transistors provided in the layer 563. Since an OS transistor has an extremely low off-state current, a data retention function of a circuit can be increased when the OS transistor is used as a transistor connected to a data retention portion. Accordingly, the frequency of refresh operation of a memory circuit can be reduced, which can reduce power consumption.

A normally-off CPU (also referred to as "Noff-CPU") can be formed using an OS transistor. Note that the Noff-CPU is an integrated circuit including a normally-off transistor, which is in a non-conduction state (also referred to as an off state) even when a gate voltage is 0 V.

In the Noff-CPU, power supply to a circuit that does not need to operate can be stopped so that the circuit can be brought into a standby state. The circuit brought into the standby state because of the stop of power supply does not consume power. Thus, the power usage of the Noff-CPU can be minimized. Moreover, the Noff-CPU can retain data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the Noff-CPU can have a reduced power consumption without a significant decrease in operation speed.

Figure 25A:
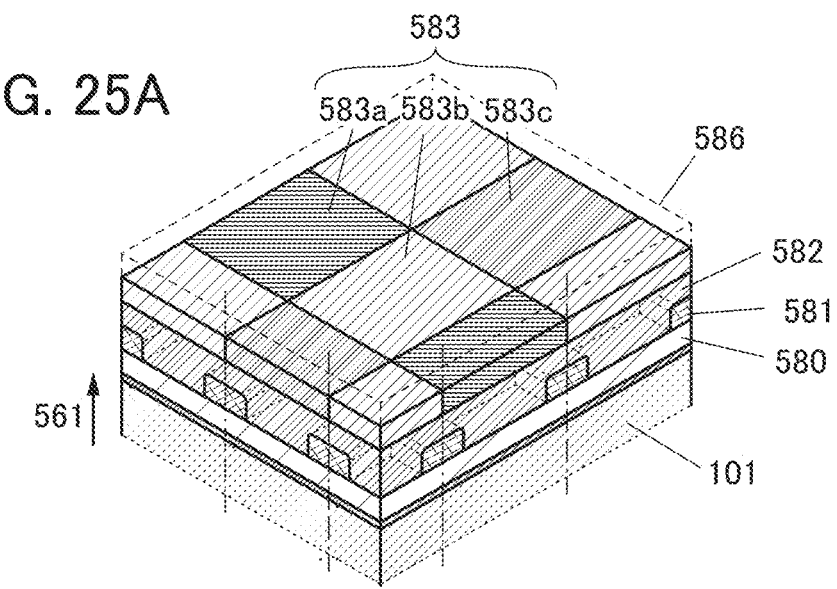
FIG. 25A to FIG. 25C are perspective views each illustrating a pixel structure of an imaging device.

FIG. 25A is a perspective view illustrating an example in which a color filter and the like are added to the pixel of the imaging device of one embodiment of the present invention. The perspective view also illustrates cross sections of a plurality of pixels. An insulating layer 580 is formed over the layer 561 where the photoelectric conversion device 101 is formed. As the insulating layer 580, a silicon oxide film with a high light-transmitting property with respect to visible light can be used, for example. In addition, a silicon nitride film may be stacked as a passivation film. A dielectric film of hafnium oxide or the like may be stacked as an anti-reflection film.

A light-blocking layer 581 may be formed over the insulating layer 580. The light-blocking layer 581 has a function of inhibiting color mixing of light passing through the upper color filter. As the light-blocking layer 581, a metal layer of aluminum, tungsten, or the like can be used. The metal layer and a dielectric film having a function of an anti-reflection film may be stacked.

An organic resin layer 582 can be provided as a planarization film over the insulating layer 580 and the light-blocking layer 581. A color filter 583 (color filters 583a, 583b, and 583c) is formed in each pixel. Color images can be obtained, for example, when colors of R (red), G (green), B (blue), Y (yellow), C (cyan), M (magenta), and the like are assigned to the color filters 583a, 583b, and 583c.

An insulating layer 586 having a light-transmitting property with respect to visible light can be provided over the color filter 583, for example.

Figure 25B:
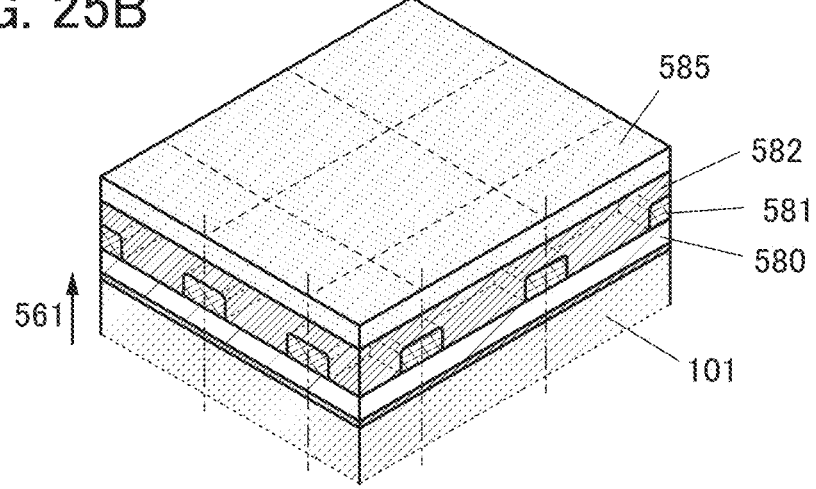

As illustrated in FIG. 25B, an optical conversion layer 585 may be used instead of the color filter 583. Such a structure enables the imaging device to obtain images in various wavelength regions.

For example, when a filter that blocks light having a wavelength shorter than or equal to that of visible light is used as the optical conversion layer 585, an infrared imaging device can be obtained. When a filter that blocks light having a wavelength shorter than or equal to that of near infrared light is used as the optical conversion layer 585, a far-infrared imaging device can be obtained. When a filter that blocks light having a wavelength longer than or equal to that of visible light is used as the optical conversion layer 585, an ultraviolet imaging device can be obtained.

Furthermore, when a scintillator is used as the optical conversion layer 585, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion device 101 detects the light to obtain image data. Furthermore, the imaging device having this structure may be used in a radiation detector or the like.

A scintillator contains a substance that, when irradiated with radiation such as X-rays or gamma-rays, absorbs energy of the radiation to emit visible light or ultraviolet light. For example, a resin or ceramics in which $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, ZnO, or the like is dispersed can be used.

In the photoelectric conversion device 101 containing a selenium-based material, radiation such as X-rays can be directly converted into charge; thus, a structure that does not require a scintillator can be employed.

Figure 25C:
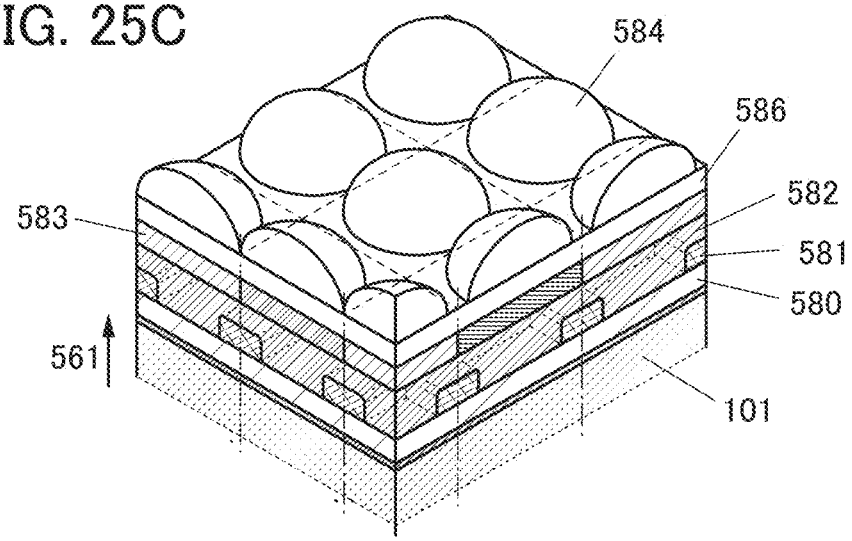

As illustrated in FIG. 25C, a microlens array 584 may be provided over the color filter 583. Light passing through an individual lens of the microlens array 584 goes through the color filter 583 directly under the lens, and the photoelectric conversion device 101 is irradiated with the light. The microlens array 584 may be provided over the optical conversion layer 585 illustrated in FIG. 25B.

Examples of a package and a camera module in each of which an image sensor chip is placed will be described below. For the image sensor chip, the structure of the above imaging device can be used.

FIG. 26A1 is an external perspective view of the top surface side of a package in which an image sensor chip is placed. The package includes a package substrate 410 to which an image sensor chip 450 (see FIG. 26A3) is fixed, a cover glass 420, an adhesive 430 for bonding them, and the like.

FIG. 26A2 is an external perspective view of the bottom surface side of the package. A BGA (Ball grid array) in which solder balls are used as bumps 440 on the bottom surface of the package is employed. Note that, without being limited to the BGA, an LGA (Land grid array), a PGA (Pin Grid Array), or the like may be employed.

FIG. 26A3 is a perspective view of the package, in which parts of the cover glass 420 and the adhesive 430 are not illustrated. Electrode pads 460 are formed over the package substrate 410, and the electrode pads 460 and the bumps 440 are electrically connected to each other via through-holes. The electrode pads 460 are electrically connected to the image sensor chip 450 through wires 470.

FIG. 26B1 is an external perspective view of the top surface side of a camera module in which an image sensor chip is placed in a package with a built-in lens. The camera module includes a package substrate 411 to which an image sensor chip 451 is fixed, a lens cover 421, a lens 435, and the like. Furthermore, an IC chip 490 (see FIG. 26B3) having functions of a driver circuit, a signal conversion circuit, and the like of the imaging device is provided between the package substrate 411 and the image sensor chip 451 (see FIG. 26B3); thus, the structure as an SiP (System in package) is included.

FIG. 26B2 is an external perspective view of the bottom surface side of the camera module. A QFN (Quad flat no-lead package) structure in which lands 441 for mounting are provided on the bottom surface and side surfaces of the package substrate 411 is employed. Note that this structure is only an example, and a QFP (Quad flat package) or the above-mentioned BGA may also be provided.

FIG. 26B3 is a perspective view of the module, in which parts of the lens cover 421 and the lens 435 are not illustrated. The lands 441 are electrically connected to electrode pads 461, and the electrode pads 461 are electrically connected to the image sensor chip 451 or the IC chip 490 through wires 471.

The image sensor chip placed in a package having the above form can be easily mounted on a printed substrate or the like, and the image sensor chip can be incorporated into a variety of semiconductor devices and electronic devices.

This embodiment can be combined with any of the other embodiments and examples as appropriate.

Embodiment 3

As electronic devices that can include the imaging device of one embodiment of the present invention, display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. Specific examples of these electronic devices are illustrated in FIG. 27A to FIG. 27F.

Figure 27A:
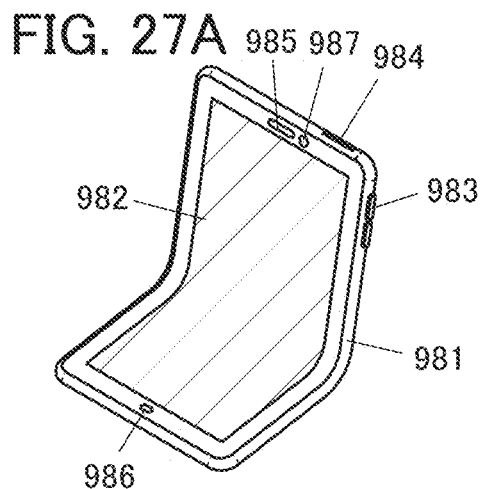
FIG. 27A to FIG. 27F are diagrams illustrating electronic devices.

FIG. 27A is an example of a mobile phone, which includes a housing 981, a display portion 982, an operation button 983, an external connection port 984, a speaker 985, a microphone 986, a camera 987, and the like. The display portion 982 of the mobile phone includes a touch sensor. A variety of operations such as making a call and inputting text can be performed by touch on the display portion 982 with a finger, a stylus, or the like. The imaging device of one embodiment of the present invention and the operation method thereof can be used for obtaining an image in the mobile phone.

Figure 27B:
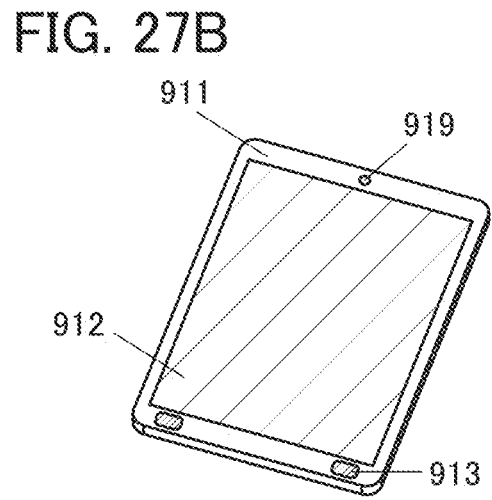

FIG. 27B is a portable data terminal, which includes a housing 911, a display portion 912, a speaker 913, a camera 919, and the like. A touch panel function of the display portion 912 enables input and output of information. Furthermore, a character or the like in an image that is captured by the camera 919 can be recognized and the character can be voice-output from the speaker 913. The imaging device of one embodiment of the present invention and the operation method thereof can be used for obtaining an image in the portable data terminal.

Figure 27C:
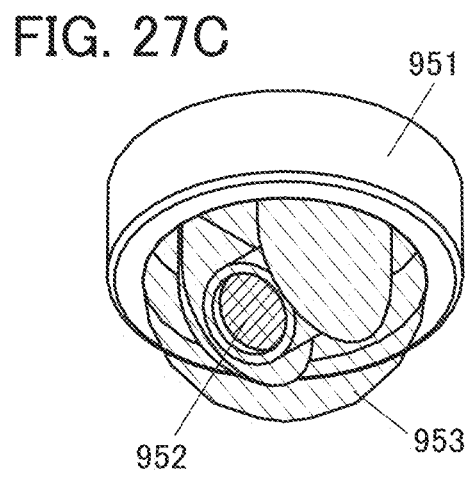

FIG. 27C is a surveillance camera, which includes a support base 951, a camera unit 952, a protection cover 953, and the like. By providing the camera unit 952 provided with a rotating mechanism and the like on a ceiling, an image of all of the surroundings can be taken. The imaging device of one embodiment of the present invention and the operation method thereof can be used for obtaining an image in the camera unit. Note that a surveillance camera is a name in common use and does not limit the use thereof. A device that has a function of a surveillance camera can also be called a camera or a video camera, for example.

Figure 27D:
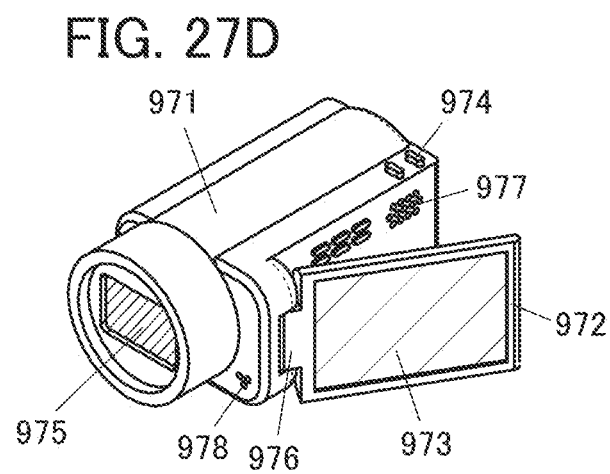

FIG. 27D is a video camera, which includes a first housing 971, a second housing 972, a display portion 973, an operation key 974, a lens 975, a connection portion 976, a speaker 977, a microphone 978, and the like. The operation key 974 and the lens 975 are provided for the first housing 971, and the display portion 973 is provided for the second housing 972. The imaging device of one embodiment of the present invention and the operation method thereof can be used for obtaining an image in the video camera.

Figure 27E:
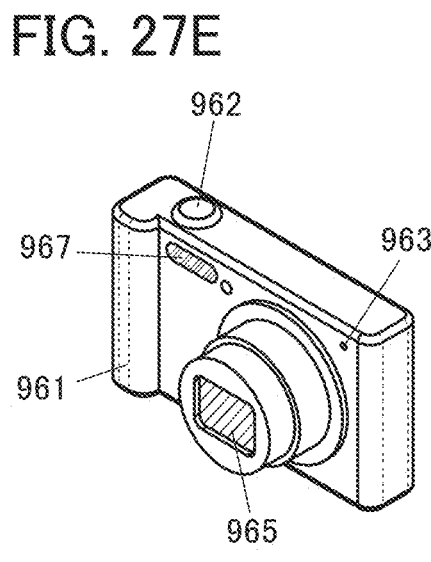

FIG. 27E is a digital camera, which includes a housing 961, a shutter button 962, a microphone 963, a light-emitting portion 967, a lens 965, and the like. The imaging device of one embodiment of the present invention and the operation method thereof can be used for obtaining an image in the digital camera.

Figure 27F:
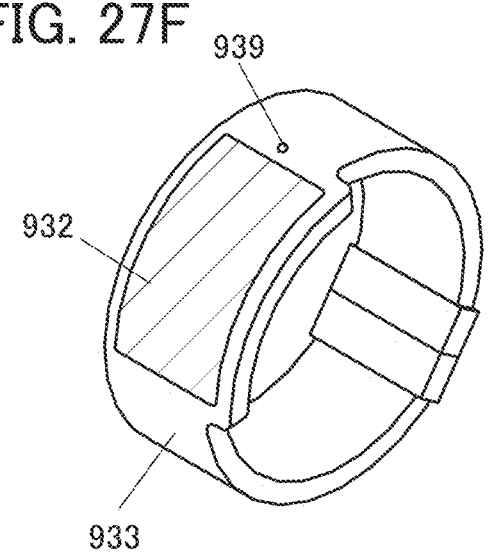

FIG. 27F is a wrist-watch-type information terminal, which includes a display portion 932, a housing and wristband 933, a camera 939, and the like. The display portion 932 is provided with a touch panel for performing the operation of the information terminal. The display portion 932 and the housing and wristband 933 have flexibility and fit a body well. The imaging device of one embodiment of the present invention and the operation method thereof can be used for obtaining an image in the information terminal.

This embodiment can be combined with any of the other embodiments and examples as appropriate.

Example 1

In this example, an imaging device having the structure of one embodiment of the present invention described in Embodiment 1 was prototyped. Results of image processing in the imaging device will be described.

Figure 28:
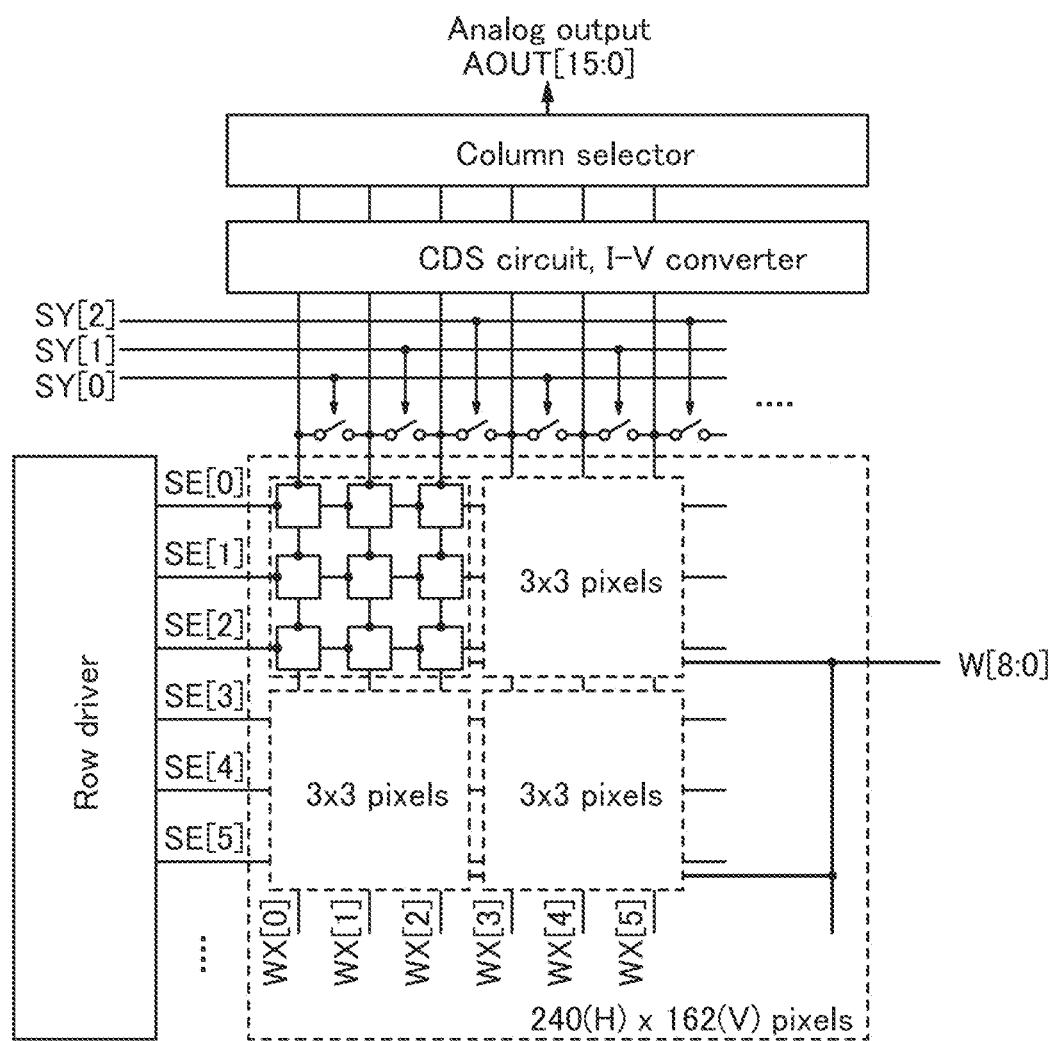
FIG. 28 is a diagram illustrating an imaging device.

A block diagram of the prototyped imaging device is shown in FIG. 28. OS transistors were used as transistors included in components (e.g., a pixel, a row driver, a CDS circuit, an I-V converter, and a column selector) of the imaging device. The column selector has analog outputs AOUT[15:0].

Figure 29:
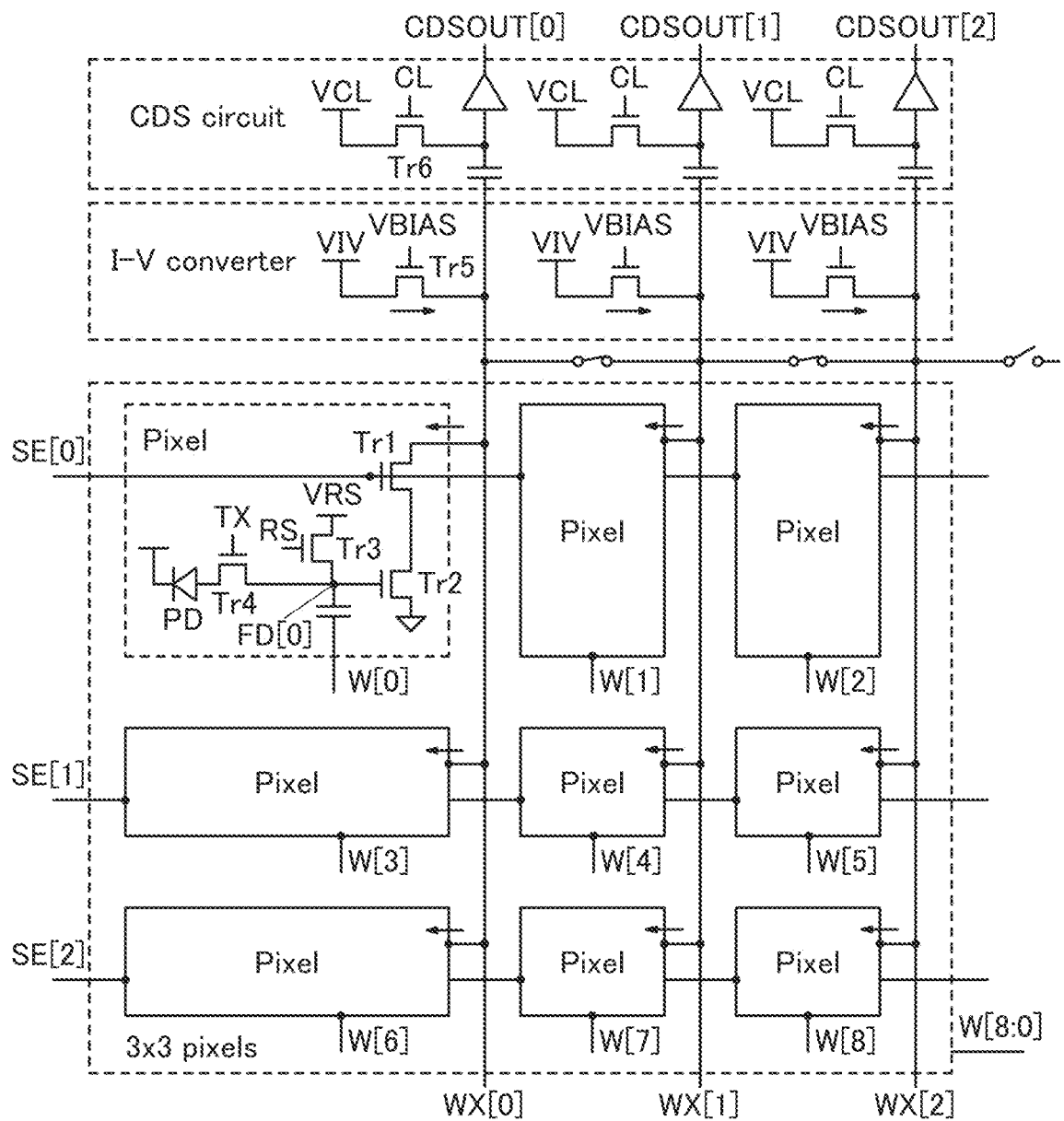
FIG. 29 is a diagram illustrating an imaging device.

The principle of analog product-sum operation in the imaging device is described with reference to FIG. 29, FIG. 30A, and FIG. 30B. When a transistor Tr1 of the pixel is on, the drain current of a transistor Tr2 satisfies a condition of a saturation region and Id=$\beta(V_{gs}-V_{th})^2/2$. A constant voltage VBIAS is supplied to a transistor Tr5 of the I-V converter, and a resistance value R is constant regardless of the voltage of a read line WX. An amount of voltage change that occurs in a charge accumulation portion FD of each pixel when photocharges of a photodiode PD are transferred is $X_i$, and the voltage of filter data supplied from wirings W[8:0] is $W_i$.

Figure 30A:
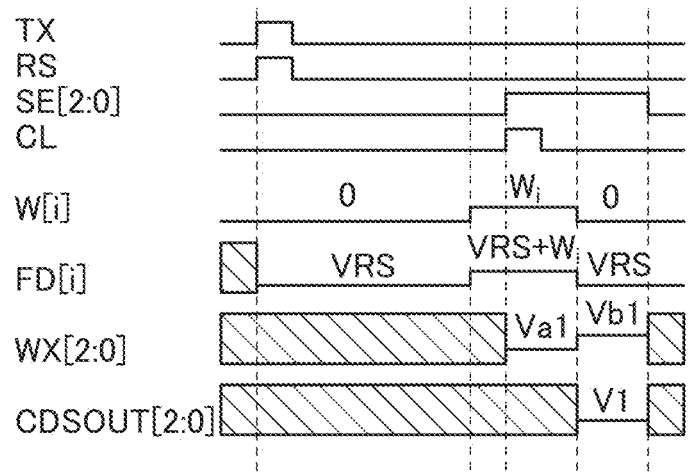
FIG. 30A and FIG. 30B are timing charts illustrating operations of an imaging device.
Figure 30B:
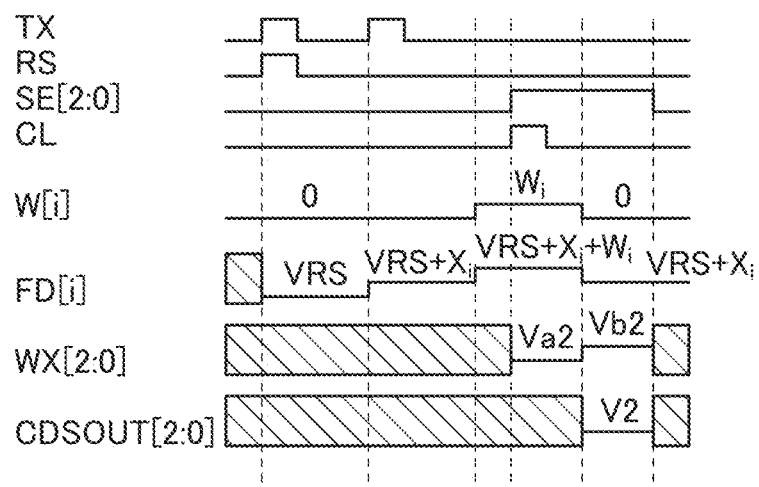

FIG. 30A and FIG. 30B are timing charts showing the operation of the imaging device. TX is a voltage supplied to a wiring TX connected to a gate of a transistor Tr4 included in the pixel. RS is a voltage supplied to a wiring RS connected to a gate of a transistor Tr3 included in the pixel. SE is a voltage supplied to a wiring SE connected to a gate of the transistor Tr1 included in the pixel. CL is a voltage supplied to a wiring CL connected to a gate of a transistor Tr6 included in the CDS circuit. W is a voltage of the wiring W that supplies filter data. FD is a voltage of the charge accumulation portion FD of the pixel. WX is a voltage of the wiring WX that functions as a read line. CDSOUT is a voltage output from an output wiring CDSOUT of the CDS circuit.

In the operation according to FIG. 30A, read voltages corresponding to the following two conditions can be obtained: the case where filter data Wi is supplied right after the potential of the charge accumulation portion FD of the pixel is reset to a potential VRS and the case where blank filter data (filter data of all 0 V) is supplied. When a difference between these two voltages is generated in the CDS circuit, a voltage V1 can be obtained.

Here, a voltage Va1 shown in FIG. 30A can be expressed as Va1=VIV$-\Sigma_i\beta$(VRS+$W_i-V_{th}$)$^2$R/6. In addition, a voltage Vb1 can be expressed as Vb1=VIV$-\Sigma_i\beta$(VRS$-V_{th}$)$^2$R/6. The voltage V1 can be expressed as V1=VCL+Vb1−Va1=VCL+$\Sigma_i\beta$(2(VRS$-V_{th}$)$W_i+W_i^2$)R/6. Note that VIV is a voltage supplied to the transistor Tr5 of the I-V converter. $\beta$ is a constant. VCL is a voltage supplied to the transistor Tr6 of the CDS circuit. $V_{th}$ is the threshold voltage of the transistor Tr2.

On the other hand, in the operation according to FIG. 30B, a voltage V2 can be obtained by performing similar processing after the charge accumulation portion FD is reset and photocharges are transferred to the charge accumulation portion FD.

Here, a voltage Va2 shown in FIG. 30B can be expressed as Va2=VIV$-\Sigma_i\beta$(VRS+$X_i+W_i-V_{th}$)$^2$R/6. In addition, a voltage Vb2 can be expressed as Vb2=VIV$-\Sigma_i\beta$(VRS+$X_i-V_{th}$)$^2$R/6. The voltage V2 can be expressed as V2=VCL+Vb2−Va2=VCL+$\Sigma_i\beta$(2(VRS+$X_i-V_{th}$)$W_i+W_i^2$)R/6.

When a difference between the two obtained voltages (V1, V2) is calculated in an external circuit, a voltage V2−V1=$\Sigma i\beta X_i W_i$R/3 is obtained. Thus, the product-sum operation of the imaging data and the filter data can be performed.

Figure 31A:
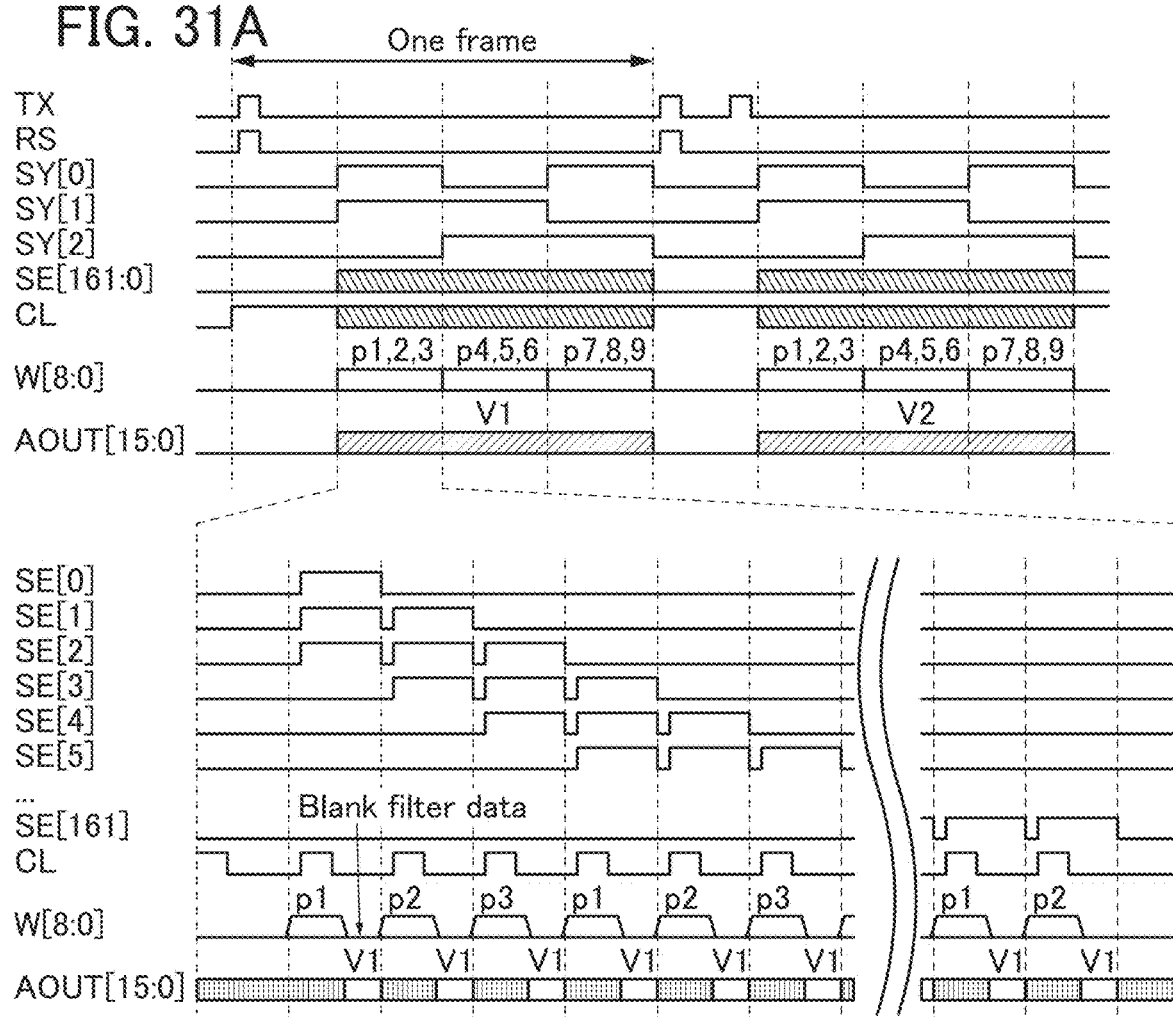
FIG. 31A is a timing chart illustrating an operation of an imaging device.
Figure 31B:
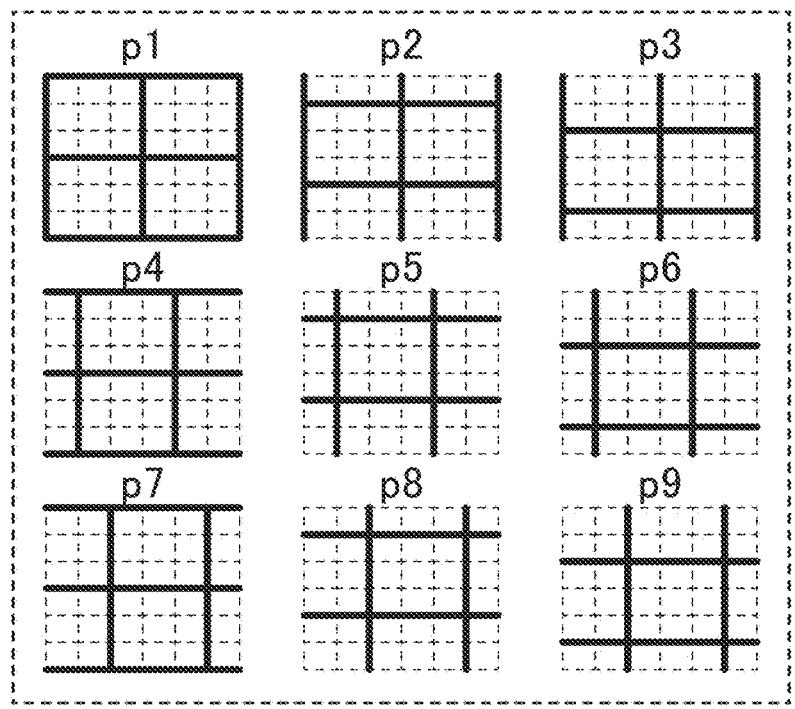
FIG. 31B is a diagram illustrating positions of filters.

An operation of obtaining imaging data and performing convolutional operation of filter data with the imaging device illustrated in FIG. 30 with the use of the above analog product-sum operation is described with reference to a timing chart of FIG. 31A. Note that FIG. 31B is a diagram illustrating 3×3 filter positions on four units (one unit is 3×3 pixels).

After the charge accumulation portions FD of all of the pixels are reset, 3×3 pixels to be subjected to the product-sum operation are selected with the use of the row driver and a switch control signal potential supplied from a wiring SY. The row driver supplies selection signal potentials to the wirings SE for three adjacent rows at a time, and all of the wirings WX are short-circuited every three adjacent columns by the switch control signal potentials supplied from the wirings SY.

Thus, 80 sets of 3×3 pixels are selected at once, and 80 kinds of voltages are input to the CDS circuit. Note that there are 240 read lines connected to the CDS circuit, and every three adjacent lines which are short-circuited by the switch control signal potentials supplied from the wirings SY have the same voltage.

At this time, the filter data Wi is supplied, the CDS circuit is reset, and then the blank filter data is supplied, whereby 80 kinds of voltages corresponding to the above voltages V1 can be generated in the CDS circuit. Selection of 3×3 pixels with the use of the row driver and the switch control signal potentials supplied from the wirings SY is sequentially shifted, and the generated 80 kinds of voltages V1 are sequentially read out to the outside.

Next, after the pixels are reset and the imaging operation is performed, voltages corresponding to the voltages V2 are read out to the outside by performing an operation similar to the above. Lastly, differences between all V1 and V2 that are read out are calculated in an external circuit, whereby a product-sum operation of all combinations in the shift operation, i.e., the convolutional operation, can be performed.

Note that the imaging device can also perform a normal imaging operation. For the normal imaging operation, the voltage VIV and the voltage VBIAS are adjusted such that the transistor in the I-V converter functions as a bias transistor of a source follower, and the row driver sequentially activates the wirings SE one by one. This means that a convolutional operation function can be added without addition of another element to a normal imaging device, which can be said to be advantageous in terms of the mount area of the imaging device.

Figure 32:
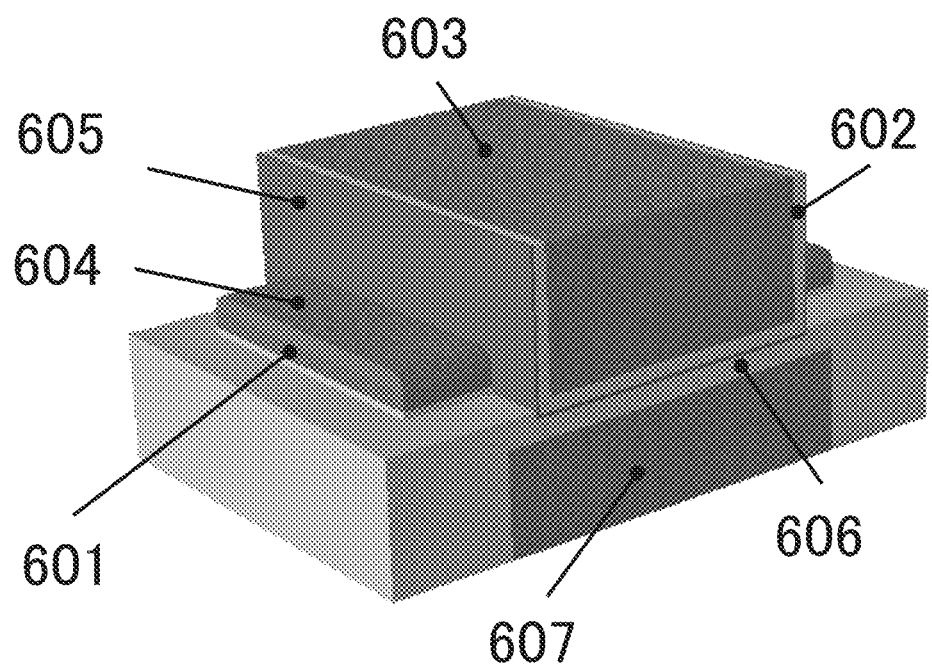
FIG. 32 is a diagram illustrating a structure of an OS transistor.
Figure 33:
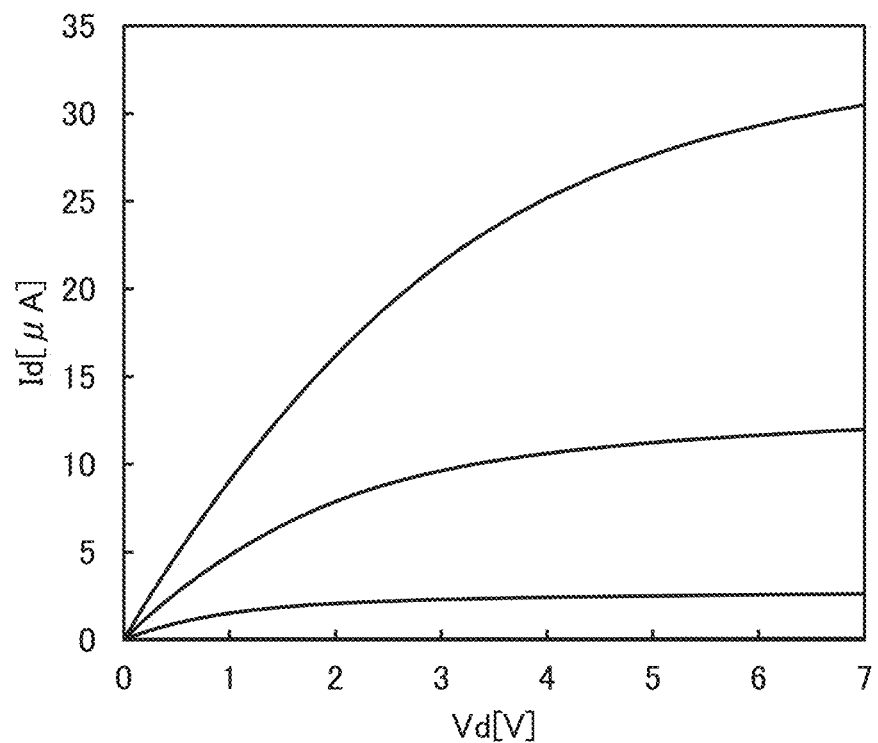
FIG. 33 is a diagram illustrating Id-Vd characteristics of an OS transistor.

The above imaging device was prototyped using an OS transistor having a channel length of 0.5 μm. FIG. 32 is a diagram illustrating a structure of the OS transistor. The OS transistor has a double-gate structure and includes a semiconductor layer (CAAC-IGZO) 601, a gate insulating film 602, a gate electrode 603, a source electrode or drain electrode 604, a buffer layer 605, a gate insulating film 606 on a back gate side, and a gate electrode 607 on the back gate side. FIG. 33 shows the Id-Vd characteristics ($V_g$=1, 3, 5, 7 V) of the OS transistor (W/L=0.5 μm/0.5 μm).

Figure 34:
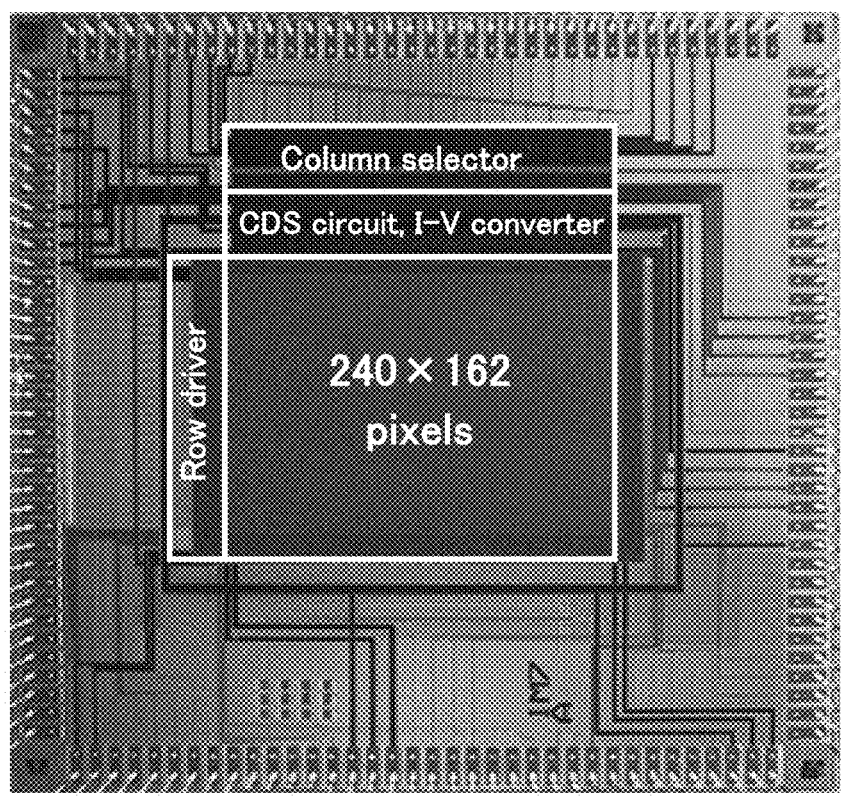
FIG. 34 is a top view photograph of a prototyped imaging device.

FIG. 34 is a top view photograph of the prototyped imaging device. Table 1 shows the specifications.

TABLE 1

| | |
|---|---|
| Process | OS transistor with channel length of 0.5 μm |
| Die size | 8.0 mm × 8.0 mm |
| Number of pixels | 240(H) × 162(V) |
| Pixel size | 15 μm × 15 μm |
| Pixel configuration | 4 transistors, 1 capacitor |
| Output | 16ch analog voltage |
| Conversion efficiency | 1.66 μV/h+ |
| Full well capacity | 612 kh+ |
| Read noise | 751 h + rms |

TABLE 1-continued

| | |
|---|---|
| Aperture ratio | 79.8% |
| Frame rate | 7.5 fps |
| Power consumption | Normal capturing: 3.80 mW |
| | Convolutional operation: 7.06 mW |
| Multiplication efficiency | 0.805 GOp/s/W |
| CNN filter size | 3(H) × 3(V) |
| CNN stride | 1 |

Figure 35:
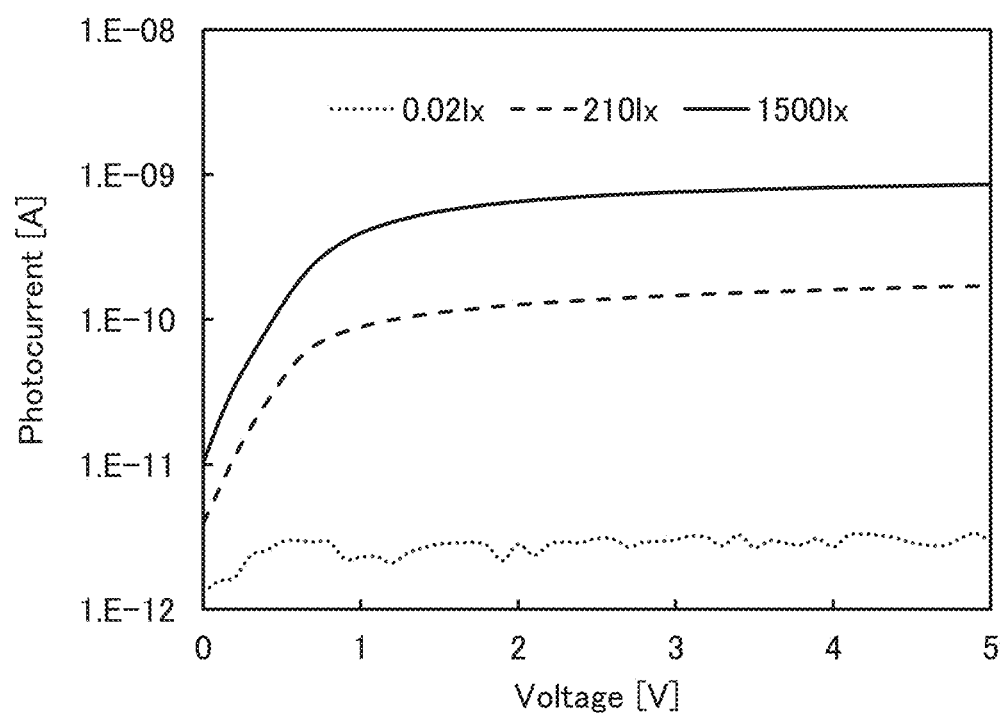
FIG. 35 is a diagram illustrating photocurrent characteristics of a photoelectric conversion device.

Crystalline selenium, which has high affinity for the OS transistor process, was used for a photoelectric conversion layer used for the photoelectric conversion device PD. FIG. 35 shows photocurrent characteristics of the photoelectric conversion device using crystalline selenium.

Figure 36A:
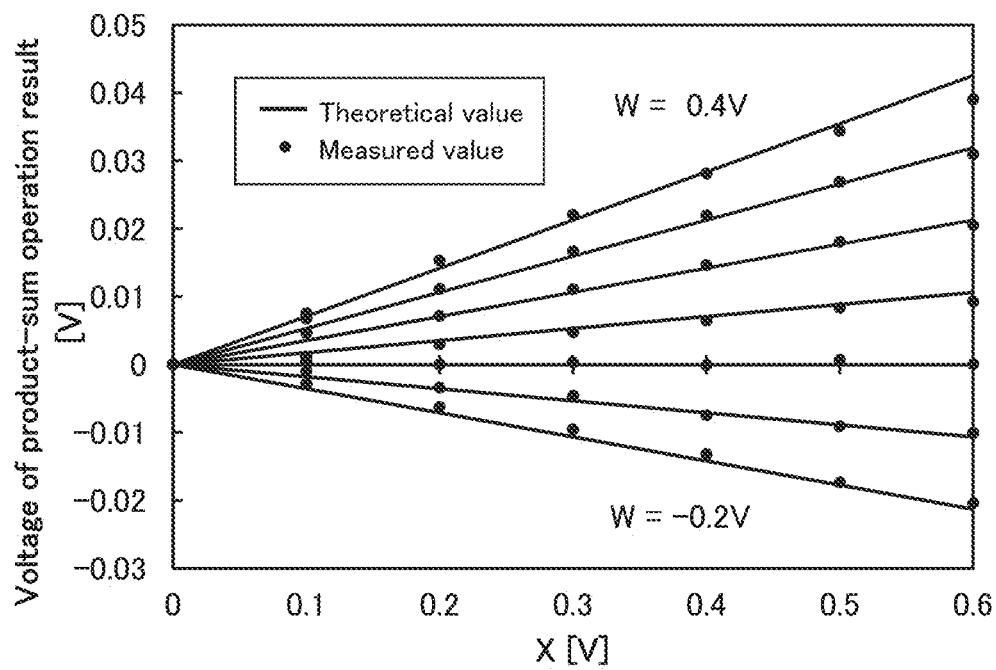
FIG. 36A is a diagram illustrating a product-sum operation result.
Figure 36B:
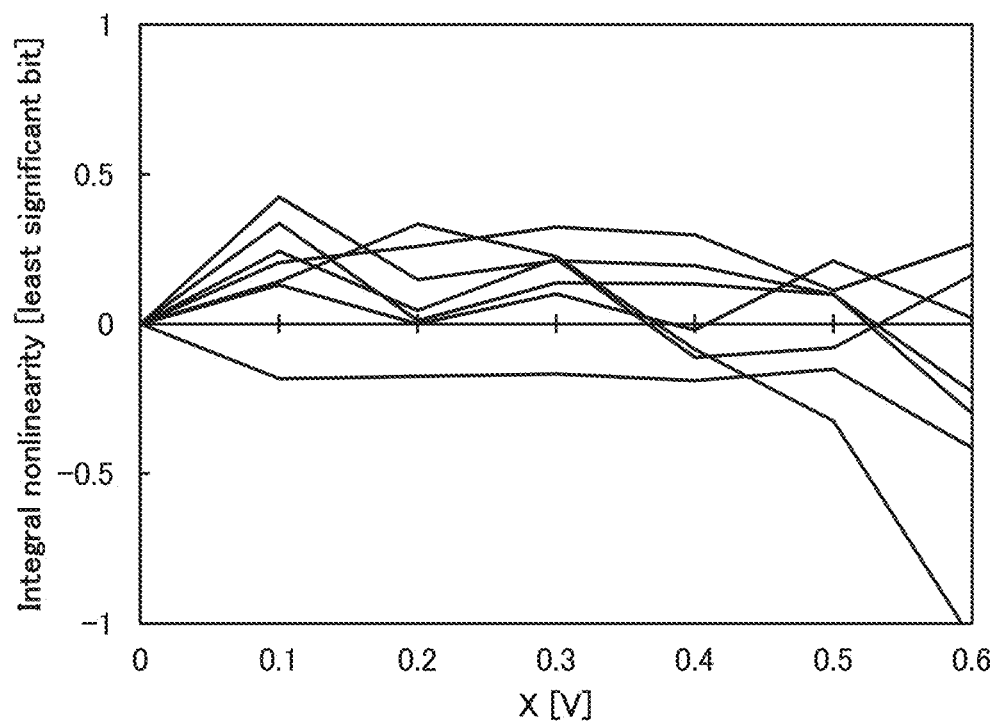
FIG. 36B is a diagram illustrating integral nonlinearity.

The amount X of voltage change in the photoelectric conversion device PD caused by photocharges was imitated by changing the voltage VRS for resetting the pixel, the filter data (W) was swept with respect to a plurality of voltage change amounts (X), and the multiplication characteristics were measured. FIG. 36A shows theoretical values and the measured values of the product-sum operation, and FIG. 36B shows integral nonlinearity. The evaluation subject was one set of 3×3 pixels, and the voltage change amount (X) and the voltage value of the filter data (W) were the same for all the pixels. It was confirmed that the multiplication characteristic of 4-bit accuracy was able to be obtained in the voltage range of X≤0.5 V.

Figure 37:
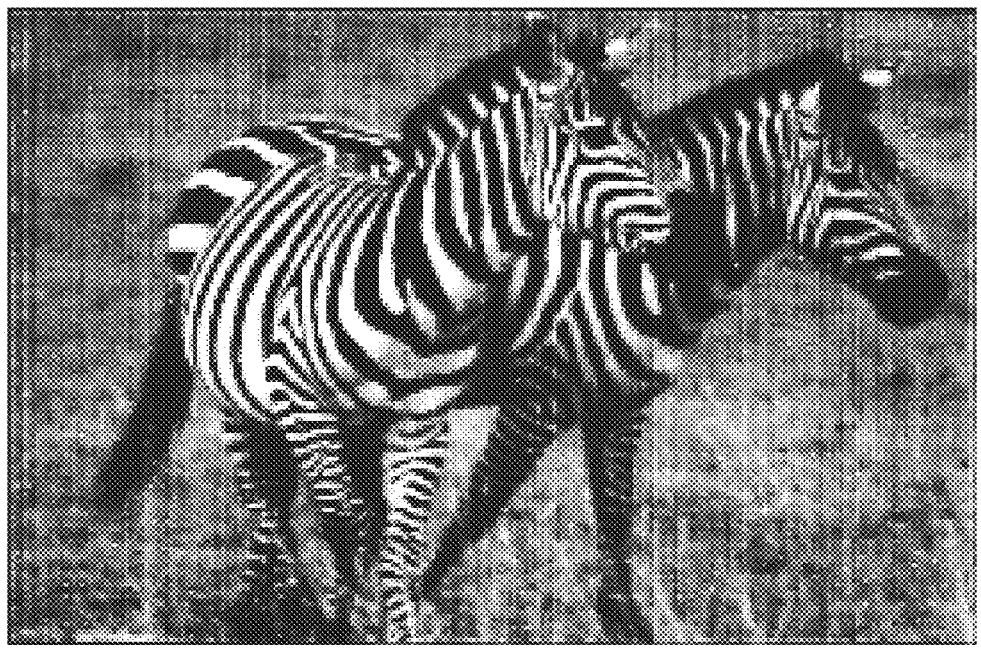
FIG. 37 is an image of zebras subjected to an arithmetic operation.
Figure 38A:
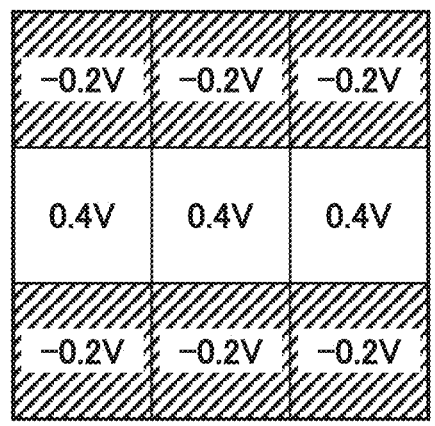
FIG. 38A is a diagram illustrating filter data for extracting horizontal stripes.
Figure 38B:
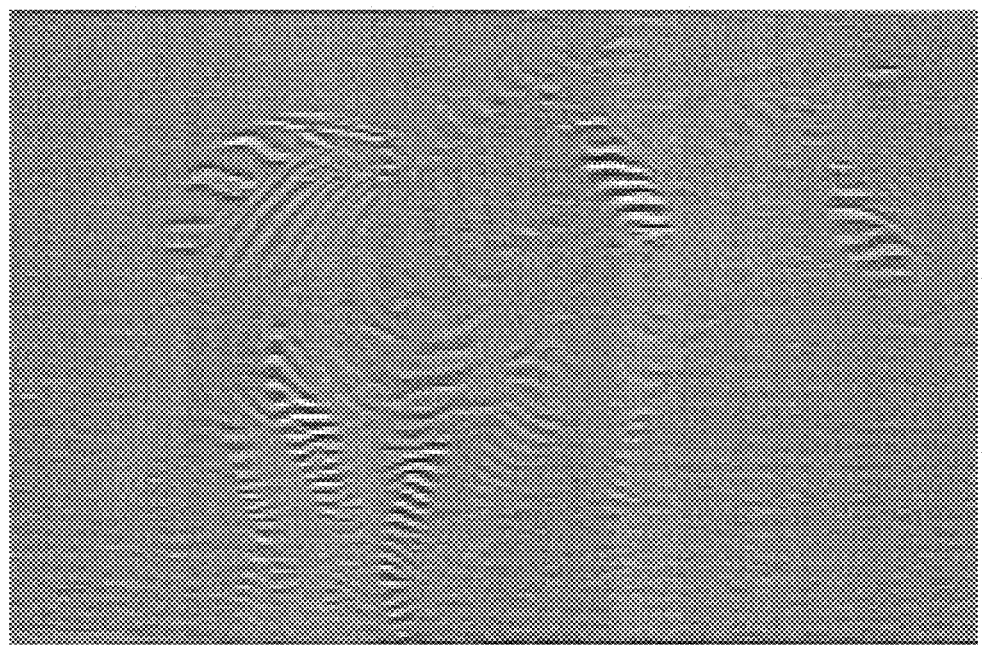
FIG. 38B is an image extracted with the filter data for extracting horizontal stripes.
Figure 39A:
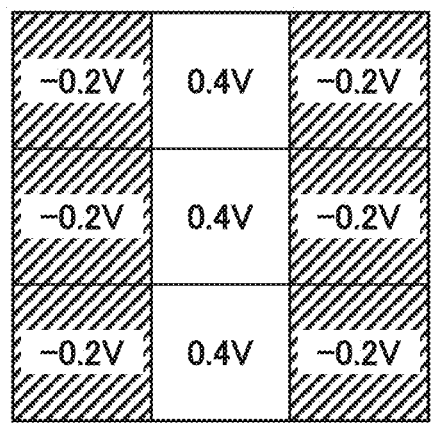
FIG. 39A is a diagram illustrating filter data for extracting vertical stripes.
Figure 39B:
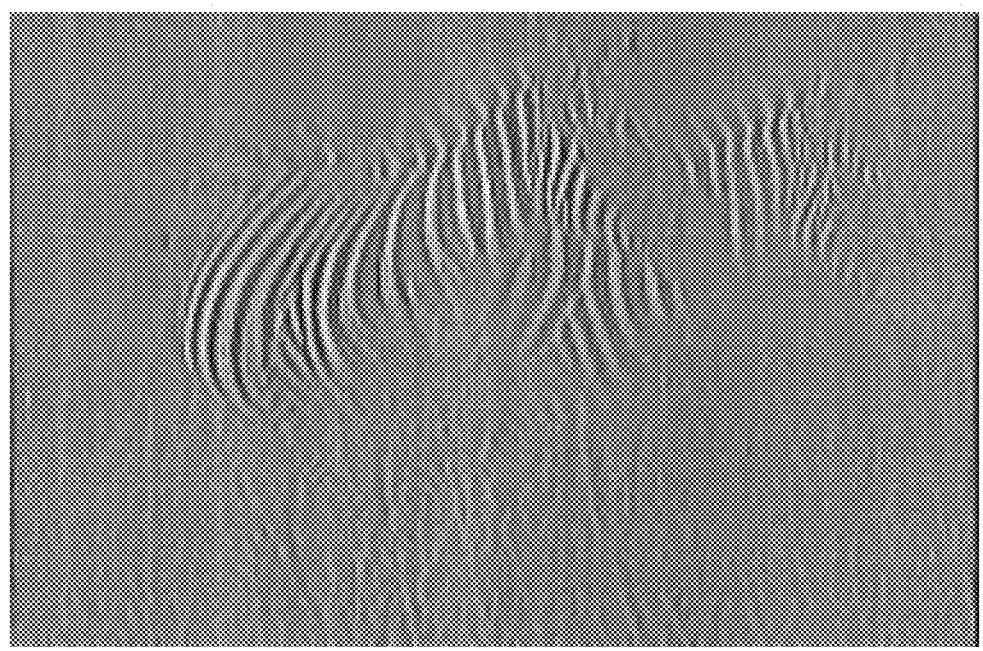
FIG. 39B is an image extracted with the filter data for extracting vertical stripes.

Next, a nature image was captured and subjected to a convolutional operation with two kinds of filter data, whereby the feature values of the image were extracted. FIG. 37 is the image subjected to the operation and is a photographic image of zebras. FIG. 38A shows filter data for extracting horizontal stripes, and FIG. 38B is an image extracted using the filter data. FIG. 39A shows filter data for extracting vertical stripes, and FIG. 39B is an image extracted using the filter data.

It was found that the horizontal direction components and the vertical direction components of patterns on the body surfaces of the zebras were able to be extracted by performing a convolutional operation with the filter data for the horizontal stripes and the vertical stripes.

Figure 40A:
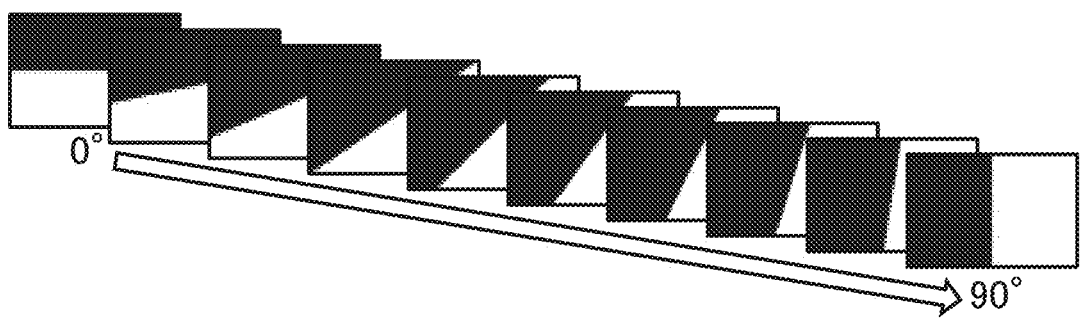
FIG. 40A is a diagram illustrating a rotating image.
Figure 40B:
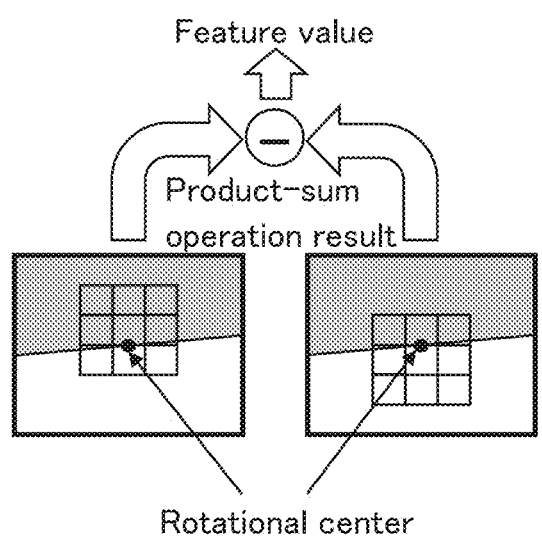
FIG. 40B is a diagram illustrating how to calculate a feature value.

Next, with the use of the filter for extracting the horizontal stripes in FIG. 38A, the feature value extraction characteristics when an image painted black and white with one straight line as a border was rotated, which is shown in FIG. 40A, were evaluated. FIG. 40B is a diagram showing how to calculate the feature values. The feature value was defined as a difference between product-sum operation results of 3×3 pixels with two vertically adjacent pixels as a center in the rotational center on the border.

Figure 40C:
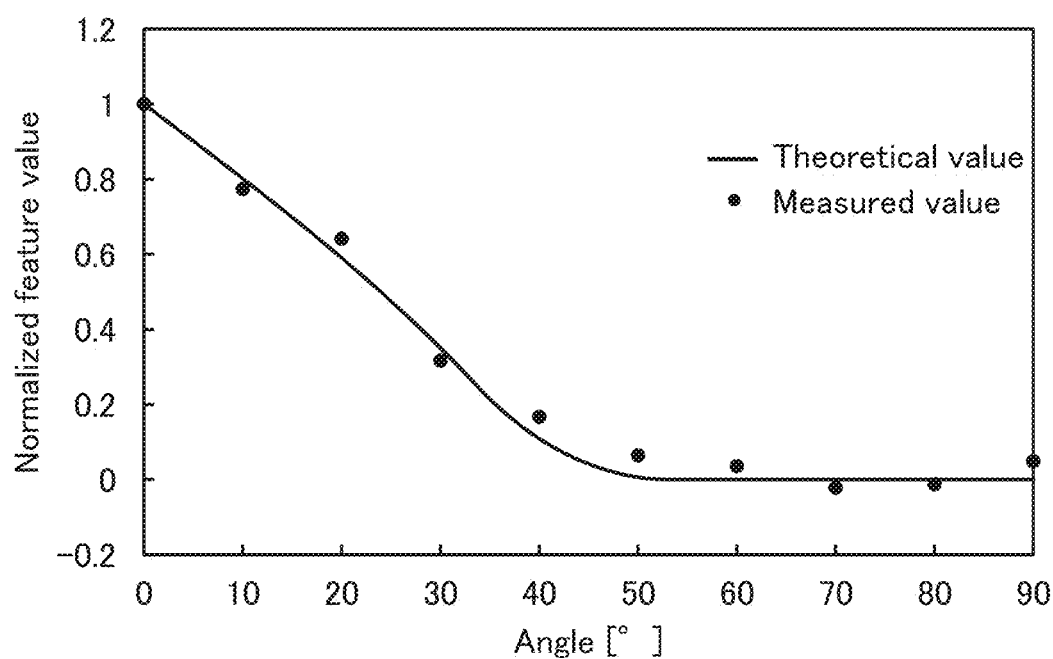
FIG. 40C is a diagram illustrating a result of extracting the feature value.

FIG. 40C is a diagram showing theoretical values and the measured values of the feature value extraction. It was found from the relation between the normalized feature value and the rotation angle that the feature value was extracted most clearly at 0° and was able to be extracted at up to approximately 40°. In the above manner, the convolutional operation in the imaging device of the present invention was able to be demonstrated.

This example can be combined with any of the other embodiments as appropriate.

Example 2

A variety of studies utilizing an AI (Artificial Intelligence) system have been carried out in recent years. For application for autonomous driving of a passenger car or the like, practical implementation of behavior recognition in which an object and a background in an image are separately extracted and the movement of the object is detected has been desired.

In this example, described is an example of an experiment in which an object and a background in an image were separately extracted in an attempt to use the imaging device described in Embodiment 1 for object recognition.

Figure 41A:
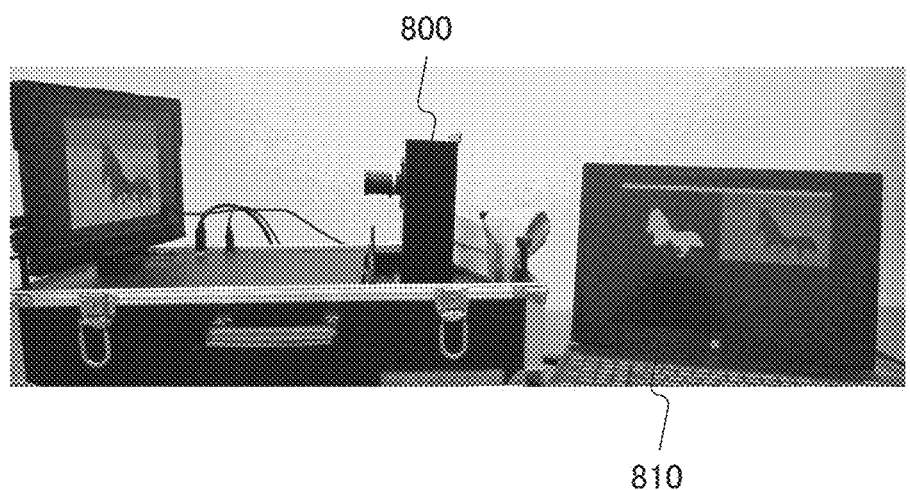
FIG. 41A is a photograph of external appearance of experimental devices used in Example 2.

FIG. 41A is a photograph showing a display device, an imaging device 800, and one PC (notebook personal computer) 810 to which imaging data is input from the imaging device 800, which were used for the experiment.

In FIG. 41A, after the imaging device 800 reads an image displayed on the display surface of the display device as video, with a segmentation module, a result of detecting an object in the image is displayed as a monochrome image. In FIG. 41A, the result of outputting an object in white and a background in black is shown in part of the display screen of the one PC 810 (the left side of the screen).

The segmentation module includes software for generating a plurality of image segments for use in image analysis. In this example, the one PC 810 that can perform segmentation on the basis of the learned content by using U-net that is one kind of image processing and convolutional neural network is used.

Note that segmentation refers to processing for recognizing what object each pixel of an input image displays. This is also referred to as semantic segmentation.

Figure 41B:
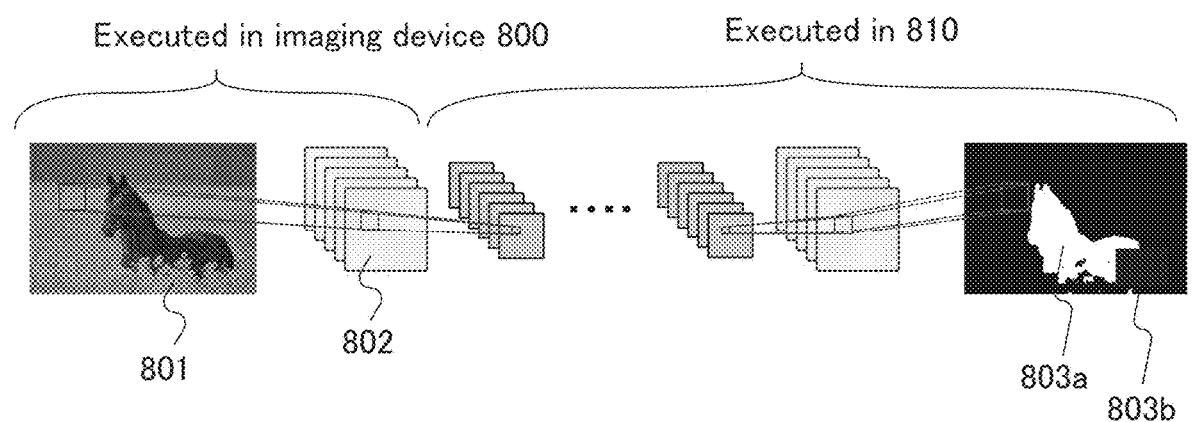
FIG. 41B is a schematic view illustrating the state of processing imaging data.

FIG. 41B is a schematic diagram showing the state of data processing.

A first image 801 is imaging data schematically shown, and a plurality of pieces of map information 802 obtained with the imaging device 800 are shown next to the image 801. The imaging device 800 can perform feature value extraction in pixels, what is called convolution, and can obtain the plurality of pieces of map information 802. That is, the convolutional calculation of a first layer of U-net is performed.

With the use of the map information 802, the calculation of a second and the following layers of U-net is performed in the PC 810. As a result, the probability of what object each pixel displays is output as an output of U-net. In this example, an image is generated in which pixels that are most likely the background are indicated in black and other pixels are indicated in white. That is, image data output to the screen of the PC 810, in which an object region 803a of the input image is white and a background region 803b is black, is obtained.

In this way, with the use of the imaging device and the segmentation module, the background region and the object region were able to be distinguished in the imaging data. The imaging device described in Embodiment 1 can extract the feature values in pixels and obtain a plurality of pieces of map information; thus, the arithmetic processing can be reduced as compared to the conventional device and a result can be obtained in a short time.

A CNN model requires a large amount of convolution processing. The convolution processing employs a product-sum operation, and thus the CNN model has a big advantage for an LSI chip that can form a power-saving product-sum operation circuit, in particular, an IC chip (e.g., NoffCPU) using a transistor using an oxide semiconductor material. For example, an IC with an AI system (also referred to as an inference chip) is preferably used.

The segmentation described in this example can be applied to autonomous driving of a passenger car or the like.

This example can be combined with any of the other embodiments as appropriate.

REFERENCE NUMERALS

100: pixel, 100a: pixel, 100b: pixel, 100c: pixel, 100d: pixel, 100e: pixel, 100f: pixel, 100g: pixel, 100h: pixel, 100i: pixel, 100j: pixel, 101: photoelectric conversion device, 102: transistor, 103: transistor, 104: capacitor, 105: transistor, 106: transistor, 107: transistor, 108: transistor, 109: transistor, 111: wiring, 112: wiring, 112_1: wiring, 112_2: wiring, 113: wiring, 113_1: wiring, 113_2: wiring, 113a: wiring, 113b: wiring, 114: wiring, 115: wiring, 116: wiring, 117: wiring, 118: wiring, 122: wiring, 122_n: wiring, 122_n-1: wiring, 122_n-2: wiring, 122_1: wiring, 122_2: wiring, 123: wiring, 123_n: wiring, 123_n-2: wiring, 131: transistor, 132: transistor, 141: transistor, 142: transistor, 161: transistor, 162: transistor, 163: capacitor, 170: circuit, 200: pixel block, 200a: pixel block, 200b: pixel block, 200c: pixel block, 200d: pixel block, 200e: pixel block, 200f: pixel block, 201: circuit, 201a: circuit, 201b: circuit, 202: capacitor, 203: transistor, 204: transistor, 205: transistor, 206: transistor, 207: resistor, 211: wiring, 212: wiring, 213: wiring, 215: wiring, 216: wiring, 217: wiring, 218: wiring, 219: wiring, 300: pixel array, 301: circuit, 302: circuit, 303: circuit, 304: circuit, 305: circuit, 311: wiring, 311_1: wiring, 311_2: wiring, 320: memory cell, 325: reference memory cell, 330: circuit, 340: circuit, 350: circuit, 360: circuit, 370: circuit, 410: package substrate, 411: package substrate, 420: cover glass, 421: lens cover, 430: adhesive, 435: lens, 440: bump, 441: land, 450: image sensor chip, 451: image sensor chip, 460: electrode pad, 461: electrode pad, 470: wire, 471: wire, 490: IC chip, 531: conductive layer, 531a: conductive layer, 531b: conductive layer, 532: conductive layer, 532a: conductive layer, 532b: conductive layer, 533: conductive layer, 534: conductive layer, 535: back gate, 536: conductive layer, 537: conductive layer, 538: conductive layer, 540: silicon substrate, 541: insulating layer, 542: insulating layer, 543: insulating layer, 545: semiconductor layer, 546: insulating layer, 547: insulating layer, 548: insulating layer, 550: silicon substrate, 551: conductive layer, 552: conductive layer, 553: conductive layer, 554: conductive layer, 560: insulating layer, 561: layer, 562: layer, 563: layer, 564: layer, 565a: layer, 565b: layer, 565c: layer, 566a: layer, 566b: layer, 566c: layer, 566d: layer, 567a: layer, 567b: layer, 567c: layer, 567d: layer, 567e: layer, 571: insulating layer, 572: insulating layer, 580: insulating layer, 581: light-blocking layer, 582: organic resin layer, 583: color filter, 583a: color filter, 583b: color filter, 583c: color filter, 584: microlens array, 585: optical conversion layer, 586: insulating layer, 590: silicon substrate, 602: gate insulating film, 603: gate electrode, 604: drain electrode, 605: buffer layer, 606: gate insulating film, 607: gate electrode, 701: gate electrode, 702: gate insulating film, 703: source region, 704: drain region, 705: source electrode, 706: drain electrode, 707: oxide semiconductor layer, 800: imaging device, 801: image, 802: map information, 803a: object region, 803b: background region, 810: PC, 911: housing, 912: display portion, 913: speaker, 919: camera, 932: display portion, 933: housing and wristband, 939: camera, 951: support base, 952: camera unit, 953: protection cover, 961: housing, 962: shutter button, 963: microphone, 965: lens, 967: light-emitting portion, 971: housing, 972: housing, 973: display portion, 974: operation key, 975: lens, 976: connection portion, 977: speaker, 978: microphone, 981: housing, 982: display portion, 983: operation button, 984: external connection port, 985: speaker, 986: microphone, 987: camera.

The invention claimed is:

1. An imaging device comprising a pixel block, a first circuit, and a second circuit,
wherein the pixel block comprises a plurality of pixels arranged in a matrix,
wherein the plurality of pixels are electrically connected to the second circuit,
wherein the first circuit has a function of selecting pixels arranged in one row of the plurality of pixels,
wherein the first circuit has a function of selecting pixels arranged in a plurality of consecutive rows of the plurality of pixels,
wherein the first circuit has a function of changing the number of rows to be selected,
wherein the pixel has a function of generating first data,
wherein the pixel has a function of generating second data by adding a predetermined potential to the first data,
wherein the second circuit has a function of generating third data corresponding to a sum of the first data generated by the plurality of pixels,
wherein the second circuit generates fourth data by adding, to the third data, a potential corresponding to a sum of the second data generated by the plurality of pixels
wherein the first circuit is a shift register circuit comprising a first logic circuit, a second logic circuit, a twelfth transistor, a thirteenth transistor, a fourteenth transistor, and a fifteenth transistor,
wherein an output terminal of the first logic circuit is electrically connected to one of a source and a drain of the twelfth transistor,
wherein an output terminal of the second logic circuit is electrically connected to one of a source and a drain of the thirteenth transistor,
wherein the other of the source and the drain of the twelfth transistor is electrically connected to one of a source and a drain of the fourteenth transistor,
wherein the other of the source and the drain of the fourteenth transistor is electrically connected to the other of the source and the drain of the thirteenth transistor,
wherein the other of the source and the drain of the twelfth transistor is electrically connected to one of a source and a drain of the fifteenth transistor, and
wherein the other of the source and the drain of the fifteenth transistor is electrically connected to a power supply line.

2. The imaging device according to claim 1,
wherein the pixel comprises a photoelectric conversion device, a first transistor, a second transistor, a third transistor, a fourth transistor, a fifth transistor, and a first capacitor,
wherein one electrode of the photoelectric conversion device is electrically connected to one of a source and a drain of the first transistor,
wherein the other of the source and the drain of the first transistor is electrically connected to one of a source and a drain of the second transistor,
wherein the one of the source and the drain of the second transistor is electrically connected to a gate of the third transistor,
wherein the gate of the third transistor is electrically connected to one electrode of the first capacitor, wherein the other electrode of the first capacitor is electrically connected to one of a source and a drain of the fourth transistor, wherein one of a source and a drain of the third transistor is electrically connected to one of a source and a drain of the fifth transistor, wherein the other of the source and the drain of the fifth transistor is electrically connected to the second circuit, and wherein a gate of the fifth transistor is electrically connected to the first circuit.

3. The imaging device according to claim 2, wherein the photoelectric conversion device is provided in a first layer, wherein the transistors included in the pixel block and the first circuit are provided in a second layer, wherein the transistors included in the second circuit are provided in a third layer, wherein the second layer is provided between the first layer and the third layer, wherein the first layer to the third layer comprise an overlap region, and wherein at least the first layer and the second layer, or the second layer and the third layer are attached to each other in a bonding step.

4. The imaging device according to claim 3, further comprising a fourth layer, wherein the fourth layer comprises a transistor that is a component of a circuit included in the third layer, wherein the fourth layer is provided between the second layer and the third layer, wherein the first layer to the fourth layer comprise an overlap region, and wherein the second layer and the fourth layer are attached to each other in a bonding step.

5. The imaging device according to claim 4, wherein the transistor included in the fourth layer comprises a metal oxide in a channel formation region, and the metal oxide comprises In, Zn, and M (M is one or more of Al, Ti, Ga, Ge, Sn, Y, Zr, La, Ce, Nd, and Hf).

6. The imaging device according to claim 1, wherein the second circuit comprises a sixth transistor, a seventh transistor, an eighth transistor, a ninth transistor, a second capacitor, and a resistor, wherein one electrode of the second capacitor is electrically connected to the plurality of pixels, wherein the one electrode of the second capacitor is electrically connected to the resistor, wherein the other electrode of the second capacitor is electrically connected to one of a source and a drain of the sixth transistor, wherein the one of the source and the drain of the sixth transistor is electrically connected to a gate of the seventh transistor, wherein one of a source and a drain of the seventh transistor is electrically connected to one of a source and a drain of the eighth transistor, and wherein the one of the source and the drain of the eighth transistor is electrically connected to one of a source and a drain of the ninth transistor.

7. The imaging device according to claim 1, further comprising a third circuit, wherein the pixel further comprises a tenth transistor and an eleventh transistor, wherein the third circuit has a structure and a function equivalent to those of the second circuit, wherein a gate of the tenth transistor is electrically connected to a gate of a third transistor, wherein one of a source and a drain of the tenth transistor is electrically connected to one of a source and a drain of the eleventh transistor, wherein the other of the source and the drain of the eleventh transistor is electrically connected to the third circuit, and wherein a gate of the eleventh transistor is electrically connected to the first circuit.

8. The imaging device according to claim 1, wherein the transistors included in the pixel block and the first circuit each comprise a metal oxide in a channel formation region, and the metal oxide comprises In, Zn, and M (M is one or more of Al, Ti, Ga, Ge, Sn, Y, Zr, La, Ce, Nd, and Hf).

9. The imaging device according to claim 1, wherein the transistors included in the pixel block, the first circuit, and the second circuit each comprise silicon in a channel formation region.

10. An electronic device comprising a display device and the imaging device according to claim 1.

11. The imaging device according to claim 1, wherein the second circuit is provided outside of the pixel block.

* * * * *